(12) United States Patent
Horsky et al.

(10) Patent No.: US 7,107,929 B2
(45) Date of Patent: Sep. 19, 2006

(54) ION IMPLANTATION ION SOURCE, SYSTEM AND METHOD

(75) Inventors: Thomas Neil Horsky, Boxborough, MA (US); John Noel Williams, Boston, MA (US)

(73) Assignee: SemEquip, Inc., Billerica, MA (US)

( * ) Notice: Subject to any disclaimer, the term of this patent is extended or adjusted under 35 U.S.C. 154(b) by 0 days.

(21) Appl. No.: 10/170,512

(22) Filed: Jun. 12, 2002

(65) Prior Publication Data

US 2003/0230986 A1 Dec. 18, 2003

Related U.S. Application Data

(63) Continuation of application No. PCT/US00/33786, filed on Dec. 13, 2000.
(60) Provisional application No. 60/250,080, filed on Nov. 30, 2000, and provisional application No. 60/170,473, filed on Dec. 13, 1999.

(51) Int. Cl.
*A01C 7/00* (2006.01)
*H01J 7/24* (2006.01)

(52) U.S. Cl. .............................. 118/723 CB; 315/111.81

(58) Field of Classification Search ............ 315/111.81, 315/11.91; 250/423 R, 423 F, 427, 423 V; 118/723 CB, 723 EB, 723 FI
See application file for complete search history.

(56) References Cited

U.S. PATENT DOCUMENTS

| | | | | |
|---|---|---|---|---|
| 556,204 A | * | 3/1896 | Owen | 118/419 |
| 4,902,572 A | | 2/1990 | Horne et al. | 428/409 |
| 5,296,713 A | | 3/1994 | Tanaka | 250/423 R |
| 5,320,982 A | * | 6/1994 | Tsubone et al. | 438/714 |
| 6,111,260 A | * | 8/2000 | Dawson et al. | 250/492.21 |
| 6,452,338 B1 | * | 9/2002 | Horsky | 315/111.81 |

* cited by examiner

*Primary Examiner*—Wilson Lee
*Assistant Examiner*—Minh Dieu A
(74) *Attorney, Agent, or Firm*—Katten Muchin Rosenman; John S. Paniaguas

(57) ABSTRACT

An ion source for an ion implantation system includes a vaporizer for producing a process gas; an electron source for generating an electron beam to ionize the process gas within a ionization chamber. The ionization chamber includes an extraction aperture for extracting an ion beam. The ion source, in accordance with the preset invention, is configured to be able to be retrofit into the design space of existing ion sources in, for example, Bernas source-based ion implanters.

70 Claims, 36 Drawing Sheets

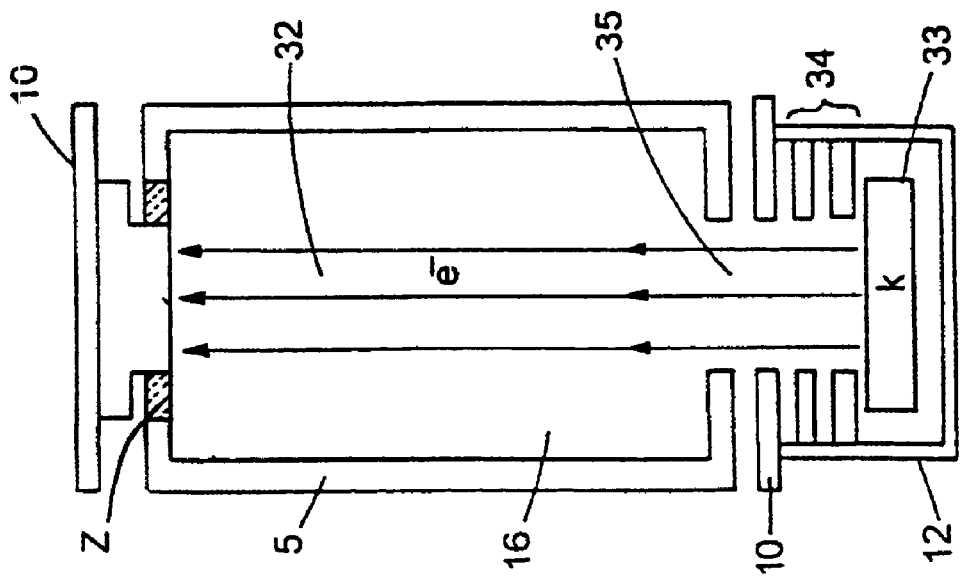
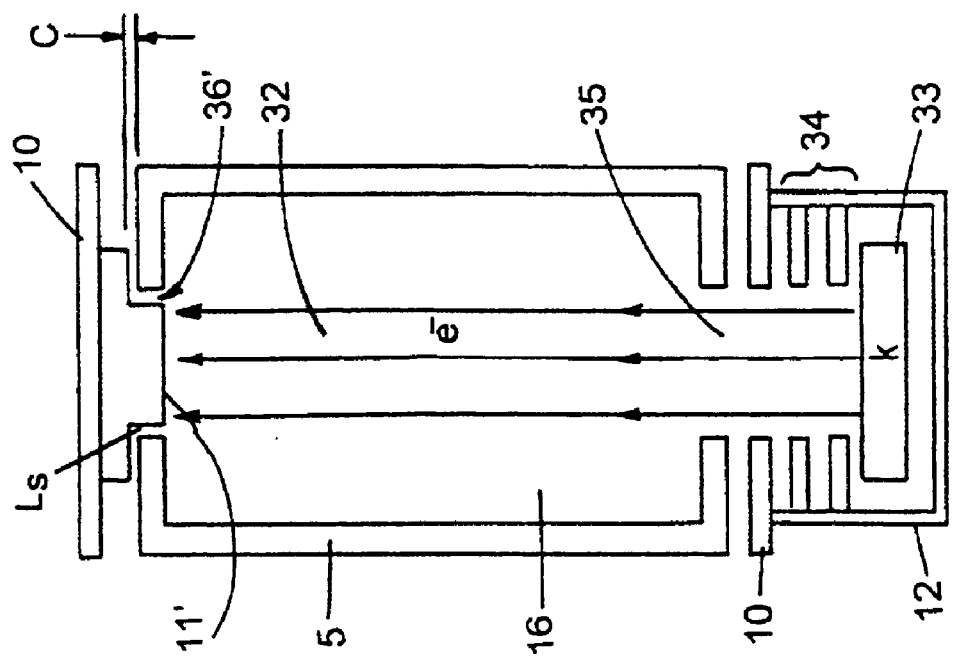
FIG. 4B
FIG. 4C

| FIG. 16A-1 | FIG. 16A-2 |

MOUNTED ON INSULATING STANDOFFS

ION IMPLANTATION ION SOURCE, SYSTEM AND METHOD

CROSS-REFERENCE TO RELATED APPLICATIONS

This application is a continuation of International Patent Application No. PCT/US00/33786, filed Dec. 13, 2000, which claims priority to and the benefit of U.S. Provisional Patent Application No. 60/250,080, filed Nov. 30, 2000, and U.S. Provisional Patent Application No. 60/170,473, filed Dec. 13, 1999.

BACKGROUND OF THE INVENTION

1. Field of Invention

The invention provides production-worthy ion sources and methods capable of using new source materials, in particular, heat-sensitive materials such as decaborane ($B_{10}H_{14}$), and hydrides and dimer-containing compounds novel to the ion implantation process, to achieve new ranges of performance in the commercial ion implantation of semiconductor wafers. The invention enables shallower, smaller and higher densities of semiconductor devices to be manufactured, particularly in Complementary Metal-Oxide Semiconductor (CMOS) manufacturing. In addition to enabling greatly enhanced operation of new ion implanter equipment in the manufacture of semiconductor devices, the invention enables the new ion source to be retrofit into the existing fleet of ion implanters with great capital cost savings. Embodiments of the invention uniquely implant decaborane and the other dopant materials in particularly pure ion beams, enabling a wide range of the needs of a fabrication facility to be met. Various novel constructional, operational and process features that contribute to the cost-effectiveness of the new technology are applicable as well to prior technology of the industry.

2. Description of the Prior Art

As is well known, ion implantation is a key technology in the manufacture of integrated circuits (ICs). In the manufacture of logic and memory ICs, ions are implanted into silicon or GaAs wafers to form transistor junctions, and to dope the well regions of the p-n junctions. By selectively controlling the energy of the ions, their implantation depth into the target wafer can be selectively controlled, allowing three-dimensional control of the dopant concentrations introduced by ion implantation. The dopant concentrations control the electrical properties of the transistors, and hence the performance of the ICs. A number of dopant feed materials have previously been used, including As, Ar, B, Be, C, Ga, Ge, In, N, P, Sb and Si. For those species which are of solid elemental form, many are obtainable in gaseous molecular form, such as fluoride compounds that are ionizable in large quantities at significantly elevated temperatures. The ion implanter is a manufacturing tool which ionizes the dopant-containing feed materials, extracts the dopant ions of interest, accelerates the dopant ions to the desired energy, filters away undesired ionic species, and then transports the dopant ions of interest to the wafer at the appropriate energy for impact upon the wafer. The presence in the implanter of certain elements, such as the disassociated element fluorine, is detrimental to the implanted wafers, but, despite such drawbacks, trace amounts of such contaminants have been tolerated in many contexts, in the interest of achieving production-worthy throughput volume. Lower contaminant levels from what is now achievable is desired.

In a complex relationship, overall, a number of variables must be controlled in order to achieve a desired implantation profile for a given ion implantation process:

The nature of the dopant feed material (e.g., $BF_3$ gas)

Dopant ion species (e.g., B+)

Ion energy (e.g., 5 keV)

Chemical purity of the ion beam (e.g., <0.01% energetic contaminants)

Isotopic purity of the ion beam (e.g., ability to discriminate between $^{113}$In and $^{115}$In)

Energy purity of the ion beam (e.g., <2% full width at half maximum, i.e. FWHM)

Angular divergence and spatial extent of the beam on the wafer

Total dose (e.g., $10^{15}$ atoms/cm$^2$) implanted on the wafer

Uniformity of the dose (e.g., ±1% variation in the implanted density over the total wafer surface area).

These variables affect the electrical performance, minimum manufacturable size and maximum manufacturable density of transistors and other devices fabricated through ion implantation.

A typical commercial ion implanter is shown in schematic in FIG. 1. The ion beam I is shown propagating from the ion source 42 through a transport (i.e. "analyzer") magnet 43, where it is separated along the dispersive (lateral) plane according to the mass-to-charge ratio of the ions. A portion of the beam is focused by the magnet 43 onto a mass resolving aperture 44. The aperture size (lateral dimension) determines which mass-to-charge ratio ion passes downstream, to ultimately impact the target wafer 55, which typically may be mounted on a spinning disk 45. The smaller the mass resolving aperture 44, the higher the resolving power R of the implanter, where $R=M/\Delta M$ (M being the nominal mass-to-charge ratio of the ion and $\Delta M$ being the range of mass-to-charge ratios passed by the aperture 44). The beam current passing aperture 44 can be monitored by a moveable Faraday detector 46, whereas a portion of the beam current reaching the wafer position can be monitored by a second Faraday detector 47 located behind the disk 45. The ion source 42 is biased to high voltage and receives gas distribution and power through feedthroughs 48. The source housing 49 is kept at high vacuum by source pump 50, while the downstream portion of the implanter is likewise kept at high vacuum by chamber pump 51. The ion source 42 is electrically isolated from the source housing 49 by dielectric bushing 52. The ion beam is extracted from the ion source 42 and accelerated by an extraction electrode 53. In the simplest case (where the source housing 49, implanter magnet 43, and disk 45 are maintained at ground potential), the final electrode of the extraction electrode 53 is at ground potential and the ion source is floated to a positive voltage $V_a$, where the beam energy $E=qV_a$ and q is the electric charge per ion. In this case, the ion beam impacts the wafer 55 with ion energy E. In other implanters, as in serial implanters, the ion beam is scanned across a wafer by an electrostatic or electromagnetic scanner, with either a mechanical scan system to move the wafer or another such electrostatic or electromagnetic scanner being employed to accomplish scanning in the orthogonal direction.

A part of the system of great importance in the technology of ion implantation is the ion source. FIG. 2 shows diagrammatically the "standard" technology for commercial ion sources, namely the "Enhanced Bernas" arc discharge ion source. This type of source is commonly the basis for design of various ion implanters, including high current, high energy, and medium current ion implanters. The ion source a is mounted to the vacuum system of the ion implanter through a mounting flange b which also accommodates vacuum feedthroughs for cooling water, thermocouples, dopant gas feed, $N_2$ cooling gas, and power. The dopant gas feed c feeds gas, such as the fluorides of a number of the desired dopant species, into the arc chamber d in which the gas is ionized. Also provided are dual vaporizer ovens e, f inside of the mounting flange in which solid feed materials such as As, $Sb_2O_3$, and P may be vaporized. The ovens, gas feed, and cooling lines are contained within a water cooled machined aluminum block g. The water cooling limits the temperature excursion of the aluminum block g while the vaporizers, which operate between 100 C and 800 C, are active, and also counteracts radiative heating by the arc chamber d when the ion source is active. The arc chamber d is mounted to, but designedly is in poor thermal contact with, the aluminum block g. The ion source a employs an arc discharge plasma, which means that it operates by sustaining within a defined chamber volume a generally narrow continuous electric arc discharge between hot filament cathode h, residing within the arc chamber d, and the internal walls of the arc chamber d. The arc produces a narrow hot plasma comprising a cloud of primary and secondary electrons interspersed with ions of the gas that is present. Since this arc can typically dissipate in excess of 300 W energy, and since the arc chamber d cools only through radiation, the arc chamber in such Bernas ion sources can reach a temperature of 800 C during operation.

The gas is introduced to arc chamber d through a low conductance passage and is ionized through electron impact with the electrons discharged between the cathode h and the arc chamber d and, as well, by the many secondary electrons produced by the arc discharge. To increase ionization efficiency, a substantial, uniform magnetic field i is established along the axis joining the cathode h and an anticathode j by externally located magnet coils, 54 as shown in FIG. 1. This provides confinement of the arc electrons, and extends the length of their paths. The anticathode j (sometimes referred to as a "repeller") located within the arc chamber d but at the end opposite the cathode h is typically held at the same electric potential as the cathode h, and serves to reflect the arc electrons confined by the magnetic field i back toward the cathode h, from which they are repelled back again, the electrons traveling repeatedly in helical paths. The trajectory of the thus-confined electrons results in a cylindrical plasma column between the cathode h and anticathode j. The arc plasma density within the plasma column is typically high, on the order of $10^{12}$ per cubic centimeter, this enables further ionizations of the neutral and ionized components within the plasma column by charge-exchange interactions, and also allows for the production of a high current density of extracted ions. The ion source a is held at a potential above ground (i.e., above the potential of the wafer 55) equal to the accelerating voltage $V_a$ of the ion implanter: the energy, E, of the ions as they impact the wafer substrate is given by $E=qV_a$, where q is the electric charge per ion.

The cathode h of such a conventional Bernas arc discharge ion source is typically a hot filament or an indirectly-heated cathode which thermionically emits electrons when heated by an external power supply. It and the anticathode are typically held at a voltage $V_c$ between 60V and 150V below the potential of the ion source body $V_a$. Once an arc discharge plasma is initiated, the plasma develops a sheath adjacent the exposed surface of the cathode h within chamber d. This sheath provides a high electric field to efficiently extract the thermionic electron current for the arc; high discharge currents (e.g., up to 7 A) can be obtained by this method.

The discharge power P dissipated in the arc chamber is $P=D V_c$, typically hundreds of watts. In addition to the heat dissipated by the arc, the hot cathode h also transfers power to the walls of the arc chamber d. Thus, the arc chamber d provides a high temperature environment for the dopant arc plasma, which boosts ionization efficiency relative to a cold environment by increasing the gas pressure within the arc chamber d, and by preventing substantial condensation of dopant material on the hot chamber walls.

If the solid source vaporizer ovens e or f of the Bernas arc discharge ion source are used, the vaporized material feeds into the arc chamber d with substantial pressure drop through narrow vaporizer feeds k and l, and into plenums m and n. The plenums serve to diffuse the vaporized material into the arc chamber d, and are at about the same temperature as the arc chamber d. Radiative thermal loading of the vaporizers by the arc chamber also typically prevents the vaporizers from providing a stable temperature environment for the solid feed materials contained therein below about 200 C. Thus, typically, only solid dopant feed materials that both vaporize at temperatures >200 C and decompose at temperatures >800 C (the temperature of the walls of the ionization chamber of a typical Bernas source) can be successfully vaporized and introduced by this method.

A very significant problem which currently exists in the ion implantation of semiconductors is the limitation of production-worthy ion implantation implanters that prevents effective implanting of dopant species at low (e.g., sub-keV) energies at commercially desired rates. One critically important application which utilizes low-energy dopant beams is the formation of shallow transistor junctions in CMOS manufacturing. As transistors shrink in size to accommodate more transistors per IC according to a vital trend, the transistors must be formed closer to the surface of the target wafer. This requires reducing the velocity, and hence the energy, of the implanted ions, so that they deposit at the desired shallow level. The most critical need in this regard is the implantation of low-energy boron, a p-type dopant, into silicon wafers. Since boron atoms have low mass, at a given energy for which the implanter is designed to operate, they must have higher velocity and will penetrate deeper into the target wafer than other p-type dopants; therefore there is a need for boron to be implanted at lower energies than other species.

Ion implanters are relatively inefficient at transporting low-energy ion beams due to space charge within the ion beam, the lower the energy, the greater the problem. The space charge in low energy beams causes the beam cross-section area (i.e. its "profile") to grow larger as the ions proceed along the beam line (there is "beam blow-up"). When the beam profile exceeds the profile for which the implanter's transport optics have been designed, beam loss through vignetting occurs. For example, at 500 eV transport energy, many ion implanters currently in use cannot transport enough boron beam current to be commercially efficient in manufacturing; i.e., the wafer throughput is too low because of low implantation dose rate. In addition, known ion sources rely on the application of a strong magnetic field in the source region. Since this magnetic field also exists to some extent in the beam extraction region of the implanter, it tends to deflect such a low-energy beam and substantially degrade the emittance properties of the beam, which further can reduce beam transmission through the implanter.

An approach has been proposed to solve the problem of low-energy boron implantation: molecular beam ion implantation. Instead of implanting an ion current I of atomic B+ ions at an energy E, a decaborane molecular ion, $B_{10}H_x^+$, is implanted at an energy 10×E and an ion current of 0.10×I. The resulting implantation depth and dopant concentration (dose) of the two methods have been shown to be generally equivalent, with the decaborane implantation technique, however, having significant potential advantages. Since the transport energy of the decaborane ion is ten times that of the dose-equivalent boron ion, and the ion current is one-tenth that of the boron current, the space charge forces responsible for beam blowup and the resulting beam loss can potentially be much reduced relative to monatomic boron implantation.

While $BF_3$ gas can be used by conventional ion sources to generate B+ ions, decaborane ($B_{10}H_{14}$) must be used to generate the decaborane ion $B_{10}H_x^+$. Decaborane is a solid material which has a significant vapor pressure, on the order of 1 Torr at 20 C, melts at 100 C, and decomposes at 350 C. To be vaporized through preferred sublimation, it must therefore be vaporized below 100 C, and it must operate in a production-worthy ion source whose local environment (walls of the ionization chamber and components contained within the chamber) is below 350 C to avoid decomposition. In addition, since the $B_{10}H_{14}$ molecule is so large, it can easily disassociate (fragment) into smaller components, such as elemental boron or diborane ($B_2H_6$), when subject to charge-exchange interactions within an arc discharge plasma, hence it is recognized that conventionally operated Bernas arc plasma sources can not be employed in commercial production, and that ionization should be obtained primarily by impact of primary electrons. Also, the vaporizers of current ion sources cannot operate reliably at the low temperatures required for decaborane, due to radiative heating from the hot ion source to the vaporizer that causes thermal instability of the molecules. The vaporizer feed lines k, l can easily become clogged with boron deposits from decomposed vapor as the decaborane vapor interacts with their hot surfaces. Hence, the present production-worthy implanter ion sources are incompatible with decaborane ion implantation. Prior efforts to provide a specialized decaborane ion source have not met the many requirements of production-worthy usage.

More broadly, there are numerous ways in which technology that has been common to the industry has had room for improvement. Cost-effective features, presented here as useful in implementing the new technology, are applicable to implementation of the established technology as well.

SUMMARY OF THE INVENTION

Various aspects of the invention provide improved approaches and methods for efficiently:

Vaporizing decaborane and other heat-sensitive materials via a novel vaporizer and vapor delivery system;

Delivering a controlled, low-pressure drop flow of vapors, e.g. decaborane, into the ion source;

Ionizing the decaborane into a large fraction of $B_{10}H_x^+$;

Preventing thermal dissociation of decaborane;

Limiting charge-exchange and low energy electron-induced fragmentation of $B_{10}H_x^+$;

Operating the ion source without an arc plasma, which can improve the emittance properties and the purity of the beam;

Operating the ion source without use of a strong applied magnetic field, which can improve the emittance properties of the beam;

Using a novel approach to produce electron impact ionizations without the use of an arc discharge, by incorporation of an externally generated, broad directional electron beam which is aligned to pass through the ionization chamber to a thermally isolated beam dump;.

Providing production-worthy dosage rates of boron dopant at the wafer;

Providing a hardware design that enables use also with other dopants, especially using novel hydride, dimer-containing, and indium- or antimony-containing temperature-sensitive starting materials, to further enhance the economics of use and production worthiness of the novel source design and in many cases, reducing the presence of contaminants;

Matching the ion optics requirements of the installed base of ion implanters in the field;

Eliminating the ion source as a source of transition metals contamination, by using an external and preferably remote cathode and providing an ionization chamber and extraction aperture fabricated of non-contaminating material, e.g. graphite, silicon carbide or aluminum;

Enabling retrofit of the new ion source into the ion source design space of existing Bernas source-based ion implanters and the like or otherwise enabling compatibility with other ion source designs;

Using a control system in retrofit installations that enables retention of the installed operator interface and control techniques with which operators are already familiar;

Enabling convenient handling and replenishment of the solid within the vaporizer without substantial downtime of the implanter;

Providing internal adjustment and control techniques that enable, with a single design, matching the dimensions and intensity of the zone in which ionization occurs to the beam line of the implanter and the requirement of the process at hand;

Providing novel approaches, starting materials and conditions of operation that enable the making of future generations of semiconductor devices and especially CMOS source/drains and extensions, and doping of silicon gates;

And generally, providing features, relationships and methods that achieve production-worthy ionization of decaborane and numerous other dopant feed materials many of which are novel to ion implantation, to meet the practical needs of fabrication facilities.

Embodiments of the present invention can enhance greatly the capability of new ion implantation systems and can provide a seamless and transparent upgrade to end-users' existing implanters.

In particular, aspects of the invention are compatible with current ion implantation technology, such that an ion source constructed according to the invention can be retrofitted into the existing fleet of ion implanters currently installed in expensive fabrication plants. Embodiments of the invention are (1) constructed, sized and arranged such that they fit into the existing ion source space of commercial implanters, and 2) employ a novel control system for the ion source which can physically replace the existing ion source controller, without further modification of the implanter controls and qualified production techniques.

According to one aspect of the invention, an ion source capable of providing ions in commercial ion current levels to the ion extraction system of an ion implanter is provided, the ion source comprising an ionization chamber defined by walls enclosing an ionization volume, there being an ion extraction aperture in a side wall of the ionization chamber, the aperture having a length and width sized and arranged to enable the ion current to be extracted from the ionization volume by the extraction system. The invention features a broad beam electron gun constructed, sized and arranged with respect to the ionization chamber to direct an aligned beam of primary electrons through the ionization chamber to a beam dump maintained at a substantial positive voltage relative to the emitter voltage of the electron beam gun. Preferably the beam dump is thermally isolated from the ionization chamber or separately cooled. The axis of the beam path of the primary electrons extends in a direction generally adjacent to the aperture, the electron beam having a dimension in the direction corresponding to the direction of the width of the extraction aperture that is about the same as or larger than the width of the aperture, a vaporizer arranged to introduce e.g. decaborane vapor to the ionization volume, and a control system enables control of the energy of the primary electrons so that individual vapor molecules can be ionized principally by collisions with primary electrons from the electron gun.

In preferred embodiments the electron gun is mounted on a support that is thermally isolated from the walls of the ionization chamber.

According to another aspect of the invention, an ion source capable of providing ions of decaborane in commercial ion current levels to the ion extraction system of an ion implanter is provided, the ion source comprising an ionization chamber defined by walls enclosing an ionization volume, there being an ion extraction aperture in a side wall of the ionization chamber, arranged to enable the ion current to be extracted from the ionization volume by an extraction system, an electron gun mounted on a support that is outside of and thermally isolated from the walls of the ionization chamber, and constructed, sized and arranged with respect to the ionization chamber to direct a broad beam of primary electrons through the ionization chamber to a beam dump maintained at a substantial positive voltage relative to the emitter voltage of the electron beam gun, the beam dump being located outside of, and thermally isolated from, the ionization chamber, the beam path of the primary electrons extending in a direction adjacent to the ion extraction aperture, a passage arranged to introduce vapor or gas of a selected material to the ionization volume, and a control system enabling control of the energy of the primary electrons so that the material can be ionized.

According to another aspect of the invention, an ion source capable of providing ions in commercial ion current levels to the ion extraction system of an ion implanter is provided, the ion source comprising an ionization chamber defined by walls enclosing an ionization volume, there being an extraction aperture in a side wall of the ionization chamber that is arranged to enable the ion current to be extracted from the ionization volume by the extraction system, an electron gun mounted on a support that is outside of and thermally isolated from the walls of the ionization chamber, and constructed, sized and arranged with respect to the ionization chamber to direct a broad beam of primary electrons through the ionization chamber to a beam dump maintained at a substantial positive voltage relative to the emitter voltage of the electron beam gun, the electron beam gun comprising a heated electron emitting surface of predetermined size followed by electron optical elements that enlarge the beam in the ionization chamber relative to the size of the emitting surface of the electron gun, the beam path of the primary electrons extending in a direction adjacent to the ion extraction aperture, a passage arranged to introduce vapor or gas of a selected material to the ionization volume, and a control system enabling control of the energy of the primary electrons so that the material can be ionized.

Preferred embodiments of these and other aspects of the invention have one or more of the following features:

A vaporizer is incorporated into the ion source assembly in close proximity to the ionization chamber and communicating with it through a high conductance, preferably along a line of sight path, and is constructed to be controllable over part or all of the range of 20 C to 200 C.

The beam dump has an electron-receiving surface larger than the cross-section of the electron beam entering the ionization chamber.

The electron gun produces a generally collimated beam, in many instances, preferably the electron gun being generally collimated while transiting the ionization chamber.

The beam dump is mounted on a dynamically cooled support, preferably a water-cooled support.

The electron gun is mounted on a dynamically cooled support, preferably, a water-cooled support.

The electron gun cathode is disposed in a position remote from the ionization chamber.

The volume occupied by the electron gun cathode is evacuated by a dedicated vacuum pump.

The ion source electron gun includes a cathode and variable electron optics that shape the flow of electrons into a beam of selected parameters, including a general dispersion of the electrons, and a profile matched to the extraction aperture, preferably in many cases the electrons being in a collimated beam within the ionization chamber.

The electron gun comprises a high transmission electron extraction stage capable of extracting at least the majority of electrons from an emitter of the gun, the extraction stage followed by a collimator and further electron optic elements, in preferred embodiments the further electron optics comprising an electron zoom lens or electron optics constructed to have the capability to vary the energy and at least one magnification parameter of the electron beam, preferably both linear and angular magnification of the beam and in preferred embodiments the electron optics comprising a five or more element zoom lens.

The ion source is constructed, sized and arranged to be retrofit into a pre-existing ion implanter, into the general space occupied by the original ion source for which the implanter was designed.

The ion source is constructed and arranged to cause the electron beam to have a profile matched to the opening of the ion extraction aperture, preferably the cross-section being generally rectangular.

The electron beam gun of the ion source is an elongated electron gun, in certain embodiments the length of the gun being longer than the length of the ionization path length in the ionization chamber, preferably, e.g. for retrofit installations, the principal direction of the elongated electron gun being arranged generally parallel to the direction in which the ion beam is extracted from the ionization chamber, and an electron mirror is arranged to divert the electron beam to a transverse direction to pass through the ionization volume. In this and other embodiments, preferably the cathode of the elongated electron beam gun is a uniform emitting surface sized smaller than the maximum cross-section of the electron beam passing through the ionization chamber, and the electron optics include optics arranged to expand the electron beam before it enters the ionization chamber. In various embodiments some of the optics precede the mirror or are downstream of the mirror, and the optics are constructed to vary angular as well as linear magnification. Preferably these optics comprise a zoom control to enable variation of the electron energy of the beam.

The control system includes a circuit for measuring the current and the intensity of the beam dump.

The ion source electron beam gun is constructed to operate with a voltage drop relative to the walls of the ionization chamber between about 20 and 300 or 500 electron volts; preferably, to ionize decaborane, the voltage drop being between 20 and 150 electron volts, higher voltages being useful for providing double charges on selected implant species or for providing ionizing conditions for other feed materials.

For use with a previously existing ion implanter designed for use with a Bernas arc discharge source having a directly or indirectly heated cathode, the control system includes an operator control screen corresponding to the screen used for the Bernas source, and a translator effectively translates arc current control signals to control signals for the electron gun.

The ionization chamber is in thermal continuity with the vaporizer, or with a temperature control device.

The vaporizer for decaborane includes a temperature control system, and the ionization chamber is in thermal continuity with the vaporizer, preferably the ionization chamber is defined within a conductive block defining a heat sink that is in thermal continuity with the vaporizer, preferably, the conductive block being in thermal continuity with the vaporizer via one or more conductive gaskets, including a gasket at which the vaporizer may be separated from the remainder of the assembly.

The ionization chamber is defined by a removable block disposed in heat transfer relationship to a temperature controlled mounting block, preferably the removable block comprised of graphite, silicon carbide or aluminum.

The ion source includes a mounting flange for joining the ion source to the housing of an ion implanter, the ionization chamber being located on the inside of the mounting flange and the vaporizer being removably mounted to the exterior of the mounting flange via at least one isolation valve which is separable from the mounting flange with the vaporizer, enabling the vaporizer charge volume to be isolated by the valve in closed position during handling, preferably there being two isolation valves in series, one unified with and transportable with a removed vaporizer unit, and one constructed to remain with and isolate the remainder of the ion source from the atmosphere. In certain preferred embodiments, two such vaporizers are provided, enabling one to be absent, while being charged or serviced, while the other operates, or enabling two different materials to be vaporized without maintenance of the ion source, or enabling additional quantities of the same materials to be present to enable a protracted implant run.

Opposite walls of the ionization chamber corresponding respectively to the electron beam gun and the beam dump have ports through which electrons pass enroute from the electron beam gun to the beam dump, the spaces in the vicinity of the ports being surrounded by housing and communicating with a vacuum system.

The ion source includes a gas inlet via into which compounds such as arsine, phosphene, germane and silane gas can be introduced to the ionization chamber for ionization.

The extraction aperture of the ionization chamber, for e.g. high current machines, is about 50 mm or more in length and at least about 3.5 mm in width, and the transverse cross sectional area of the electron beam is at least about 30 square mm, preferably, e.g. for decaborane in high current machines, the cross-sectional area of the beam being at least about 60 square mm. For a medium current ion implanter preferably the extraction aperture is at least 15 mm in length and at least about 1.5 mm in width, and the transverse cross sectional area of the electron beam is at least about 15 square millimeters. In many medium current implanters, the extraction aperture can be sized 20 mm long by 2 mm wide, in which case the cross-sectional area of the electron beam can be reduced to a minimum of about 20 square mm.

An ion implantation system is provided comprising an ion implanter designed for a first ion source occupying a general design volume, and a second ion source of any of the novel types described above is operatively installed in that volume, preferably the electron gun being of elongated form, having its principal direction arranged parallel to the direction the ion beam is extracted from the ionization chamber, and an electron mirror is arranged to divert the electron beam to a transverse direction to pass through the ionization volume. In this and other embodiments of an ion implantation system, preferably the cathode is sized smaller than the maximum cross-section of the electron beam passing through the ionization chamber, and the electron optics include optics arranged to expand the electron beam before it enters the ionization chamber, preferably these optics being associated with a zoom control to enable controlled variation of the electron energy.

The invention also features methods of employing apparatus having the various features described to ionize decaborane, the mentioned hydrides and other temperature-sensitive materials including indium-, antimony-, and dimer-containing compounds. The methods include using the various methods of control that are described in the preceding description and in the following text.

In particular, the invention includes the methods described of generating the electron beam, accelerating and collimating the beam, controlling its transverse profile and its energy, and causing it to transit the ionization chamber to create the desired ions while keeping the ionization chamber cool. It also includes the methods of vaporizing the solid materials and cooling the ionization chamber with the vaporizer heat control system as well as controlling the vapor production of the vaporizer by pressure control or by a dual temperature and pressure control that is for instance capable of adjusting for the decreasing volume of the feed material as operation proceeds.

Particular aspects of the invention feature methods of providing ions during ion implantation comprising introducing material comprising a gas or heated vapor to a chamber enclosing an ionization volume, the chamber having an extraction aperture, and passing through the ionization volume adjacent the aperture a broad beam of electrons. According to one aspect of the invention, the broad beam is aligned with a beam dump that is thermally isolated from the chamber, the energy of the electrons being selected to ionize the material. According to another aspect, the energy and magnification of the electron beam are controlled with electron zoom optics to ionize the material. According to another aspect, the beam is formed and the energy of the electrons is controlled by successively accelerating and decelerating the electrons. In preferred embodiments of these aspects the broad electron beam is emitted from a heated emitter surface that is remote from and thermally isolated from the ionization chamber; electrons from an emitter surface are accelerated, collimated and passed through beam-expanding optics before passing through the ionization chamber, and, for vaporizing decaborane, the method includes introducing the decaborane vapors to the ionization chamber, and controlling the broad electron beam parameters to ionize the decaborane and produce a decaborane current, or the method includes introducing to the ionization chamber a hydride of a desired species, and ionizing the hydride, in preferred embodiments the hydride being arsine or phosphene or germane or silane or diborane.

In other preferred methods, an indium-containing compound is employed including introducing the indium compound vapors to the ionization chamber, and controlling the broad electron beam parameters to ionize the indium compound and produce an indium ion current, preferably the compound being trimethyl indium. In still other preferred methods, a compound containing antimony is employed including introducing the antimony compound vapors to the ionization chamber, and controlling the broad electron beam parameters to ionize the antimony compound and produce an antimony ion current, preferably the compound being antimony oxide ($Sb_2O_5$). Other dimer-containing compounds described below are also useful, both for producing dimer ions and monomer ions. In the various methods preferably a beam dump is employed to receive the electron beam after it transits the ionization volume, including maintaining the beam dump thermally isolated from the chamber and at a voltage potential at least as high as that of the chamber.

In some instances a magnetic field is applied to constrain the electron beam, e.g. to counteract space-charge effects. In some instances, for certain compounds, preferably the process described is converted to a reflex ionization mode by changing the potential of the beam dump to a substantially lower potential than the walls of the ionization chamber to act as an electron-repelling anticathode, in certain cases the method including applying a magnetic field parallel to the electron beam, or continuing to cool the walls of the ionization chamber while operating in reflex mode.

The invention also features the methods of retrofitting the new ion source into the existing fleet of ion implanters, and of controlling the ion source by means of the operator interface of the arc plasma ion source that it replaces.

Also, the invention features methods of conducting entire ion implantation processes using the equipment and controls described to form semiconductor devices, in particular shallow source/drains and extensions, and doping of the silicon gates in CMOS fabrication.

In addition, the invention features methods and apparatus for dual mode operation, both a broad E-Beam mode with the beam aligned with a beam dump at positive potential and a reflex mode, in which the dump is converted to a repeller (anticathode) with optional use of a confining magnetic field, advantageously both conducted with cooled walls to ionize materials such as hydrides that disassociate with elevated temperatures.

In the method employing a broad electron beam directed to a beam dump, in certain cases the invention features applying a magnetic field to constrain the electron beam.

According to another aspect of the invention, an ion source is provided having a member whose surface is exposed to contact of a dopant feed material, including gases, vapors or ions thereof, the relationship of the contact being such that condensation or molecular dissociation will occur if the temperature of the surface of the member is not within a desired operational range, the member being disposed in conductive heat transfer relationship with a second member, the temperature of which is actively controlled. The temperature of the second member can be determined by water-cooling the member with de-ionized water of a given temperature. The second member can be associated with a thermoelectric cooling unit associated with a control system that can activate the unit to maintain the temperature of the surface within said operational range. In some cases a heater element is included which is arranged to cooperate with the cooling unit to maintain the second member at a temperature. In certain embodiments the cooling unit has a surface which forms a thermally conductive interface with an opposed surface of the member. In certain preferred embodiments a conductive gas fills gaps at an interface in the conductive path under conditions in which the gas molecules act to transfer heat across the interface by conduction, preferably the conductive gas being fed into channels formed in at least one of the surfaces across which the thermal heat conduction is to occur.

The invention also features a control system for the vaporizer which includes an ionization gauge sensitive to a pressure related to a pressure within the ionization chamber.

Another aspect of the invention is an ion source which includes an accel-decel electron gun arranged to project a beam of electrons through an ionization chamber to ionize gas or vapors in a region adjacent an extraction aperture.

Preferred embodiments of this aspect have one or more of the following features:

A magnetic coil is disposed outside of the ionization chamber, the electron gun is mounted concentrically with the coil, such that the emission axis of the electron gun is aligned to emit electrons into the ionization chamber and the coil, when energized, provides a magnetic field which limits space charge expansion of the electron beam as it transits the ionization chamber.

The volume occupied by the electron gun cathode is evacuated by a dedicated vacuum pump.

A beam dump at a positive voltage is aligned to receive electrons of the beam that transit the ionization chamber.

This accel-decel electron gun is disposed outside of an ionization chamber, the electron gun mounted such that the emission axis of the electron gun is aligned to emit electrons into the ionization chamber.

The accel-decel gun has an electron zoom lens. The accel-decel gun is comprised of a high-transmission extraction stage followed by a focusing lens having at least two elements followed by a relatively short, strongly-focusing lens which acts to decelerate the electron beam entering the ionization chamber, preferably the short lens being a multi-aperture lens comprising a series of at least two conducting plates each having an aperture, the voltage on the plates being of respectively decreasing values to decelerate the electrons.

The beam deceleration stage of the electron gun focuses the beam in the ionization chamber at a point near mid-length of an elongated aperture, past which the electron beam passes.

Other aspects and detailed features of the invention will be apparent from the drawings, the following description of preferred embodiments, and from the claims and abstract.

GENERAL DESCRIPTION

An embodiment of an ion source incorporating various aspects of the invention is composed of i) a vaporizer, ii) a vaporizer valve, iii) a gas feed, iv) an ionization chamber, v) an electron gun, vi) a cooled mounting frame, and vii) an ion exit aperture. Included are means for introducing gaseous feed material into the ionization chamber, means for vaporizing solid feed materials and introducing their vapors into the ionization chamber, means for ionizing the introduced gaseous feed materials within the ionization chamber, and means for extracting the ions thus produced from an ion exit aperture adjacent to the ionization region. In addition, means for accelerating and focusing the exiting ions are provided. The vaporizer, vaporizer valve, gas feed, ionization chamber, electron gun, cooled mounting frame, and ion exit aperture are all integrated into a single assembly in preferred embodiments of the novel ion source. I will describe each of these features.

Vaporizer: The vaporizer is suitable for vaporizing solid materials, such as decaborane ($B_{10}H_{14}$) and TMI (trimethyl indium), which have relatively high vapor pressures at room temperature, and thus vaporize at temperatures below 100 C. The temperature range between room temperature and 100 C is easily accommodated by embodiments in which the vaporizer is directly associated with a water heat transfer medium, while other preferred arrangements accommodate novel material which produce significant vapor pressures in the range up to 200 C. For example, solid decaborane has a vapor pressure of about 1 Torr at 20 C. Most other implant species currently of interest in the ion implantation of semiconductors, such as As, P, Sb, B, C, Ar, N, Si, and Ge are available in gaseous forms. However, $B_{10}$ and In are not, but can be presented in vapors from solid decaborane and TMI. The vaporizer of an embodiment of the invention is a machined aluminum block in which resides a sealed crucible containing the solid material to be vaporized, entirely surrounded by a closed-circuit water bath, which is itself enclosed by the aluminum block. The bath is held at a well-defined temperature by a closed-loop temperature control system linked to the vaporizer. The closed-loop temperature control system incorporates a PID (Proportional Integral Differential) controller. The PID controller accepts a user-programmable temperature setpoint, and activates a resistive heater (which is mounted to a heater plate in contact with the water bath) to reach and maintain it's setpoint temperature through a thermocouple readback circuit which compares the setpoint and readback values to determine the proper value of current to pass through the resistive heater. To ensure good temperature stability, a water-cooled heat exchanger coil is immersed in the water bath to continually remove heat from the bath, which reduces the settling time of the temperature control system. The temperature difference between the physically separate heater plate and heat exchanger coil provides flow mixing of the water within the bath through the generation of convective currents. As an added mixing aid, a rotating magnetic mixer paddle can be incorporated into the water bath. Such a temperature control system is stable from 20 C to 100 C. The flow of gas from the vaporizer to the ionization chamber is determined by the vaporizer temperature, such that at higher temperatures, higher flow rates are achieved.

The flow of gas from a vaporizer to the ionization chamber is determined by the vaporizer temperature, such that at higher temperatures, higher flow rates are achieved.

According to preferred embodiments of the invention, the vaporizer communicates with the ionization chamber via a relatively high-conductance path between the crucible and the ionization chamber. This is preferably achieved by incorporating a relatively short, large-diameter, line-of-sight conduit between the two components. High-conductance gate valves (large diameter gates with a thin dimensioned housing) are used in the flow path between the vaporizer and source body, so as not to limit this conductance. By providing a high conductance for the transport of vapor to the ionization chamber, the pressure within the vaporizer and the temperature excursion required are lower than in prior vaporizers.

In one embodiment according to the invention a relatively low conductance supply path is achieved employing a 5 mm diameter, 20 cm long conduit, providing a conductance of about $7 \times 10^{-2}$ L/s between crucible and ionization chamber. This would require a pressure within the vaporizer of about 2 Torr to establish an ionization chamber pressure of about 4.5 mTorr. Another embodiment employs an 8 mm diameter conduit of the same length, providing a conductance of about $3 \times 10^{-1}$ L/s, allowing a pressure within the vaporizer of 0.5 Torr to achieve the same flow rate of material, and hence the same pressure of 4.5 mTorr within the ionization chamber.

The static vapor pressure of a material at a given temperature and the dynamic pressure in the vaporizer crucible during the evolution and transport of vapor out of the crucible during operation are not the same. In general, the steady-state dynamic pressure is lower than the static vapor pressure, the extent depending on the distribution of source material within the vaporizer crucible, in addition to other details of construction. According to the invention, the conductances are made large to accommodate this effect. In addition, in certain preferred embodiments, the added openness of the ionization chamber to the vacuum environment of the source housing due to electron entrance and exit ports into the ionization chamber requires about twice the flow of gaseous material as a conventional Bernas-style source. Generally according to the invention, it is preferred that the conductance be in the range of about $3 \times 10^{-2}$ to $3 \times 10^{-1}$ L/s, preferably the length of the conduit being no less than 30 cm while its diameter is no less than about 5 mm, the preferred diameter range being between 5 and 10 mm. Within these limits it is possible to operate at much lower temperatures than conventional vaporizers, no large addition of temperature being required to elevate the pressure to drive the flow to the ionization chamber. Thus the temperature-sensitive materials are protected and a broad range of materials are enabled to be vaporized within a relatively small temperature range.

In several of the embodiments of the vaporizer presented, the construction of the vaporizer, following these guidelines, allows operation at temperatures between 20 C and 100 C or 200 C. Given the high conductance of the vaporizer, and such temperature ranges, I have realized that the wide range of solid source materials that can be accommodated include some materials which have not previously been used in ion implantation due to their relatively low melting point. (It generally being preferred to produce vapors from material in solid form).

An additional advantage of enabling use of only a relatively low pressure of vaporized gas within the crucible is that less material can be required to establish the desired mass flow of gas than in prior designs.

In another embodiment a different vaporizer PID temperature controller is employed. In order to establish a repeatable and stable flow, the vaporizer PID temperature controller receives the output of an ionization-type pressure gauge which is typically located in the source housing of commercial ion implanters to monitor the sub-atmospheric pressure in the source housing. Since the pressure gauge output is proportional to the gas flow into the ion source, its output can be employed as the controlling input to the PID temperature controller. The PID temperature controller can subsequently raise or diminish the vaporizer temperature, to increase or decrease gas flow into the source, until the desired gauge pressure is attained.

Thus, two useful operating modes of a PID controller are defined: temperature-based, and pressure-based.

In another embodiment, these two approaches are combined such that short-term stability of the flow rate is accomplished by temperature programming alone, while long-term stability of the flow rate is accomplished by adjusting the vaporizer temperature to meet a pressure setpoint. The advantage of such a combined approach is that, as the solid material in the vaporizer crucible is consumed, the vaporizer temperature can be increased to compensate for the smaller flow rates realized by the reduced surface area of the material presented to the vaporizer.

In another preferred embodiment of the vaporizer, a fluid heat transfer medium is not used. Rather than a water bath, the crucible is integral with the machined body of the vaporizer, and heating and cooling elements are embedded into the aluminum wall of the vaporizer. The heating element is a resistive or ohmic heater, and the cooling element is a thermoelectric (TE) cooler. The vaporizer is also encased in thermal insulation to prevent heat loss to the ambient, since the desired vaporizer temperature is typically above room temperature. In this embodiment, the heating/cooling elements directly determine the temperature of the walls of the vaporizer, and hence the temperature of the material within the crucible, since the material is in direct contact with the walls of the vaporizer which is e.g. machined of a single piece of aluminum. The same PID temperature controller techniques can be used as in the previously described embodiment, enabling the vaporizer to reach a temperature in excess of 100 C, preferably up to about 200 C.

In another embodiment, the vaporizer consists of two mating, but separate components: a vaporizer housing and a crucible. The crucible is inserted into the housing with a close mechanical fit. The surface of the vaporizer housing which makes contact with the crucible contains a pattern of rectangular grooves, into which subatmospheric pressurized conductive gas is introduced. The pressurized gas provides sufficient thermal conductivity between the crucible and the temperature-controlled housing to control the temperature of the crucible surface in contact with decaborane or other solid feed material to be vaporized. This embodiment allows the crucible to be easily replaced during service of the vaporizer. The same PID temperature controller techniques can be used as in the previously described embodiment.

In some preferred embodiments, the vaporizer, while still close to the ionization chamber, communicating with it through a high conductance path, is physically located outside of, and removably mounted to, the main mounting flange of the ion source and the vaporizer communicates through the main mounting flange to the ionization chamber located within the vacuum system.

In some preferred embodiments, two vaporizers, independently detachable from the remainder of the ion source, are provided, enabling one vaporizer to be in use while the other, detached, is being recharged or serviced.

Vaporizer valve: In the above described vaporizer embodiments, the vapors leave the vaporizer and enter the adjacent ionization chamber of the ion source through an aperture, which is preferably coupled to a thin, high conductance gate valve with a metal seal or other thermally conductive seal placed between the vaporizer and ionization chamber. The gate valve serves to separate the vaporizer from the ionization chamber, so that no vapor escapes from the vaporizer when the valve is shut, but a short, high-conductance line-of-sight path is established between the ionization chamber and vaporizer when the valve is open, thus allowing the vapors to freely enter the ionization chamber. With the valve in the closed position, the vaporizer with the valve attached may be removed from the ion source without releasing the toxic vaporizer material contained in the crucible. The ion source may then be sealed by installing a blank flange in the position previously occupied by the vaporizer valve. In another embodiment, two isolation valves are provided in series, one associated with the removable vaporizer and one associated with all of the other components of the ion source, with the disconnect interface being located between the two valves. Thus both parts of the system can be isolated from the atmosphere while the parts are detached from one another. One of the mating valves (preferably, the valve isolating the ion source body) has a small, valved roughing port integrated internal to the valve body, which enables the air trapped in the dead volume between them to be evacuated by a roughing pump after the two valves are mated in a closed position. If the source housing of the implanter is under vacuum, the vaporizer can be installed with its valve in a closed state after being refilled. It is mated to the closed valve mounted to the ion source in the implanter. The vaporizer valve can then be opened and the vaporizer volume pumped out through the roughing port (along with the gas trapped in the dead volume between the valves). Then the ion source valve can be opened, without requiring venting of the source housing. This capability greatly reduces the implanter down time required for servicing of the vaporizer. In another system, two such vaporizers, each with two isolation valves in series, as described, are provided in parallel, suitable to vaporize different starting materials, or to be used alternatively, so that one may be serviced and recharged while the other is functioning.

Gas feed: In order to operate with gaseous feed materials, ion implanters typically use gas bottles which are coupled to a gas distribution system. The gases are fed to the ion source via metal gas feed lines which directly couple to the ion source through a sealed VCR or VCO fitting. In order to utilize these gases, embodiments of the ion source of the present invention likewise have a gas fitting which couples to the interior of the ionization chamber and connects to a gas distribution system.

Ionization chamber: The ionization chamber defines the region to which the neutral gas or vapor fed to the source is ionized by electron impact.

In certain preferred embodiments, the ionization chamber is in intimate thermal and mechanical contact with the high conductance vaporizer valve or valves through thermally conductive gaskets, which are likewise in intimate thermal contact with the vaporizer through thermally conductive gaskets. This provides temperature control of the ionization chamber through thermal contact with the vaporizer, to avoid heat generated in the ionization chamber from elevating the temperature of the walls of the chamber to temperatures which can cause decaborane or other low-temperature vaporized materials or gases to break down and dissociate.

In other embodiments, the ionization chamber, as a removable component, (advantageously, in certain instances, a regularly replaced consumable component) is maintained in good heat transfer relationship with a temperature-controlled body, such as a temperature controlled solid metal heat sink having a conventional water cooling medium or being cooled by one or more thermoelectric coolers.

The ionization chamber in preferred embodiments suitable for retrofit installation is sized and constructed to provide an ionization volume, extraction features, and ion optical properties compatible with the properties for which the target implanter to be retrofitted was designed.

In preferred embodiments, the ionization chamber is rectangular, made of a single piece of machined aluminum, molybdenum, graphite, silicon carbide or other suitable thermally conductive material. Because contact of the ionization chamber with a fluid transfer medium is avoided in designs presented here, in certain instances the ionization chamber and extraction aperture are uniquely formed of low cost graphite, which is easily machined, or of silicon carbide, neither of which creates risk of transition metals contamination of the implant. Likewise for the low temperature operations (below its melting point) an aluminum construction may advantageously be employed. A disposable and replaceable ionization chamber of machined graphite or of silicon carbide is a particular feature of the invention.

The ionization chamber in certain preferred embodiments is approximately 7.5 cm tall by 5 cm wide by 5 cm deep, approximating the size and shape of commercially accepted Bernas arc discharge ionization chambers. The chamber wall thickness is approximately 1 cm. Thus, the ionization chamber has the appearance of a hollow, rectangular five-sided box. The sixth side is occupied by the exit aperture. The aperture can be elongated as are the extraction apertures of Bernas arc discharge ion sources, and located in appropriate position in relation to the ion extraction optics. The flow rate of the gas fed into the ionization chamber is controlled to be sufficient to maintain proper feed gas pressure within the ionization chamber. For most materials, including decaborane, a pressure between 0.5 mTorr and 5 mTorr in the ionization chamber will yield good ionization efficiency for the system being described. The pressure in the source housing is dependent upon the pressure in the ionization chamber. With the ionization chamber pressure at 0.5 mTorr or 5 mTorr, the ion gauge mounted in the source housing, typically used in commercial ion implanters to monitor source pressure, will read about $1 \times 10^{-5}$ Torr and $1 \times 10^{-4}$ Torr, respectively. The flow rate from the vaporizer or gas feed into the ionization chamber required to sustain this pressure is between about 1 sccm and 10 sccm (standard cubic centimeters per minute).

Electron gun: For ionizing the gases within the ionization chamber, electrons of controlled energy and generally uniform distribution are introduced into the ionization chamber by a broad, generally collimated beam electron gun as shown in the illustrative figures described below. In one embodiment of the invention, a high-current electron gun is mounted adjacent one end of the ionization chamber, external to that chamber, such that a directed stream of primary energetic electrons is injected through an open port into the ionization chamber along the long axis of the rectangular chamber, in a direction parallel to and adjacent the elongated ion extraction aperture. In preferred embodiments of the invention, the cathode of the electron gun is held at an electric potential below the potential of the ionization chamber by a voltage equal to the desired electron energy for ionization of the molecules by the primary electrons. Two ports, respectively in opposite walls of the ionization chamber are provided to pass the electron beam, one port for entrance of the beam as mentioned above, and the second port for exit of the beam from the ionization chamber. After the electron beam exits the ionization chamber, it is intercepted by a beam dump located just outside of the ionization chamber the beam dump being aligned with the electron entry point, and preferably maintained at a potential somewhat more positive than that of the ionization chamber. The electron beam is of an energy and current that can be controllably varied over respective ranges to accommodate the specific ionization needs of the various feed materials introduced into the ionization chamber, and the specific ion currents required by the ion implant processes of the end-user.

In particular embodiments, the electron gun is constructed to be capable of providing an electron beam energy programmable between 20 eV and 500 eV.

The lowest beam energies in this energy range accommodate selective ionization of a gas or vapor below certain ionization threshold energies, to limit the kinds of end-product ions produced from the neutral gas species. An example is the production of $B_{10}H_x^+$ ions without significant production of $B_9H_x^+$, $B_8H_x^+$, or other lower-order boranes frequently contained in the decaborane cracking pattern when higher electron impact energies are used.

The higher beam energies in the energy range of the electron gun are provided to accommodate the formation of multiply-charged ions, for example, $As^{++}$ from $AsH_3$ feed gas. For the majority of ion production from the various feed gases used in semiconductor manufacturing, including the production of $B_{10}H_x^+$ from decaborane, an electron beam energy between 50 eV and 150 eV can yield good results.

In preferred embodiments, the electron gun is so constructed that the electron beam current can be selected over a range of injected electron beam currents between 0.1 mA and 500 mA, in order to determine the ion current extracted from the ion source in accordance with the implant demand. Control of electron current is accomplished by a closed-loop electron gun controller which adjusts the electron emitter temperature and the electron gun extraction potential to maintain the desired electron current setpoint. The electron emitter, or cathode, emits electrons by thermionic emission, and so operates at elevated temperatures. The cathode may be directly heated (by passing an electric current through the cathode material), or indirectly heated. Cathode heating by electron bombardment from a hot filament held behind the cathode is an indirect heating technique well-practiced in the art. The cathode may be made of tungsten, tantalum, lanthanum hexaboride ($LaB_6$), or other refractory conductive material. It is realized that $LaB_6$ offers a particular advantage, in that it emits copious currents of electrons at lower temperatures than tungsten or tantalum. As discussed further below, the preferred separate mounting of the electron beam gun, thermally isolated from the ionization chamber, is an advantageous factor in keeping the ionization chamber cool.

Electron beam guns having cathodes mounted close to the ionization chamber on a cooled support, which discharge directly into the chamber, are shown in the first two embodiments described below.

Further advantages are obtained in certain embodiments by use of an elongated electron gun design, i.e. typically longer that the length of the ionization chamber transitted by the beam. This enables the heated cathode of the gun to be located quite far from the ionization chamber, completely thermally isolated from it, and enables use of a small highly efficient cathode by combination with telescopic electron optics to achieve the desired broad electron beam and desired electron density across the beam cross section (profile). A zoom lens can advantageously enable variation of the cross-section of the electron beam that transits the ionization chamber to match the size of the selected aperture and beam current.

In an advantageous, space-efficient design, the elongated electron gun is mounted parallel to the direction of extraction of the ion beam, with the cathode located near or even outside, beyond the mounting flange of the ion source, and associated at its other end with an electron beam mirror that deflects the beam to transit the ionization chamber.

In new implanter designs in which there are not as many predetermined space constraints, the described elongated electron beam gun, with relatively small emitter surface, and associated zoom lens can be arranged in line with the direction of transit of the electron through the ionization chamber, no diverting mirror being employed.

In a high current design an acceleration-deceleration system aligned with the direction of transit through the ionization chamber is advantageous in a number of respects, especially when employing an accel-decel system for maximizing the electron flow through the ionization chamber.

The electron beam, however produced, has a significant cross-sectional area, i.e. it is a broad generally collimated beam as it transits the ionization chamber, to the beam dump with which it is aligned. In preferred embodiments, the electron beam within the ionization chamber has a generally rectangular cross section, e.g. in one embodiment approximately 13 mm×6 mm as injected into the ionization chamber, to match with a relatively wide extraction aperture of a high current machine, or the rectangular cross section is e.g. of a square cross-section profile for use with a narrower ion extraction aperture. In the case of direct injection, the shape of the injected electron beam can be determined by the shape of the electron optics, e.g. the grid and anode apertures of an electron gun, which, for example, may both be approximately 13 mm×6 mm, and also by the shape of the cathode or electron emitter, which, for the first example given, is somewhat larger than the grid and anode apertures, approximately 15 mm×9 mm. The advantage of generating a generally rectangular electron beam profile is to match the conventionally desired ion beam profile as extracted from the ion source, which is also rectangular. The rectangular exit aperture from which the ion beam is extracted is approximately 50 mm tall by 3.5 mm wide in many high-current implanters; in such cases the electron beam (and thus the ions produced by electron impact) can present a profile to the exit aperture within the ionization chamber of approximately 64 mm×13 mm. If the end-user wishes, an enlarged exit aperture may be employed to obtain higher extracted currents.

As mentioned above, preferably in the walls of the ionization chamber, there are both an electron entrance port and an aligned electron exit port for the electron beam, which departs from the conventionally employed Bernas ion source. In Bernas ion sources, energetic electrons produced by an emitter, located typically internal to the ionization chamber, strike the walls of the chamber to form the basis of an "arc discharge". This provides a substantial heat load which elevates the temperature of the ionization chamber walls. In the present invention, the ionizing electrons (i.e the energetic or "primary" electrons) pass through the ionization chamber to the defined beam dump, substantially without intercepting the general chamber walls. "Secondary" electrons, i.e. low-energy electrons produced by ionization of the feed gas, still can reach the general walls of the ionization chamber but since these are low energy electrons, they do not provide significant heat load to the walls. The feature of through-transit of the primary electrons allows the ionization chamber to be conductively cooled, e.g. by the vaporizer, or by a cooled block against which the ionization chamber is mounted in substantial thermal contact, without providing a large heat load on the temperature controller of the vaporizer or block. To avoid the heat generated by the electron gun and the energetic electron beam, the electron gun and the electron beam dump are mounted in thermally isolated fashion, preferably either or both being mounted on respective water-cooled parts of a cooled mounting frame. This frame is dynamically cooled, e.g. by high-resistivity, de-ionized water commonly available in commercial ion implanters.

Cooled mounting frame and Beam Dump: The cooled mounting frame is e.g. a water-cooled sheet metal assembly on which the electron gun and the electron beam dump may be mounted. The frame consists of two separate mechanical parts which allow the electron gun and the beam dump to be independently biased. By mounting these two components to this frame, a heat load to the ionization chamber can be substantially avoided. The frame provides a mechanical framework for the thus-mounted components, and in addition the frame and the mounted components can be held at an electric potential different from the potential of the ionization chamber and vaporizer by mounting to the ion source assembly on electrically insulating standoffs.

In embodiments discussed below, the beam dump is discretely defined and isolated, preferably being removed from direct contact with the ionization chamber, with the electron beam passing through an exit port in the ionization chamber prior to being intercepted by the beam dump. The beam dump can readily be maintained at a potential more positive than the walls of the chamber to retain any secondary electrons released upon impact of primary electrons up on the beam dump. Also, the beam dump current can be detected for use in the control system as well as for diagnostics. Also, in a multi-mode ion source, by being electrically isolated, the voltage on the dump structure can be selectively changed to negative to serve an electron-repeller (anticathode) function, as described below.

In another construction, the distinctly defined beam dump though can be in physical contact with the exit port in such a way that thermal conduction between the cooled beam dump and the exit port is poor e.g., by point contact of discrete elements. Electrical insulation, which has thermal insulation properties as well, can be provided to enable a voltage differential to be maintained while preventing heating of the general walls of the ionization chamber. One advantage of this embodiment is a reduced conduction of the source gas out of the ionization chamber, reducing gas usage.

The extraction of ions from the ionization chamber is facilitated by an asymmetric relationship of the electron beam axis relative to the central chamber axis, locating the site of ionization closer to the extraction aperture. By maintaining a voltage on the aperture plate through which the ions are extracted that is lower than that of the other chamber walls, the ions are drawn toward the extraction path.

In use of the ion source in a mode different from that used for decaborane as described above, e.g. using $BF_3$ feed gas, the electron beam dump may be biased to a negative potential relative to the ionization chamber, e.g. to a voltage approximating that of the cathode potential, in a "reflex geometry" whereby the primary electrons emitted by the electron gun are reflected back into the ionization chamber and to the cathode, and back again repeatedly, i.e. instead of serving as a beam dump, in this mode the dump structure serves as a "repeller", or anticathode. An axial magnetic field may also be established along the direction of the electron beam by a pair of magnet coils external to the ion source, to provide confinement of the primary electron beam as it is reflected back and forth between the cathode and beam dump. This feature also provides some confinement for the ions, which may increase the efficiency of creating certain desired ion products, for example B+ from $BF_3$ feed gas. Such a reflex mode of operation is known per se by those practiced in the art, but is achieved here in a unique multi-mode ion source design capable of efficiently producing e.g. decaborane ions.

A novel multimode ion source includes an electron gun for the purposes as described, disposed coaxially within a magnet coil that is associated with the source housing and ionization chamber contained within.

BRIEF DESCRIPTION OF DRAWINGS

FIG. 3B illustrates the removable feature of the vaporizer of FIG. 3A, using a conventional mounting flange while

FIG. 4 is a side cross-sectional view taken on line 4—4 of FIG. 3 while

FIGS. 4B and 4C are views similar to that of FIG. 4, of other arrangements of the discretely defined electric beam dump;

FIG. 8 illustrates the ion source of FIGS. 3–6 installed in a retrofit volume of a pre-existing ion implanter while

FIG. 9, similar to FIG. 8, shows an ion source employing an elongated right angle electron gun and an angled mirror while

FIG. 15 is a diagram of the operator interface of a conventional Bernas arc discharge ion source while

FIGS. 16A-1 and 16A-2 represent a view similar to FIG. 16 of the control system for an elongated E-Beam embodiment of the invention;

FIGS. 20A and 20B an side views of the inside face and outside face of an aperture insert plate of another embodiment while

DETAILED DESCRIPTION OF PREFERRED EMBODIMENTS

Figure 1:
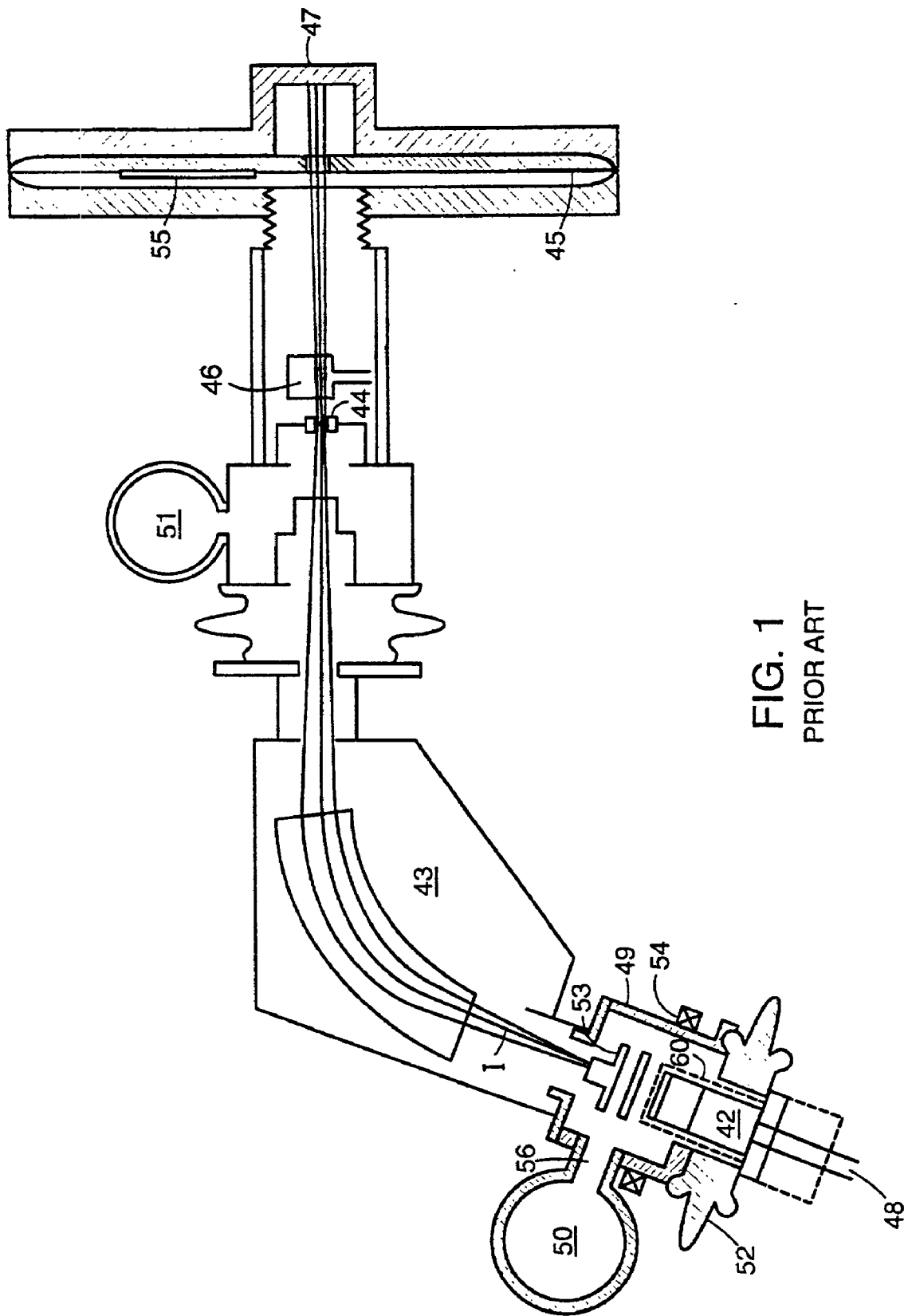
FIG. 1 is a diagrammatic view of a prior art ion implanter.
Figure 2:
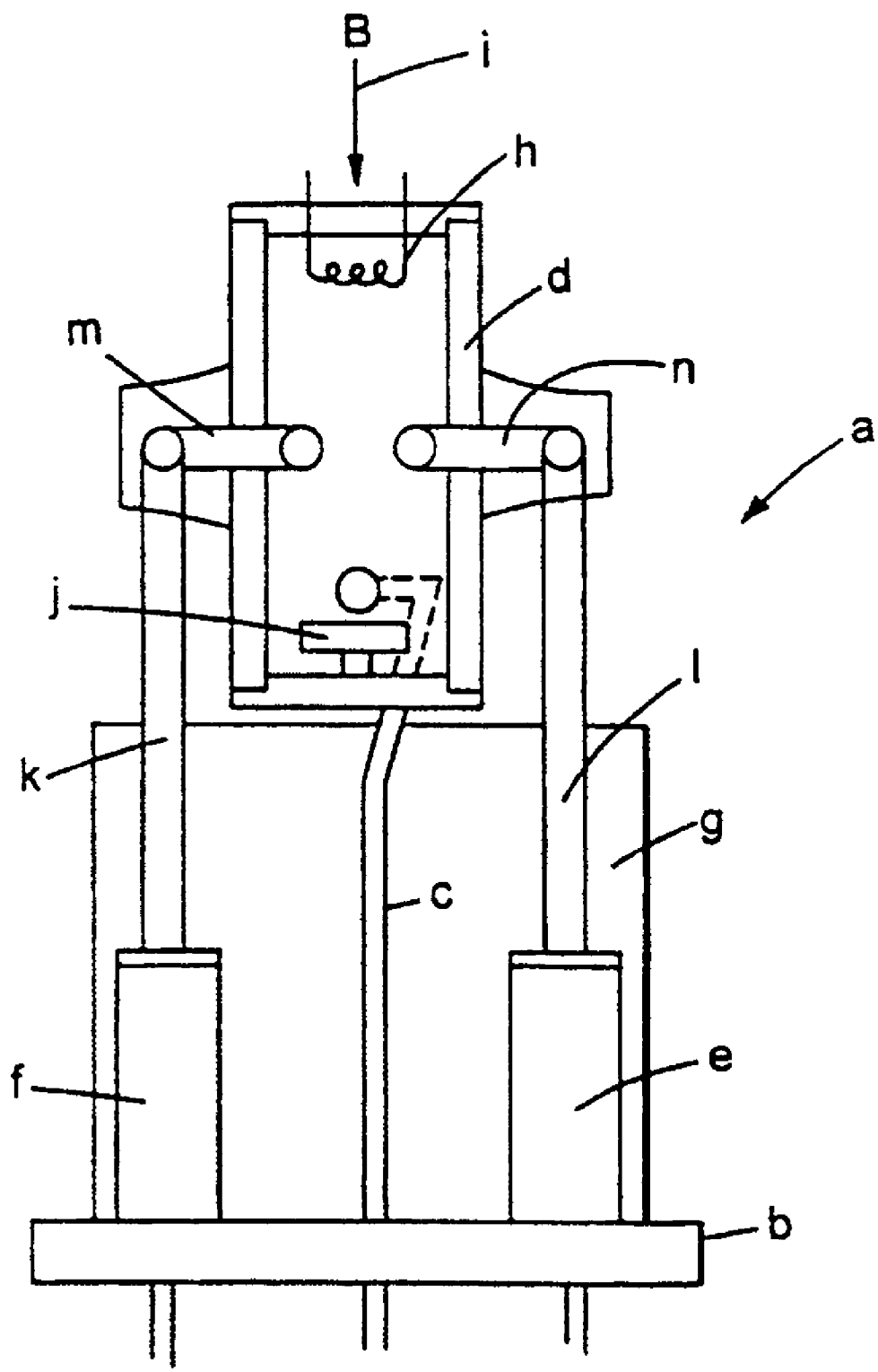
FIG. 2 is a diagrammatic cross-sectional view of a Bernas arc discharge ion source, illustrative of the ion source for which the implanter of FIG. 1 was designed.
Figure 3:
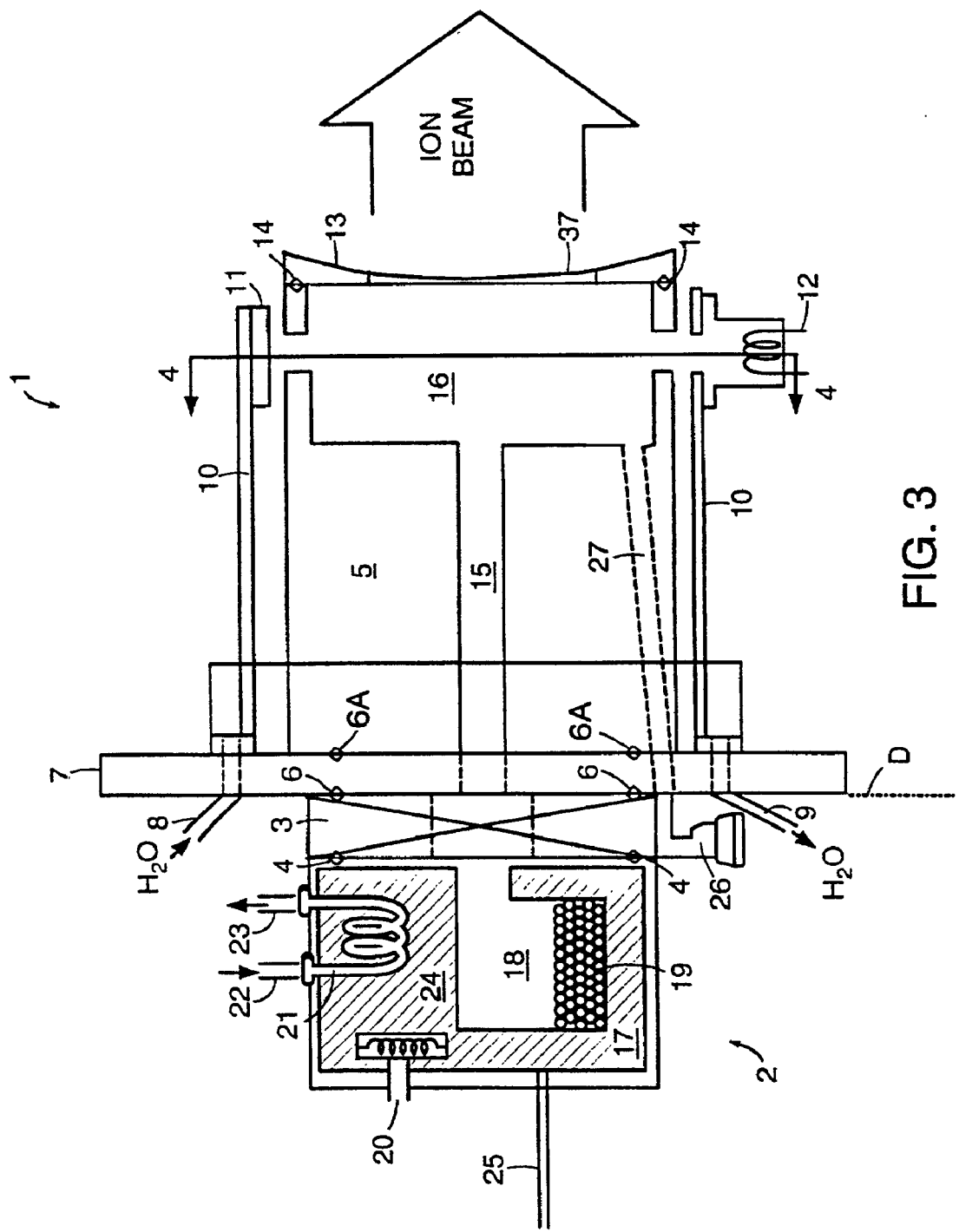
FIG. 3 is a longitudinal cross-sectional view of an embodiment of the ion source of the present invention with associated vaporizer.

FIG. 3 shows in schematic an embodiment of ion source 1. The vaporizer 2 is attached to the vaporizer valve 3 through an annular thermally conductive gasket 4. The vaporizer valve 3 is likewise attached to the mounting flange 7, and the mounting flange 7 is attached to ionization chamber body 5 by further annular thermally conductive gaskets 6 and 6A. This ensures good thermal conduction between the vaporizer, vaporizer valve, and ionization chamber body 5 through intimate contact via thermally conductive elements. The mounting flange 7 attached to the ionization chamber 5, e.g., allows mounting of the ion source 1 to the vacuum housing of an ion implanter, (see FIG. 8) and contains electrical feedthroughs (not shown) to power the ion source, and water-cooling feedthroughs 8, 9 for cooling. In this preferred embodiment, water feedthroughs 8, 9 circulate water through the cooled mounting frame 10 to cool the mounting frame 10 which in turn cools the attached components, the electron beam dump 11 and electron gun 12. The exit aperture plate 13 is mounted to the face of the ionization chamber body 5 by metal screws (not shown). Thermal conduction of the ion exit aperture plate 13 to the ionization chamber body 5 is aided by conductive annular seal 14 of metal or a thermally conductive polymer.

When the vaporizer valve 3 is in the open position, vaporized gases from the vaporizer 2 can flow through the vaporizer valve 3 to inlet channel 15 into the open volume of the ionization chamber 16. These gases are ionized by interaction with the electron beam transported from the electron gun 12 to the electron beam dump 11. The ions produced in the open volume can then exit the ion source from the exit aperture 37, where they are collected and transported by the ion optics of the ion implanter.

The body of vaporizer 2 is made of machined aluminum, and houses a water bath 17 which surrounds a crucible 18 containing a solid feed material such as decaborane 19 The water bath 17 is heated by a resistive heater plate 20 and cooled by a heat exchanger coil 21 to keep the water bath at the desired temperature. The heat exchanger coil 21 is cooled by de-ionized water provided by water inlet 22 and water outlet 23. The temperature difference between the heating and cooling elements provides convective mixing of the water, and a magnetic paddle stirrer 24 continuously stirs the water bath 17 while the vaporizer is in operation. A thermocouple 25 continually monitors the temperature of the crucible 18 to provide temperature readback for a PID) vaporizer temperature controller (not shown). The ionization chamber body 5 is made of aluminum, graphite, silicon carbide, or molybdenum, and operates near the temperature of the vaporizer 2 through thermal conduction. In addition to low-temperature vaporized solids, the ion source can receive gases through gas feed 26, which feeds directly into the open volume of the ionization chamber 16 by an inlet channel 27. Feed gases provided through channel 27 for the ion implantation of semiconductors include $AsH_3$, $PH_3$, $SbF_5$, $BF_3$, $CO_2$, Ar, $N_2$, $SiF_4$, and $GeF_4$, and with important advantages $GeH_4$, $SiH_4$, and $B_2H_6$, described below. When the gas feed 26 is used to input feed gases, the vaporizer valve 3 is closed. In the case of a number of these gases, the broad beam electron ionization of the present invention produces a mid-to-low ion current, useful for mid-to-low dose implantations. For higher doses, an embodiment capable of switching mode to a reflex geometry, with magnetic field, can be employed.

Figure 3A:
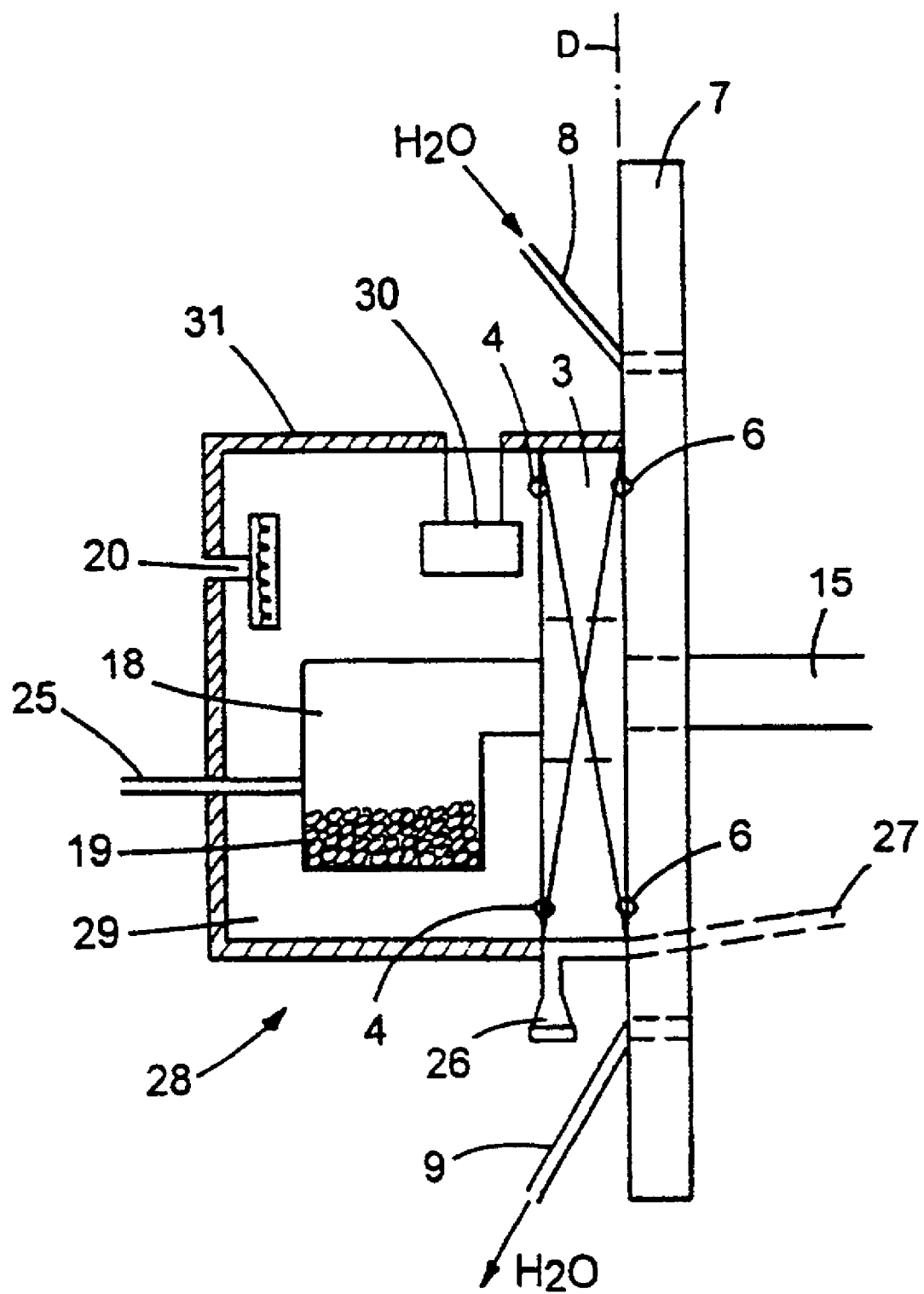
FIG. 3A is a cross-sectional view, similar to a part of FIG. 3, showing another embodiment of a vaporizer.
Figure 3B:
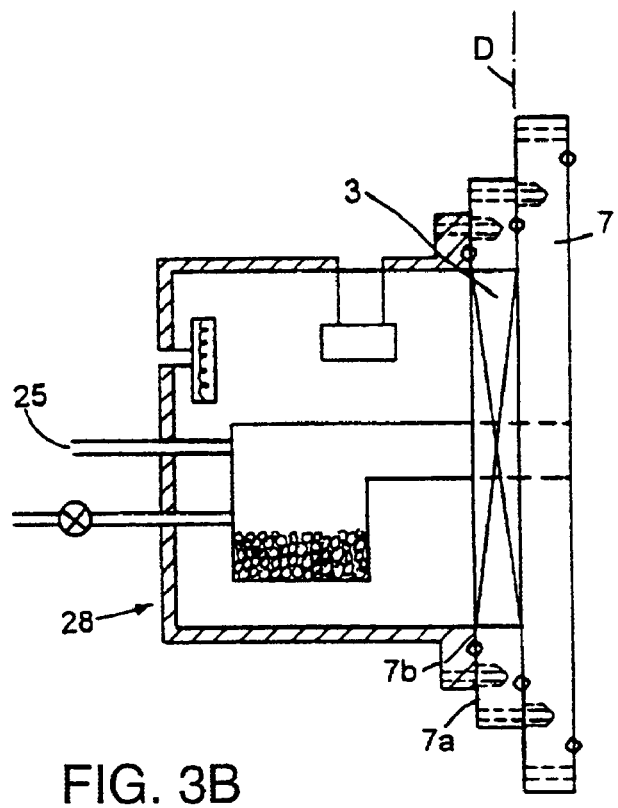
Figure 3C:
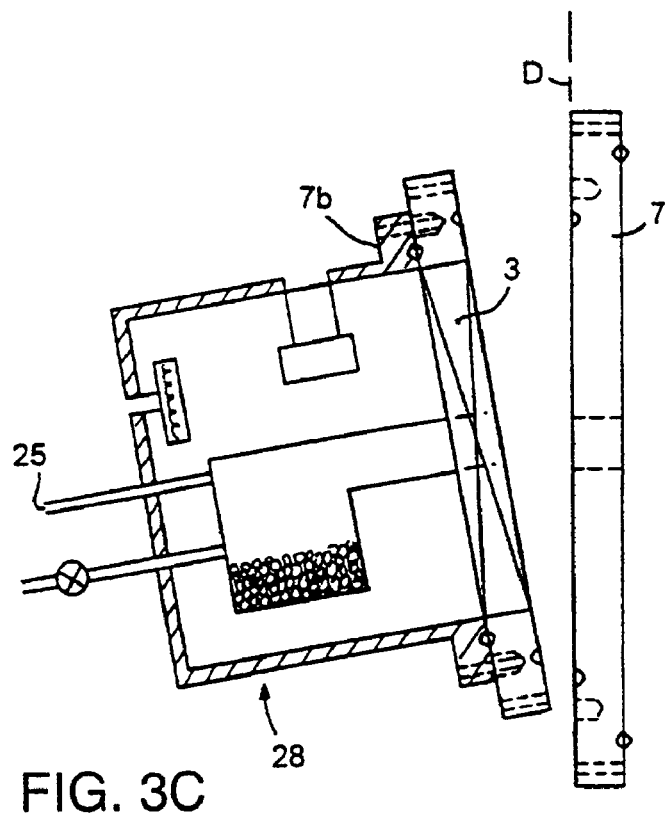
FIG. 3C illustrates detaching the vaporizer and valve from the ion source.

The vaporizer 2 of FIG. 3, or that of FIG. 3A to be described, can be demounted from the ion source 1 by closing the vaporizer valve 3 and removing the unit at seal 6, (parting line D), compare FIGS. 3B and 3C. This is useful for recharging the solid feed material in the crucible 18, and for maintenance activities.

Figure 3D:
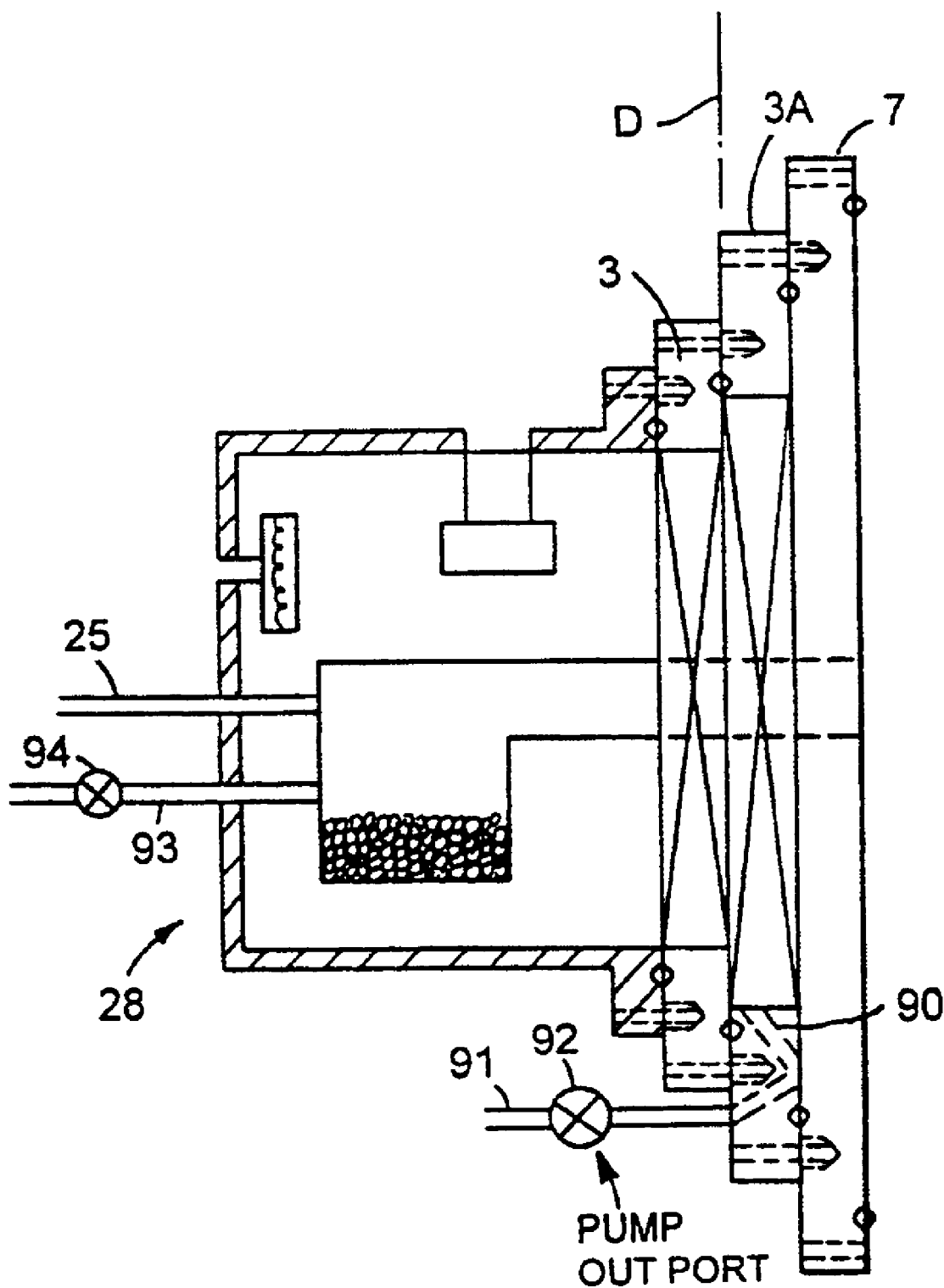
FIG. 3D illustrates a two-valve embodiment in which separation of the vaporizer from the ion source can occur between the two valves.

In the embodiment of FIG. 3D, two valves, 3 and 3A are provided in series, valve 3 being permanently associated, as before, with removable vaporizer 28 and valve 3A being permanently associated with mounting flange 7, with the demounting plane D disposed between the two valves.

In the embodiment of the ion source shown in FIG. 3A, the vaporizer 28 is of a different design from that of FIG. 3, while the rest of the ion source is the same as in FIG. 3. In vaporizer 28, there is no water bath or water-fed heat exchanger. Instead, the volume occupied by water bath 17 in FIG. 3 is occupied by the machined aluminum body 29 of vaporizer 28. A resistive heater plate 20 is in direct thermal contact with the vaporizer body 29 to conductively heat the body 29, and a thermoelectric (TE) cooler 30 is in direct thermal contact with the vaporizer body 29 to provide conductive cooling. A thermally insulating sleeve 31 surrounds the vaporizer 28 to thermally insulate the vaporizer from ambient temperature. If desired, several heater plates 20 and TE coolers 30 can be distributed within the vaporizer body 29 to provide more conductive heating and cooling power, and also to provide a more spatially uniform temperature to the crucible. This construction permits the vaporizer to operate at temperatures in excess of 100 C, up to about 200 C.

FIGS. 3B illustrates an embodiment in which successive mounting flanges of the series of vaporizer 28, isolation valve 3 and the ion source 1, are of increasing size, enabling access to each flange for detachment. Mounting flange 70 enables bolt-on of the assembled ion source to the ion source housing, see e.g. FIG. 8. Mounting Flange 7a enables attachment and detachment of the vaporizer 28 and its associated valve 3 from flange 7 at parting line D, see FIG. 3C. Mounting Flange 7b enables detachment of the valve 3 from the main body of the vaporizer for maintenance or recharging the vaporizer.

The embodiment of FIG. 3D has two valves 3 and 3a, valve 3 normally staying attached to the vaporizer and valve 3a normally attached to ion source mounting flange 7. These enable isolation of both the vaporizer 28 and the ion source 1 before demounting the vaporizer at parting line D. The body of mated valve 3a includes roughing passage 90 connected by valve 92 to roughing conduit 91 by which the space between the valves may be evacuated, and, upon opening valve 3, by which the vaporizer may be evacuated prior to opening valve 3a. Thus attachment of vaporizer 28 need not adversely affect the vacuum being maintained in the ion source and beam line.

The vent line 93, and associated valve 94 enables relief of vacuum within the vaporizer prior to performing maintenance and as well may be used to evacuate and outgas the vaporizer after recharging, to condition it for use.

Figure 3E:
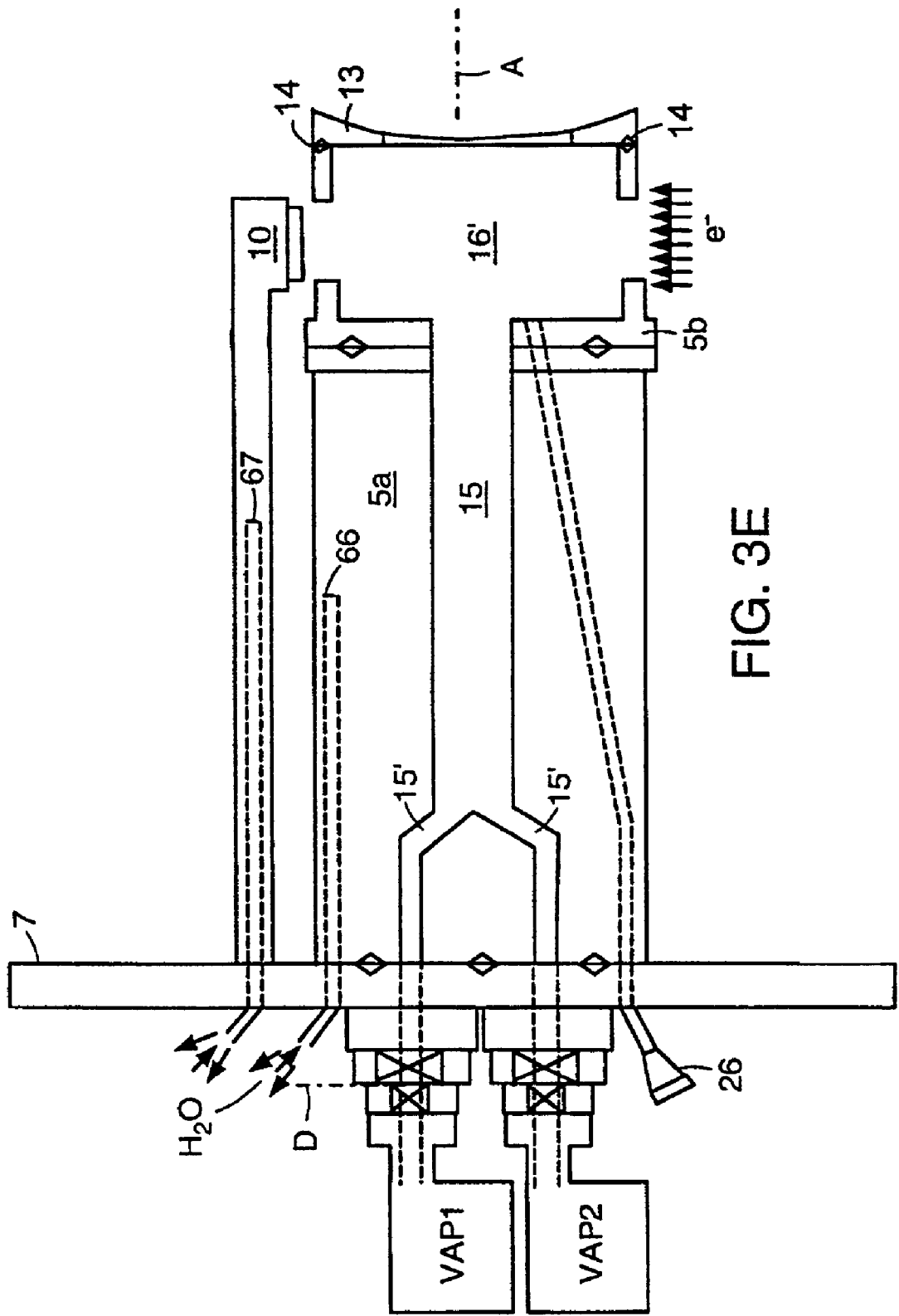
FIG. 3E illustrates a dual vaporizer embodiment.

The embodiment of FIG. 3E illustrates a dual vaporizer construction, having the capabilities previously described. The vapor passage 15 in metal block heat sink 5a bifurcates near mounting flange 7, the branches 15' leading to respective demountable vaporizers VAP 1 and VAP 2, each having two isolation valves separable at parting line D. As more fully described with respect to FIG. 9B, the ionization chamber body 5b is of discrete construction, demountably mounted in intimate heat transfer relationship to temperature controlled mounting block 5a.

Separate coolant passage 66 and 67 telescopically receive so-called squirt tubes which centrally conduct cold, deionized water to the dead end of the passage. The emerging cooled water has its maximum effect at that point, in the outward regions of respectively the mounting block 5a and the cooled frame 10, the water returns through the annular space defined between the exterior of the squirt tube and the passage in which the tube resides.

Figure 3F:
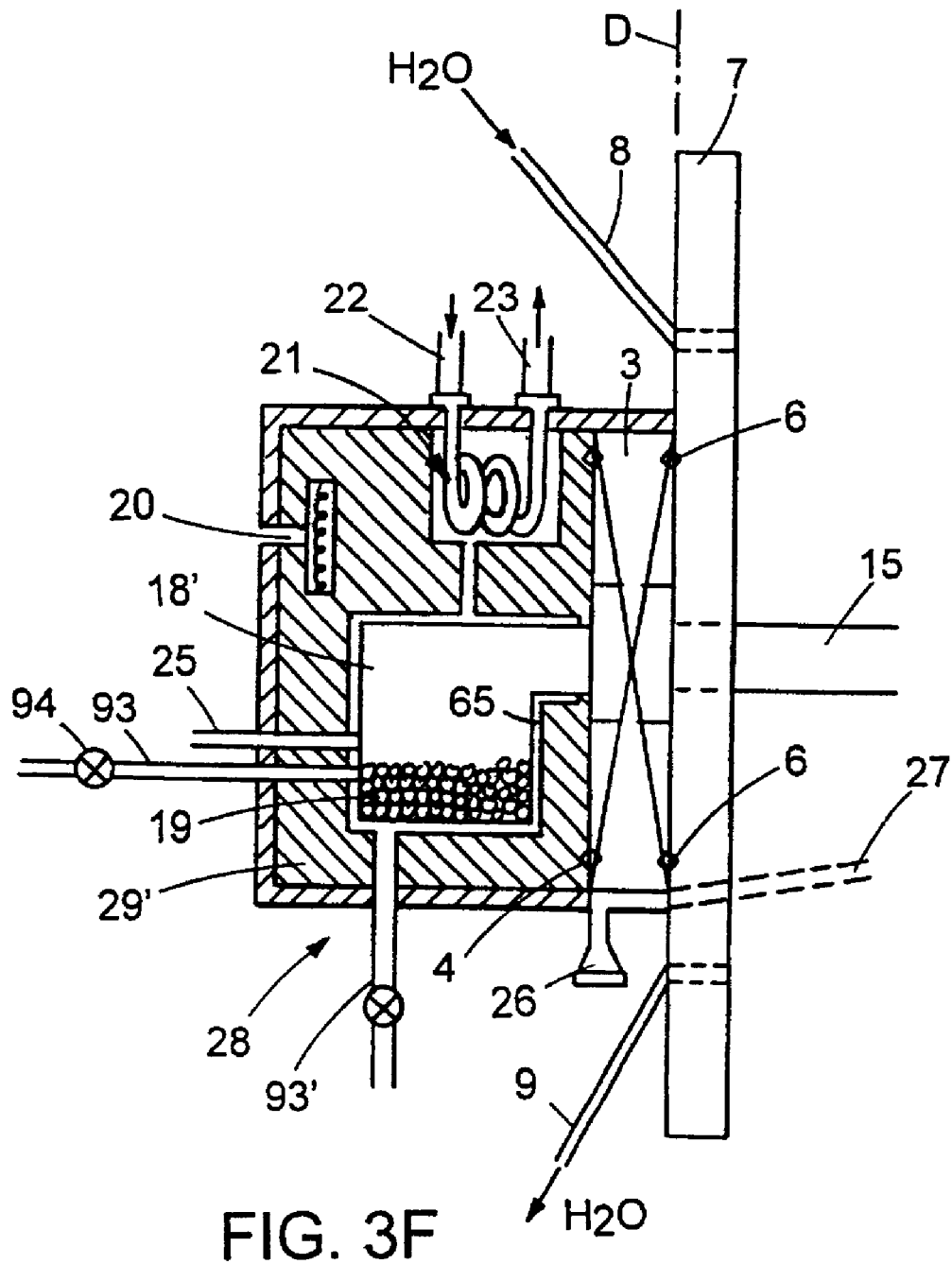
FIG. 3F shows another embodiment of a vaporizer similar to FIG. 3A, but with a separate crucible and with gas-mediated conduction between vaporizer housing and crucible, and between a heat exchanger and the housing.

FIG. 3F shows a vaporizer similar to that of FIG. 3A, but instead of a one-piece aluminum construction, the body of the vaporizer has two mating, but separate components: a vaporizer housing $29^1$ and a crucible $18^1$. The crucible is inserted into the housing $29^1$ with a close mechanical fit. The surface of the vaporizer housing which makes contact with the crucible contains a pattern of rectangular grooves, into which pressurized gas (typically at subatmospheric pressure) is introduced through gas inlet $93^1$. The pressurized gas provides sufficient thermal conductivity between the crucible $18^1$ and the temperature-controlled housing $29^1$ to control the temperature of the crucible surface 65 in contact with decaborane or other solid feed material 19 to be vaporized. This embodiment allows the crucible $18^1$ to be easily replaced during service of the vaporizer. Gas is also fed into the volume surrounding heat exchanger 21, to promote thermal conduction between the heat exchanger 21 and the housing $29^1$. The heat exchanger 21 is shown as a water-fed coil, but may alternatively comprise a TE cooler, such as cooler 30 in FIG. 3A.

Figure 4A:
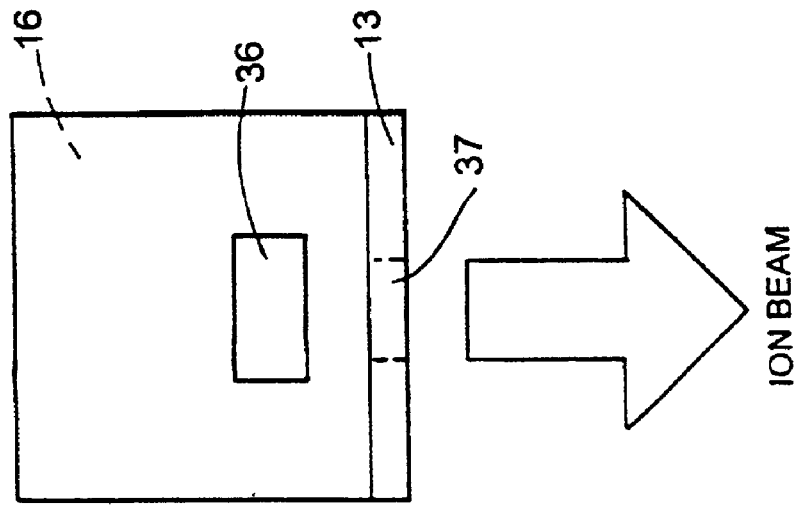
FIG. 4A is a top view taken on line 4A—4A of FIG. 4.
Figure 4:
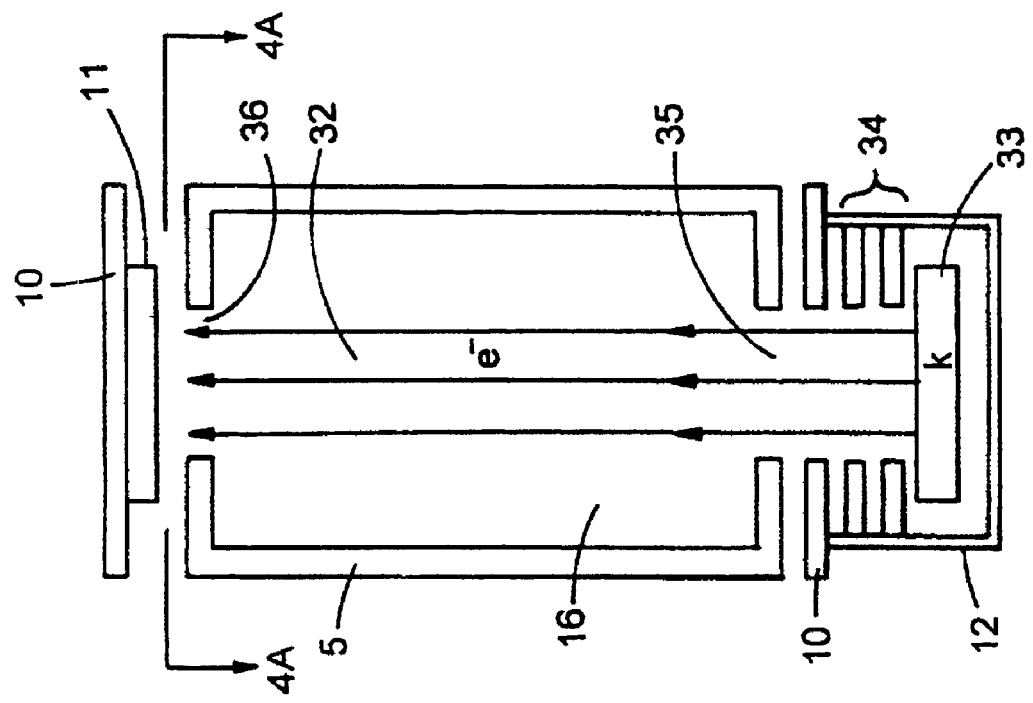

Referring to FIG. 4, in operation of the ion source 1, an electron beam 32 is emitted from the cathode 33 and focused by the electron optics 34 to form a broad, collimated beam, consisting of dispersed electrons (preferably generally uniformly dispersed). The electron beam is wider perpendicular to the ion beam axis than it is along that axis. FIG. 4 illustrates the geometry of the ion source with the exit aperture plate 13 removed; the ion beam axis points out of the plane of the paper, see FIG. 4A. The distribution of ions created by neutral gas interaction with the electron beam corresponds generally to the defined profile of the electron beam.

Figure 5:
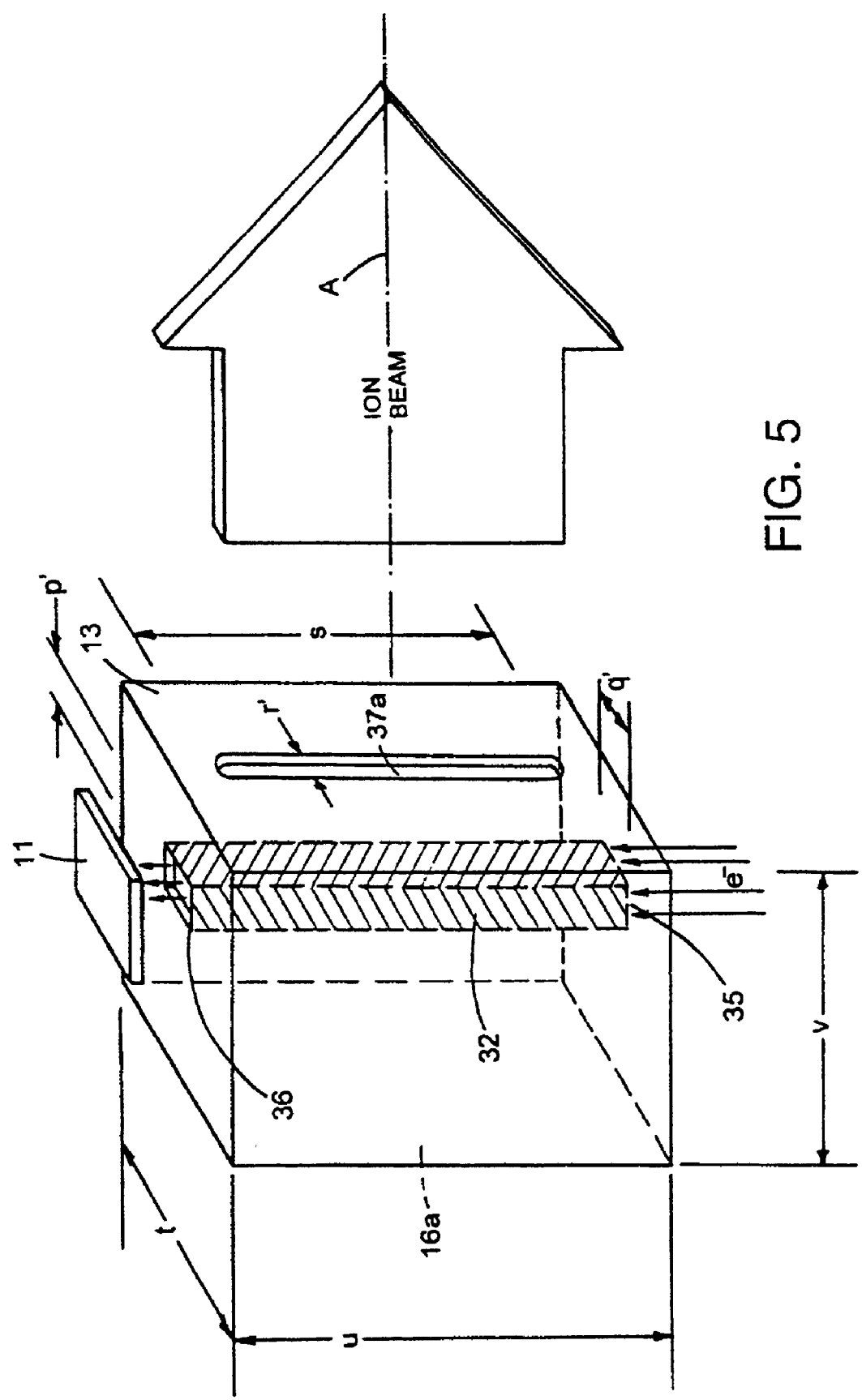
FIG. 5 is a view similar to FIG. 4F of the relationship of a broad electron beam and ion extraction aperture of narrower dimension.
Figure 6:
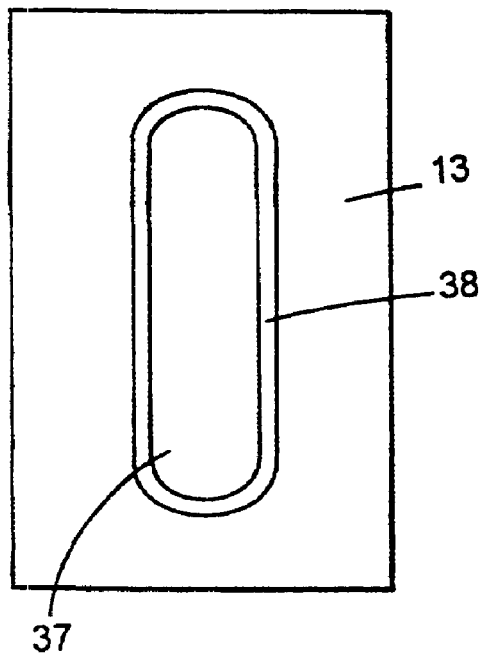
FIG. 6 is a front view of the aperture plate of the ion source of FIG. 3.

The electron beam passes through a rectangular entrance port 35 in the ionization chamber and interacts with the neutral gas within the open volume 16, defined within the ionization chamber body 5. The beam then passes directly through a rectangular exit port 36 in the ionization chamber and is intercepted by the beam dump 11, which is mounted on the water-cooled mounting frame 10. Beam dump 11 is maintained at a positive potential relative to the electron gun, and preferably slightly positive relative to the walls of the ionization chamber as well. Since the heat load generated by the hot cathode 33 and the heat load generated by impact of the electron beam 32 with the beam dump 11 is substantial, their location outside of the ionization chamber open volume 16 prevents their causing dissociation of the neutral gas molecules and ions. The only heat load from these elements to the ionization chamber is limited to modest radiation, so the ionization chamber can be effectively cooled by thermal conduction to the vaporizer 2 (FIG. 3) or by conduction to a massive mounting block 5a (FIGS. 3E, 9B). Thus, the general walls of the ionization chamber can be reliably maintained at a temperature below the dissociation temperature of the neutral gas molecules and ions. For decaborane, this dissociation temperature is about 350 C. Since the ion exit aperture 37 in plate 13, shown in FIGS. 4B, 5 and 6, is a generally rectangular aperture, the distribution of ions created adjacent to the aperture by the broad, collimated beam of generally uniformly dispersed electrons should be likewise uniform. In the ionization of decaborane and other large molecules, according to this embodiment, an arc plasma is not sustained, but rather the gas is ionized by direct electron-impact ionization by the primary (energetic) electrons, in the absence of containment by any major confining magnetic field. The absence of such magnetic field limits the charge-exchange interactions between the ions and relatively cool secondary electrons as they are not strongly confined as they are in an arc plasma (confined secondary electrons can cause loss of the ions of interest through multiple ionizations). The decaborane ions are generated in the widely distributed electron beam path. This reduces the local ion density relative to other conventional ion sources known in the art.

The absence of magnetic field can improve the emittance of the extracted ion beam, particularly at low (e.g., 5 keV) extraction energy. The absence of an arc plasma as in a Bernas source also can improve emittance since there is no plasma potential present in the ionization and extraction region. (I recognize that the presence of an arc plasma potential in conventional plasma-based ion sources introduces a significant random energy component to the ions prior to being extracted, which translates directly into an added angular spread in the extracted ion beam. The maximum angular spread $\theta$ due to a plasma potential $\phi$ is given by: $\theta = \sqrt{2} \arcsin \{\phi/E\}^{1/2}$, where E is the beam energy. For example, for a plasma potential of 5 eV and a beam energy of 5 keV, $\theta = 2.5$ deg. In contrast, the random energy of ions produced by direct electron-impact ionization is generally thermal, much less than 1 eV.)

FIG. 4A shows a top view of the electron exit port 36 in the open volume 16 of ionization chamber body 5, and its proximity to the ion exit aperture 37 in aperture plate 13. To enable the ions to be removed from the ionization chamber by penetration of an electrostatic extraction field outside of the ion source 1 through the ion exit aperture 37, the electron beam 32 and electron exit port 36 are situated close to the exit aperture plate 13 and its aperture 37. For example, a separation of between 6 mm and 9 mm between the edge of the ionization region and the ion extraction aperture can result in good ion extraction efficiency, the efficiency improving with larger width extraction apertures. Depending upon the particular parameters chosen, the broad, collimated electron beam 32 may not fully retain its rectangular profile due to scattering, and also due to space charge forces within the electron beam 32. The electron exit port 36 is sized appropriately in accordance with such design choices to allow passage of the electron beam without significant interception by the general walls of the ionization chamber body 5. Thus, in certain advantageous instances, port 36 is larger than port 35 so that it is aligned to receive and pass at least most of the residual electron beam.

The embodiment of FIG. 4B illustrates a discretely defined beam dump 11' which is sized and shaped to fit within port 36' such that its inner, electron receiving surface lies flush with the inner surface of the surrounding end wall of the chamber body 5. Beam dump 11' is mounted upon and is cooled by cooled frame 10, as before. As shown, a clearance space c, e.g., of 1 mm, is maintained between the beam dump structure and the wall of the chamber. Preferably, as shown, the structures are cooperatively shaped as in a labyrinth $L_s$ to limit the outflow of the dopant gas or vapor, while maintaining thermal and electrical isolation of the dump structure 11' from the walls of the ionization chamber, maintaining electrical isolation of the beam dump 11' while preventing loss of dopant gas or vapor.

In the embodiment of FIG. 4C electrical insulation Z fills the space between the beam dump and the wall of the ionization chamber, maintaining electrical isolation of the beam dump 11' while preventing loss of dopant gas or vapor.

Figure 4E:
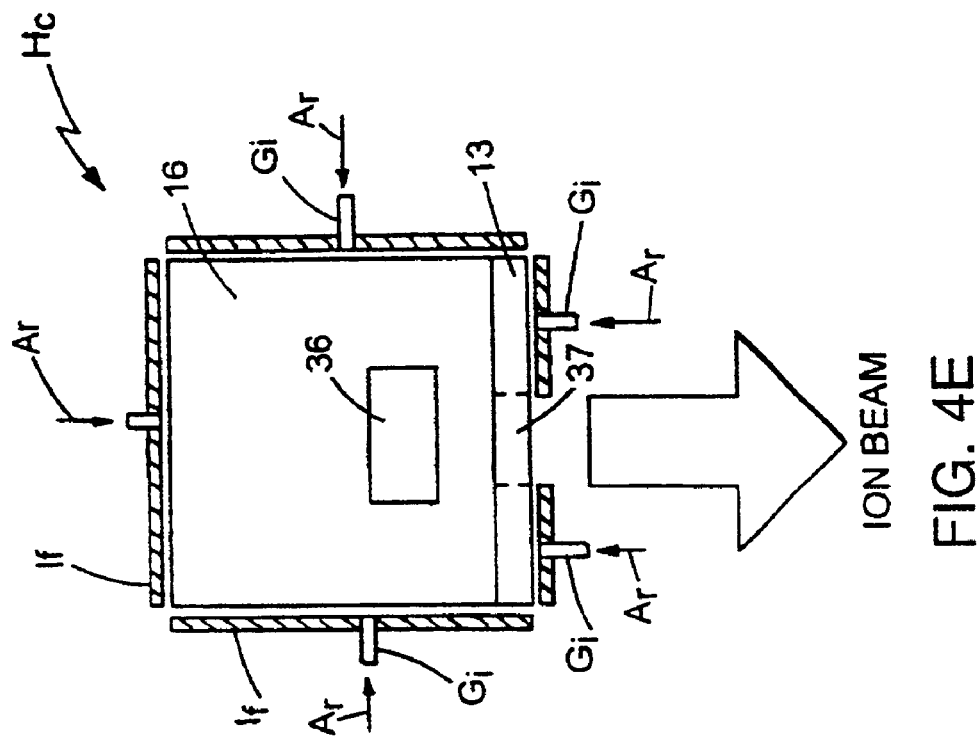
FIGS. 4D and 4E, side and top views similar respectively to FIGS. 4 and 4A, show a conductively cooled ionization chamber assembly having a disposable inner ionization chamber.
Figure 4D:
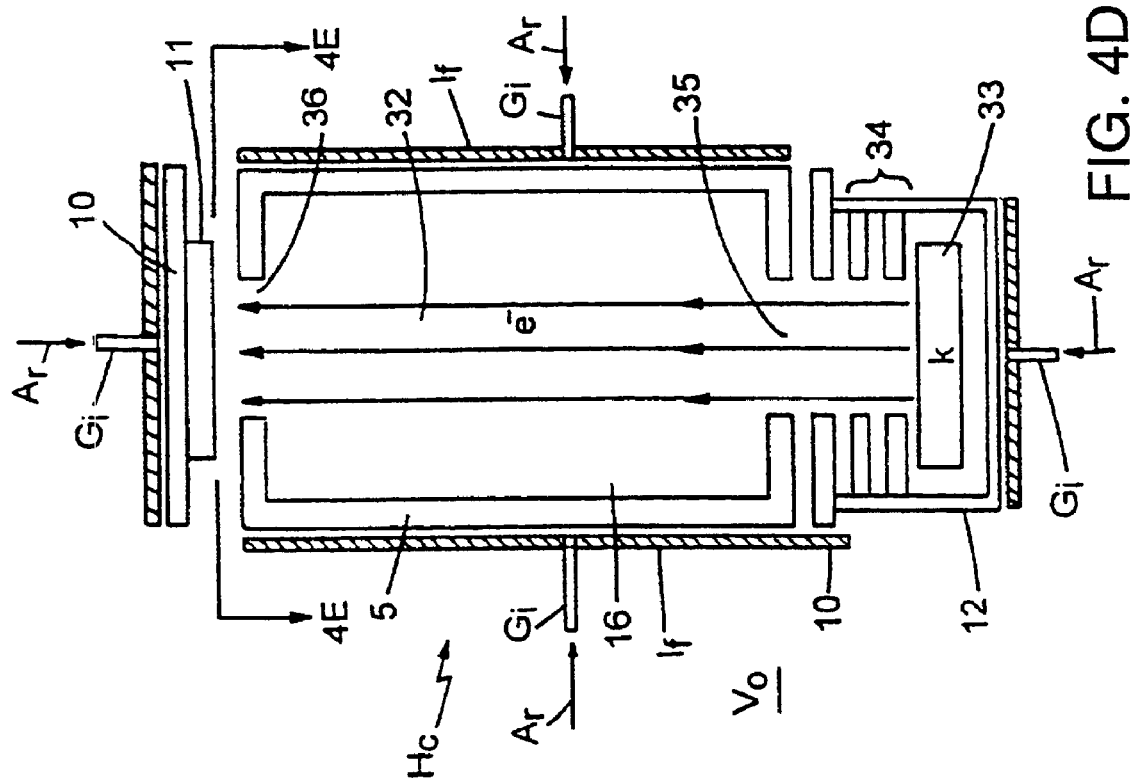

Referring to FIGS. 4D and 4E, a thermoelectrically or water-cooled outer housing $H_c$ defines a space into which a chamber-defining member 5c of heat-conductive and electrically-conductive material is removably inserted with close operational fit. Gas inlets $G_i$ introduce conductive gas of a subatmospheric pressure (e.g., between 0.5 and 5 Torr), that is significantly higher than that of the operational vacuum $V_o$ within the overall ion source housing 49 which contains the ionization chamber assembly. The conductive gas (for example, $N_2$, Ar, or He) is introduced to the interface $I_f$ between matching surfaces of the housing and the chamber in regions remote from exposure of the interface to operational vacuum $V_o$, and isolated from the vaporizer and process gas feed lines. In a preferred embodiment, the cooling gas is fed through an aluminum block or cooled housing and exits between the demountable ionization chamber and the block or housing, at the interface between them, into cooling channels machined into the aluminum block. The cooling channels have the form of linear grooves (e.g., 1 mm wide by 0.1 mm deep) which populate a significant percentage of the surface area between the two mating components. This construction allows the flat mating surfaces (the grooved aluminum surface and the flat surface of the separate ionization chamber) of the two components to mate flush with one another. Simple elastomeric o-rings encompass the surface area which contains the cooling channel grooves, ensuring that the gas confined to the cooling channels is isolated from regions which contain feedthroughs and passages for process gas or vapor within this interface, and also isolates the cooling gas from the ionization volume and from the vacuum housing. The spacing between those surfaces and the pressure of the conductive gas in the interface are so related that the mean-free path of the conductive gas molecules is of the order of or less than the spacing of opposed surface portions at the interface.

The conductive gas molecules, by thermal motion, conduct heat across the interface from the chamber wall to the surrounding cooled housing elements. Any regions of actual physical contact between the solid material of the chamber body and of an outer housing element likewise promotes cooling by conduction. It is to be noted that the mode of conductive gas cooling described here does not depend upon convectional gas flow, but only upon the presence in the interface of the gas molecules. Therefore, in some embodiments, it may be preferred to form seals at the interface to capture the gas, as discussed above, although in other embodiments exposure of the interface at edges of the assembly with leakage to the operational vacuum $V_o$ can be tolerated just as is the case with respect to cooling of semiconductor wafers as described, e.g., in the King U.S. Pat. No. 4,261,762.

In other embodiments, the cooling housing of the ionization chamber assembly or similar side wall elements of other structures of the ion source are water-cooled in the manner of cooling the mounting frame 10 as described herein. In some embodiments, depending upon the heat load on the ionization chamber, the heat conduction resulting from the inclusion of thermally conductive gasket seals, as well as regions of physical point contact between the matching surfaces of the chamber and housing elements is sufficient to keep the chamber within the desired temperature range, and the conductive gas-cooling feature described is not employed.

It is recognized that the heat-transfer relationships described here have general applicability throughout the ion source and the other structural components of the implanter as well. Thus, the temperature of the vaporizer may be controlled by the heat transfer from a disposable crucible to surrounding elements via gas conduction at an interface, for operating conditions which require less than, for example, 2W/cm² of heat transfer through the gas interface. Likewise, surfaces of the electron gun, the electron beam dump, the mounting frame and the aperture plate may serve as conductors via a conductive gas interface to temperature-control elements such as the thermoelectrically or water-cooled housing that has been described, as illustrated in FIG. 4E.

Figure 4F:
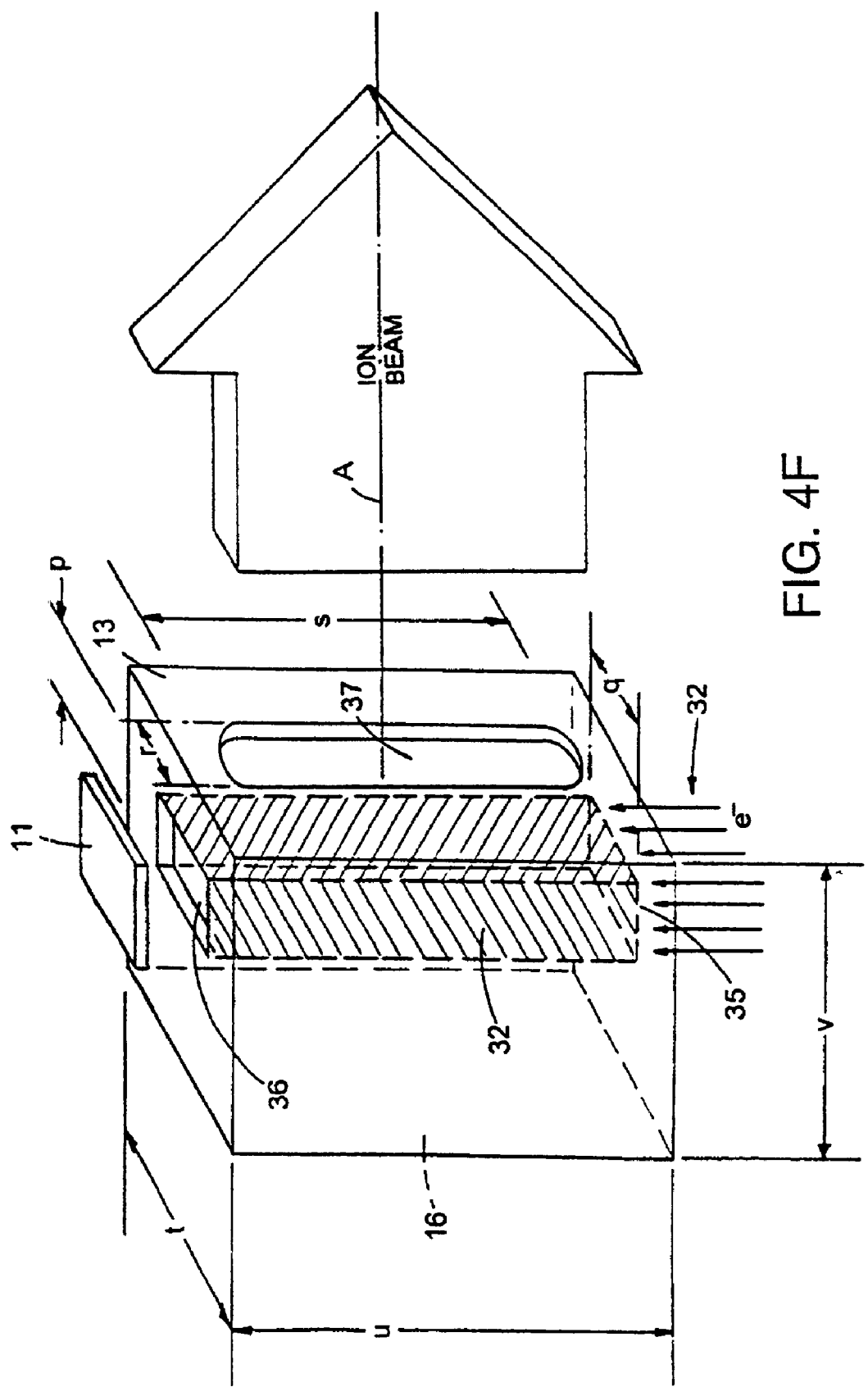
FIG. 4F is a three dimensional representation of a broad, collimated electron beam and its relation to the ion extraction aperture of the embodiment of FIGS. 3 and 4.

FIGS. 4F and 5 show different sizes of a broad, collimated electron beam passing through the ionization chamber, the profiles of these beams matched in profile to the wide and narrower apertures of the respective ionization chambers of FIGS. 4F and 5.

FIG. 6 shows the ion exit aperture plate 13 with the axis of the ion beam directed normal to the plane of the paper. The dimensions of the exit aperture plate conform to the dimensions of the ionization chamber within body 5, approximately 7.6 cm tall×5.1 cm wide. The exit aperture plate contains an opening 37 which is approximately 5.1 cm in height, s, by 1.3 cm wide, r, suitable for high current implanters, and has a bevel 38 to reduce strong electric fields at its edges. It is matched by a broad, collimated electron beam having width g of 19 mm and depth p of 6 mm, cross-sectional area of 114 square mm. The aperture of the embodiment of FIG. 5, has similar features but a much narrower width, e.g. a width $r^1$, 4 mm, matched by an electron beam of width $g^1$ 6 mm and a depth $p^1$ of 6 mm.

Figure 7:
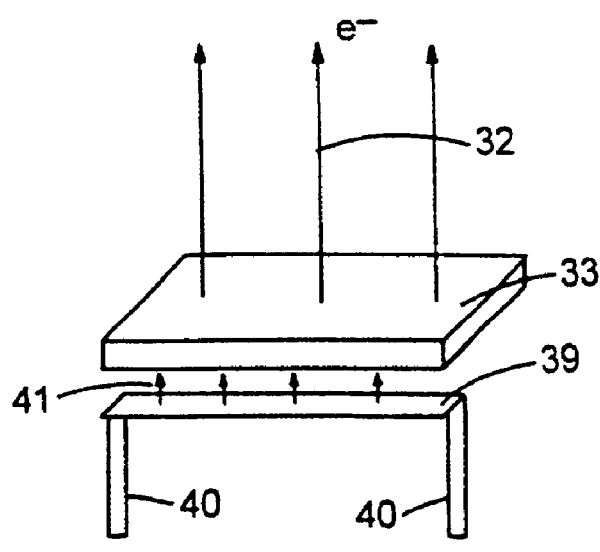
FIG. 7 is an illustration of an indirectly heated cathode arrangement.

FIG. 7 shows the shape of the cathode 33, or electron emitter. In a preferred embodiment, it defines a planar emitting surface, it's dimensions being roughly 15 mm long×9 mm×3 mm thick. It can be directly heated by passing an electric current through it, or it can be indirectly heated, as shown, with an electric current flowing through filament 39 via leads 40, heating it to emit thermionic electrons 41. By biasing the filament 39 to a voltage several hundred volts below the potential of cathode 33, thermionic electrons 41 heat the cathode 33 by energetic electron bombardment, as is known in the art.

Figure 8:
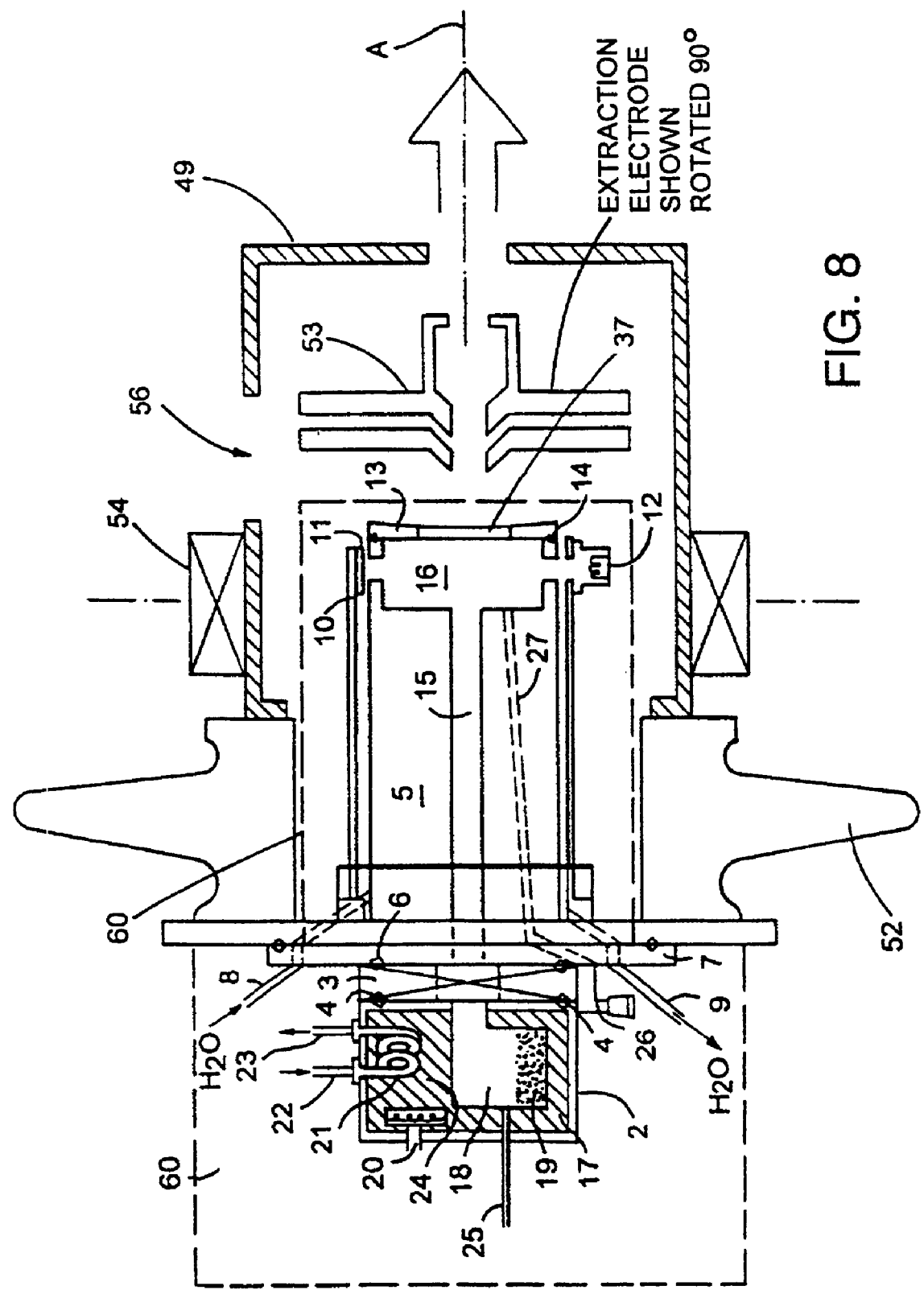
Figure 8A:
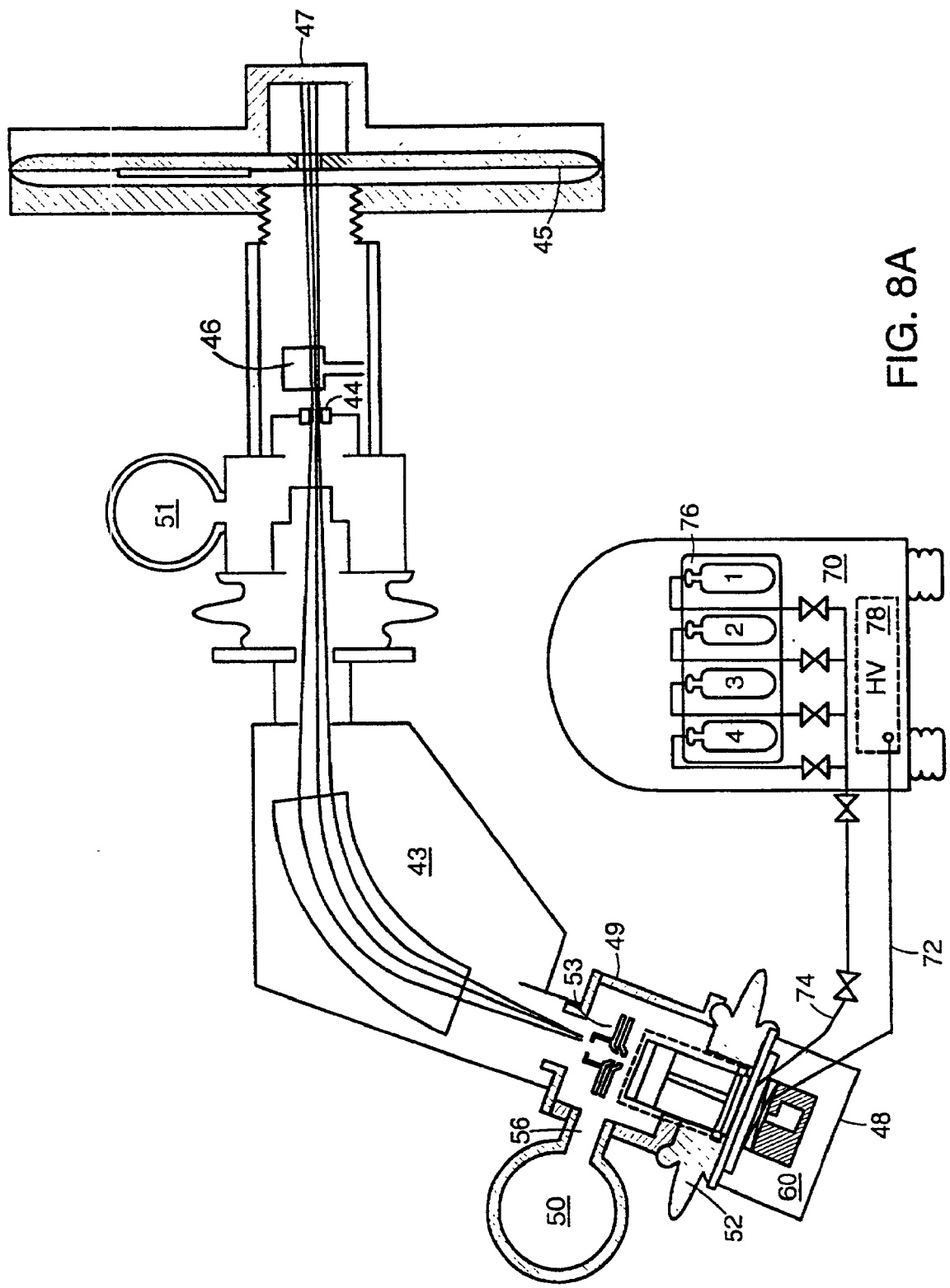
FIG. 8A illustrates, on a smaller scale, the entire implanter of FIG. 8.

FIG. 8 illustrates the assembly of an ion source according to FIG. 3A into a retrofit volume 60 of a previously installed ion implanter while FIG. 8A illustrates the complete ion implanter.

In this particular embodiment nothing has been disturbed except that the Bernas ion source for which the implanter was originally designed has been removed and, into the vacated volume 60, the ion source of FIG. 3A has been installed, with its flange 7 bolted to the ion source housing flange. The extraction electrodes 53 remain in their original position, and the new ion source presents its aperture 37 in the same region as did the arc discharge Bernas source. The magnet coils 54 are shown remaining, available e.g., for operation in reflex mode if desired, or for applying a containment field for electrons proceeding to the beam dump 11.

Figure 9:
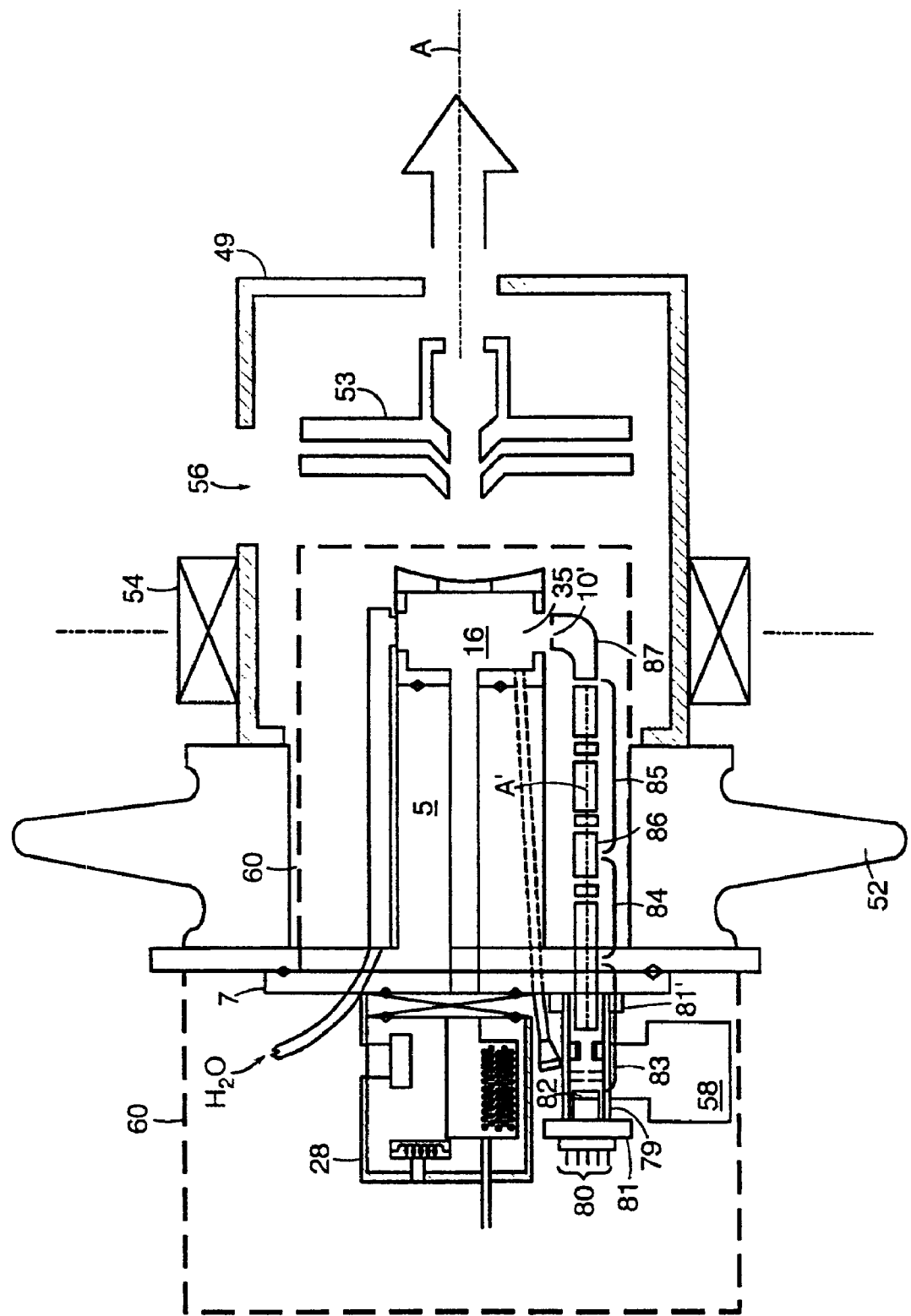

As shown in FIG. 9 the usual gas connections are made enabling dopant gases from sources 1, 2, 3, and 4 in the supply rack 76 of the gas box 70 to be connected via inlet conduit 74 and exhausted via conduit 72 to high vacuum system 78.

Lone E-Beam Gun Retrofit Embodiment

Referring to FIG. 9, an extended E-Beam gun is uniquely associated with an ionization chamber. The gun has zoom optics, and comprises the following components: extended housing 79, feedthroughs 80, mounting flanges 81 and 81', cathode 82, extraction stage 83, collimation lens 84, zoom lens 85, and turning stage 87 comprising a 90 degree mirror.

The long gun housing 79 lies along an axis A' parallel to the direction A of emission of the ion beam from the ion source, and within the retrofit space 60 of the previously installed implanter ion source. The housing extends from the feedthrough terminals 80, resident outside of the mounting flange 7 of the ion source, past a vacuum pump 58, terminating at mounting flange 81' and the main ion source mounting flange 7. The electron beam optics continue alongside the ion source block 5 to a point in registry with the electron inlet port 35 of the ionization volume 16.

The feedthroughs comprise appropriate fittings for the power and control lines for the cathode and other stages of the gun, and cooling water inlet and outlet for the housing, which is cooled, at least in the vicinity of the cathode. In an alternate embodiment, special cooling of the gun housing is not employed, the remoteness of the cathode, as shown in FIG. 9, ensuring that the ionization chamber 5 s not heated by the cathode, and any necessary cooling for protection of the vaporizer or operating personnel being achieved by conduction to water cooled mounting flanges or the like.

With significant cost and size efficiencies, the cathode 82 is of relatively small size in comparison to the profile dimension of the largest broad, aligned electron beam that is to transit the ionization volume 16. It is preferably a resistance-heated or indirectly heated, planar cathode emitter plate (such as plate 33 described above in connection with FIG. 7), made of lanthanum hexaboride (LaB$_6$) or of refractory metal such as tantalum or tungsten, to emit a generally uniform stream of electrons to the high voltage electron extraction stage.

Figure 9A:
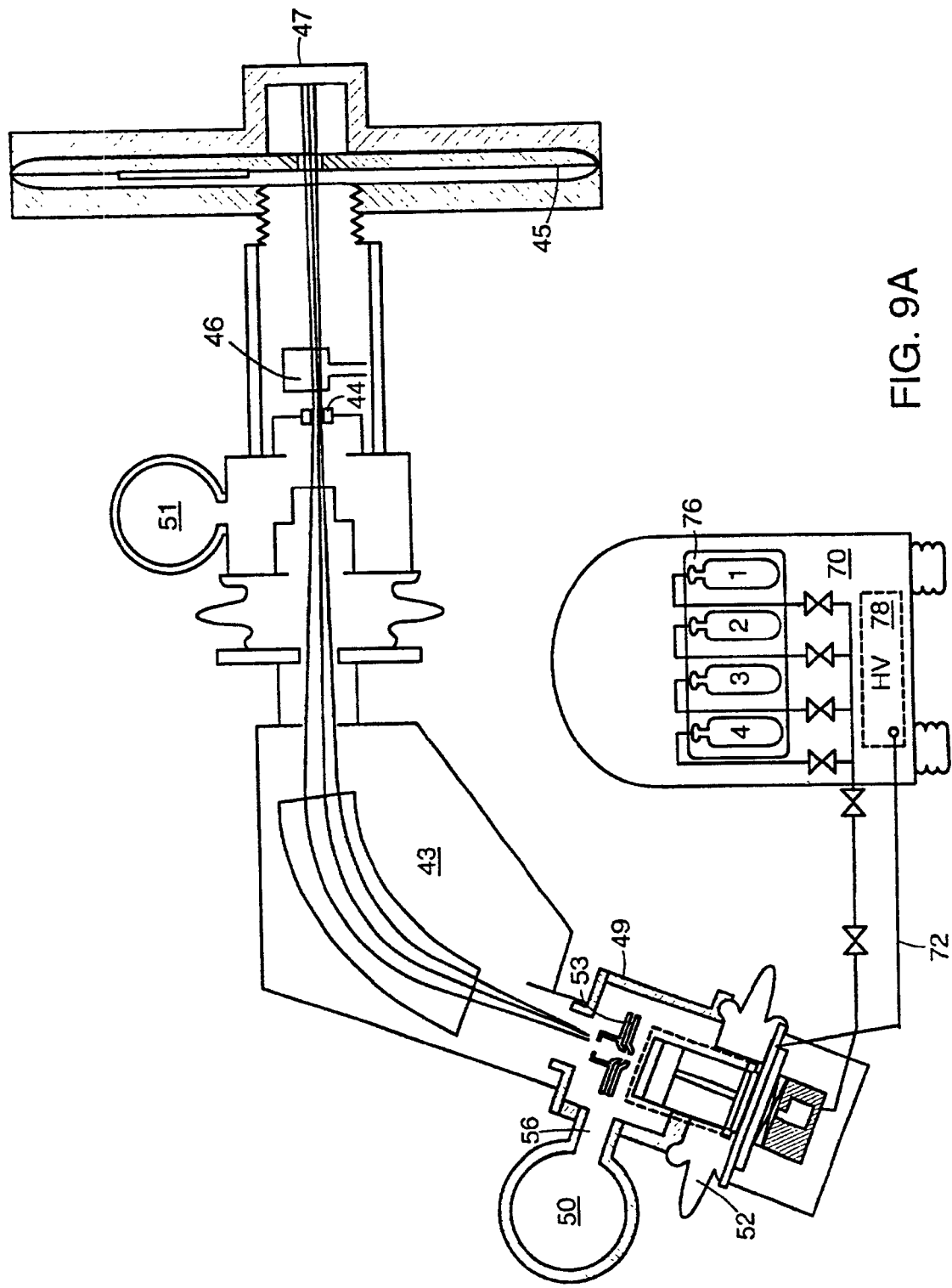
FIG. 9A illustrates the entire implanter into which the embodiment of FIG. 9 is retrofit.
Figure 9B:
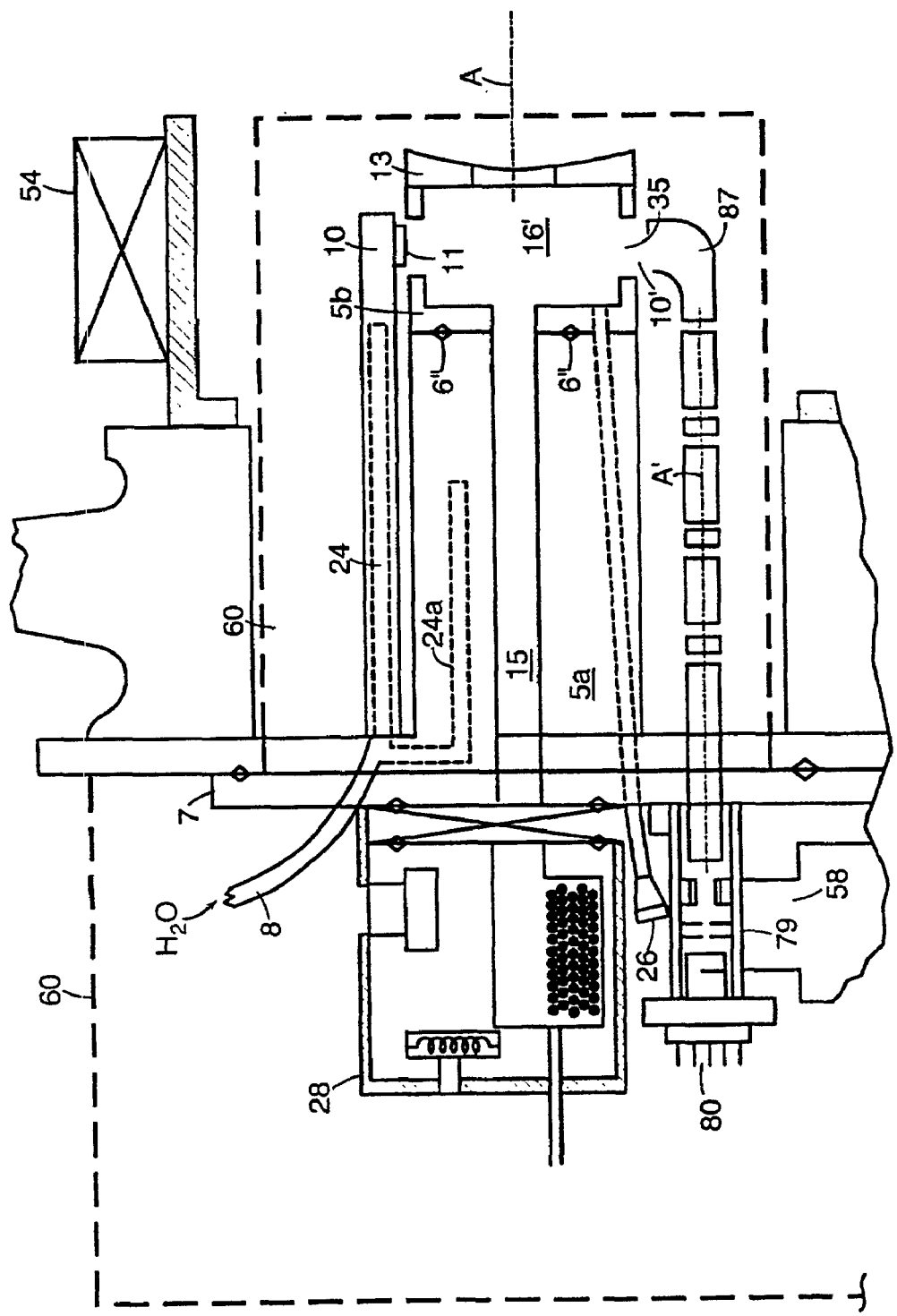
FIG. 9B is a view similar to a portion of FIG. 9 on an enlarged scale, illustrating a demountable ionizing chamber directly mounted upon a water-cooled block.

As shown in FIG. 9A the ion source of FIG. 9 is retrofit into vacated volume 60 of a previously installed ion implanter. The compact nature and arrangement of the ion source locates the prime heat source, the cathode, remotely from the ionization chamber 16 such that its heat does not contribute to disassociation of the fragile dopant molecules. In the case of FIGS. 9A and 9B, heat from the ionization chamber is conducted to the vaporizer and is controlled by its temperature control.

During operation, the vacuum pump 58 in the region of the cathode 82 intercepts back-streaming gas which has escaped from the ionization chamber 16 via the electron inlet port 35. This has the important advantage of protecting the remote cathode 82 from contamination, and enables a very extended cathode life, a feature which is especially important to enable use of the preferred LaB$_6$ cathodes, which are particularly sensitive to degradation from chemically active species.

Water Cooled Block and Demountable Ionization Chamber

In the embodiment of FIG. 9B (see also FIG. 3E) the ionization volume 16' is defined by a demountable end module 5b which is mounted with conductive thermal contact on the end of solid mounting block 5a via thermally conductive seal 6".

For achieving demountability, the conductive seal 6" is compressed via metal screws through mating surfaces of the block 5a and the demountable end module 5b. This construction enables the member 5b defining the ionization chamber 16' to be removed from the block 5a and replaced with an unused member, advantageously of disposable construction. It also enables a different, and in some cases more efficient cooling of walls of the ionization chamber 16' than in previous embodiments. For construction of the demountable member, in addition to aluminum (which is inexpensive and less injurious to the wafers being implanted than molybdenum, tungsten or other metals if transported to the wafer in the ion beam), the ionization chamber member 5b and exit aperture plate 13 are advantageously constructed from graphite or SiC, which removes altogether the possibility of metals contamination of the wafer due to propagation from the ion source. In addition, demountable ionization chambers of graphite and SiC may be formed cheaply, and thus can be discarded during maintenance, being less expensive to be replaced than a one-piece structure.

In another embodiment, for conductively controlling the temperature of the block 5a and the chamber body 5b, they have mating smooth surfaces, the surface of the block containing machined cooling channels which admit conductive cooling gas between the block 5a and the chamber body 5b, so that that gas, introduced under vacuum, transfers heat by heat conduction (not convection) in accordance with the above description of FIGS. 4D and 4E, and cooling techniques used for the different situation of cooling wafers that are being implanted, see King U.S. Pat. No. 4,261,762. In this case, gaskets at the vapor and gas passages prevent mixing of the conductive heat transfer gas, such as argon, with the gas or vapor to be ionized.

As shown, block 5a is cooled by water passages 24a, either associated with its own thermal control system, FIG. 3E, or, as shown, in FIG. 9B, associated with the cooling system 24 that cools frame 10 on which the beam dump 11 is mounted. By being based upon heat conduction through solid members, water contact with the walls of the ionization chamber is avoided, making it uniquely possible to fabricate the ionization chamber of materials, such as low cost machined or molded graphite, which cannot conveniently be exposed to water. The remote location of the cathode and its heat effects combine with these mounting features to achieve desired cool-running of the ionization chamber.

Advantageous E-Beam Gun Features

Figure 10:
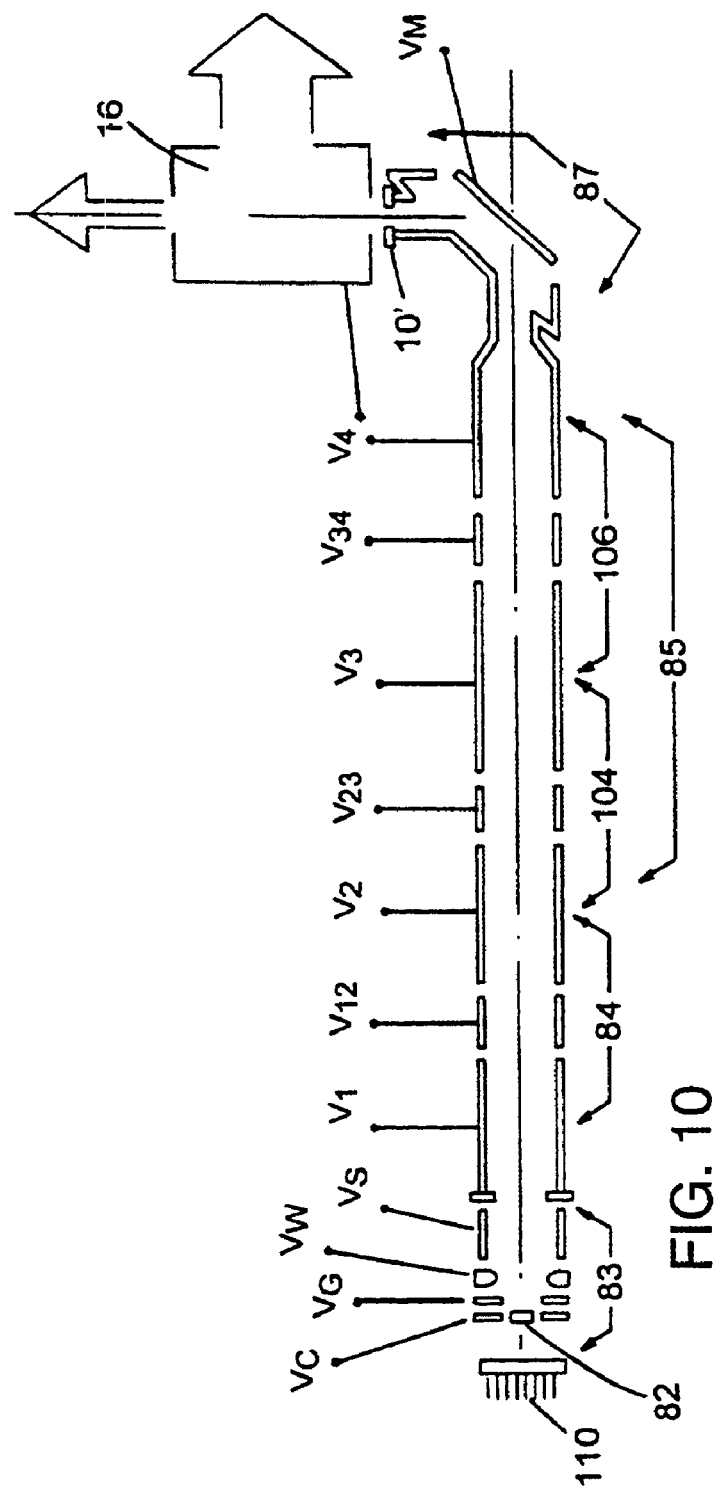
FIG. 10 is a side view on an enlarged scale of a preferred embodiment of the elongated electron gun of FIG. 9.
Figure 11:
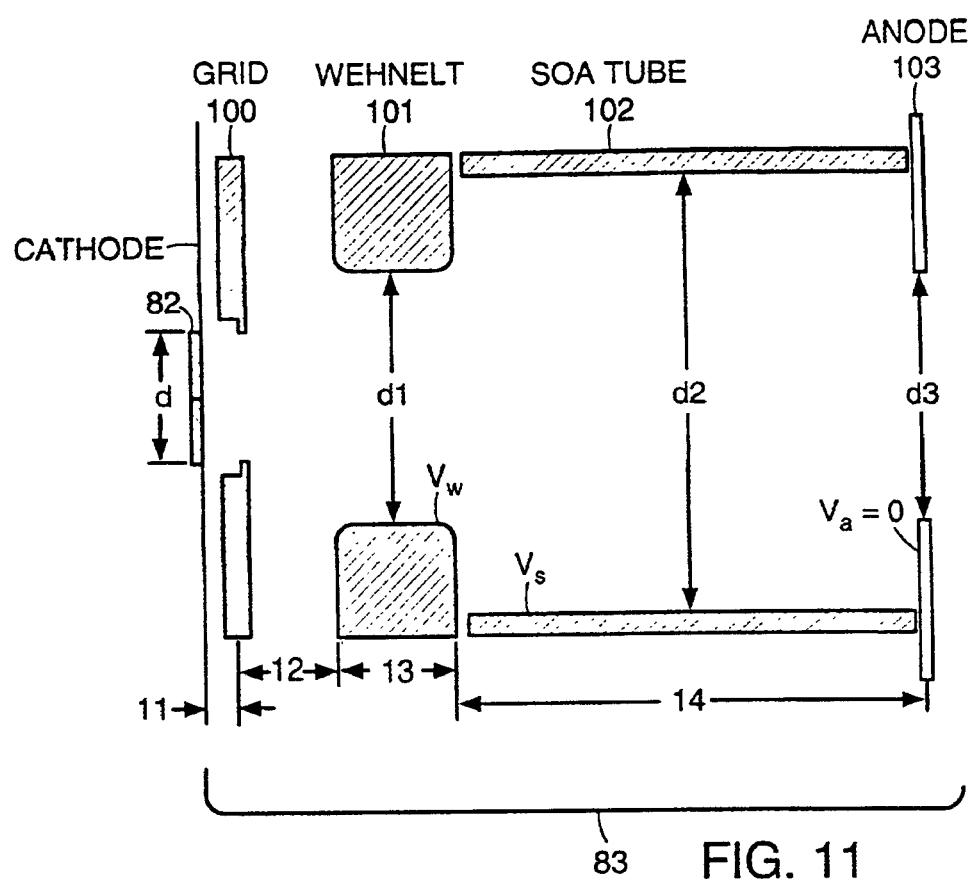
FIG. 11 is an enlarged diagram of the extraction stage of the gun of FIG. 10.
Figure 12:
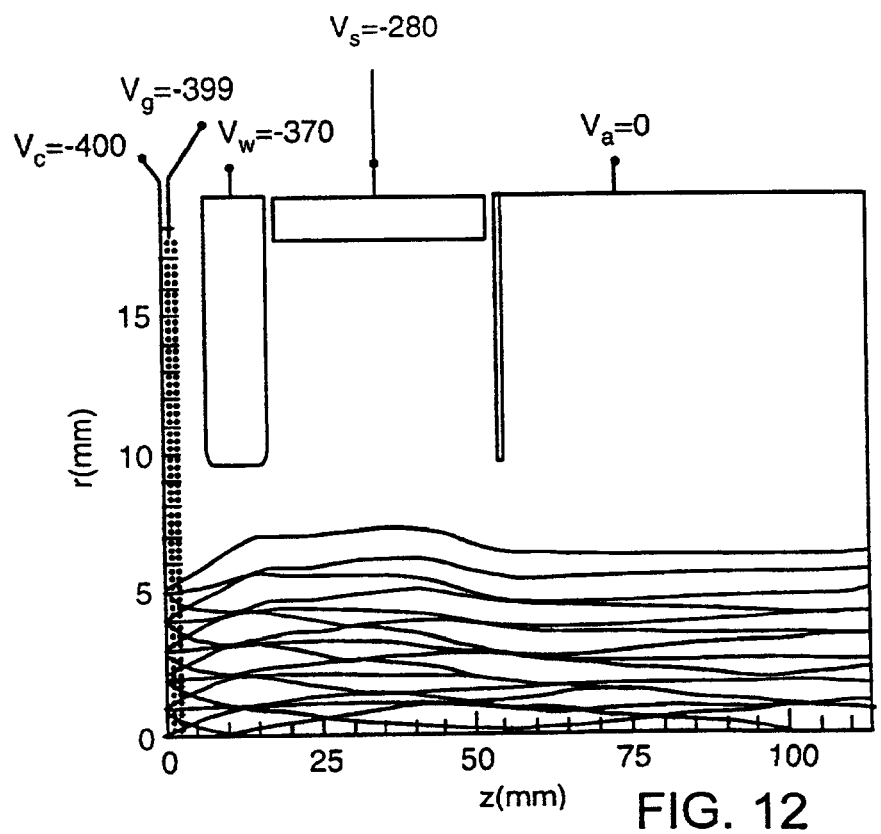
FIG. 12 illustrates the trajectories of electrons through the extraction stage of FIG. 11.

Features of particularly preferred embodiments of the long E-Beam are shown in FIG. 10, with the extraction stage 83 shown in greater detail in FIG. 11. The extraction stage 83 is of cylindrical geometry, and comprises a cathode 82, a field shaping grid electrode 100, Wehneldt electrode 101, cylinder lens 102, and anode 103. Relative to the cathode potential $V_c$, the grid potential $V_g$ is held, for example, at $-2V<V_g<+4V$ and the anode potential V1 is maintained at between about 200 and 1000 volts positive, depending on the desired electron energy at the exit of the extraction stage. The Wehneldt and cylinder potentials, $V_W$ and $V_S$ respectively, are tuned so as to produce electron trajectories through the extraction stage which limit filling of its lenses, and limit the beam angle of the electron trajectories at the output of the extraction stage. In essence, the purpose of the extraction stage is to collect the thermionically emitted electrons from the directly heated cathode or from the emitter surface of an indirectly heated cathode, to provide a beam of significantly energized electrons in a beam with a desired regular profile, with a degree of uniformity of electron distribution and collimation that presents a good quality object for the downstream telescopic lens system shown in FIG. 10. Such tuning is shown in FIG. 12 for an extraction stage which was originally developed for low-energy positrons (see I. J. Rosenberg, A. H. Weiss, and K. F. Canter, *Physical Review Letters* 44, p. 1139, 1980). It is modified and used for forming a broad electron beam as part of the present invention. The original extraction stage described by Rosenberg et al. was essentially a 100% positron transmission stage designed for an extended, 10 mm diameter positron emitter. In the present E-Beam gun, the extraction stage is scaled smaller, e.g. by a factor of 0.5 to accommodate a 5 mm diameter cathode electron emitter with the aperture diameter of grid electrode 100 5 mm and the sign of the electrode potentials reversed to make the structure suitable for extraction of electrons. With this scale factor, the electron extraction stage is approximately 27 mm long, with the cylinder lens diameter being 17.5 mm.

In FIG. 11, typical dimensions may be:

| | |
|---|---|
| d = 5 mm | $l_1$ = 1.3 mm |
| $d_1$ = 9.5 mm | $l_2$ = 2.3 mm |
| $d_2$ = 17.5 mm | $l_3$ = 4.8 mm |
| $d_3$ = 9.5 mm | $l_4$ = 18 mm |

Where $V_c$=any range between −20 to −300 or −500 V, relative to $V_{ch}$, the potential of the ionization chamber. Relative to $V_c$, then, the other voltage values for instance, may respectively range between:

$$-2V < V_g < 4V$$

$$0V < V_w < 500V$$

$$50V < V_s < 500V$$

$$200V < V1 < 1000V$$

Other embodiments of the electron extraction stage are possible. In one embodiment, the emitting surface of the cathode 82 is moved forward to lie in the same plane as the grid 100, field shaping provided by the grid aperture not being employed. In this case, grid 100 is held at the same potential as cathode 82. Another advantageous embodiment of the extraction stage incorporates a Pierce geometry, in which the grid aperture is coplanar with the cathode, but the shape of the grid is conical, with sides inclined at an angle of 22.5°, corresponding to a cone angle of 135° (see J. R. Pierce, *Theory and Design of Electron Beams*, $2^{nd}$ edition, Van Nostrand, New York, 1954). This electrode shaping advantageously counteracts the effects of electron space charge in the highly populated vicinity of the cathode.

In the presently preferred embodiment, the 5 mm-diameter, circular thermionic cathode plate is heated to emit an average electron current density of about 200 mA/cm$^2$ from its face having an emitting area of 0.2 cm$^2$, yielding 40 mA of electron current into the extraction stage. The extraction stage serves as an injection stage for the following lens system which comprises collimating lens 84 followed by zoom lens 85. In the preferred embodiment, these lenses comprise 17.5-mm-diameter ("D"), thin-walled metal cylinders, separated by gaps equal to 0.10 D. When differing potentials are applied to the thus separated cylinders, strong focusing fields are generated at the gaps, producing lensing effects.

Referring to FIG. 10, the collimating lens 84 is an asymmetric einzel lens, that is, it consists of three coaxial cylinders of length 2D, 1D, and 2D at voltages V1, V12, and V3. V1 is not equal to V3 (hence the Einzel lens is "asymmetric"). In general, the three elements (triplet) of each einzel lens acts as a single "thick" lens. In the case of collimating einzel lens 84, V2>V1, and lens 84 acts as an accelerating lens. V12 is varied to adjust the focal length, hence the magnification of the triplet. Lens 84 also acts to limit overfilling of the cylinders by the electron beam, which can produce aberrations and beam loss. As described, collimating lens 84 presents an object to the downstream zoom lens 85 with appropriate beam characteristics to enable the zoom lens 85 to produce a collimated, variable-energy beam for passage into the 90° mirror 87.

Figure 13:
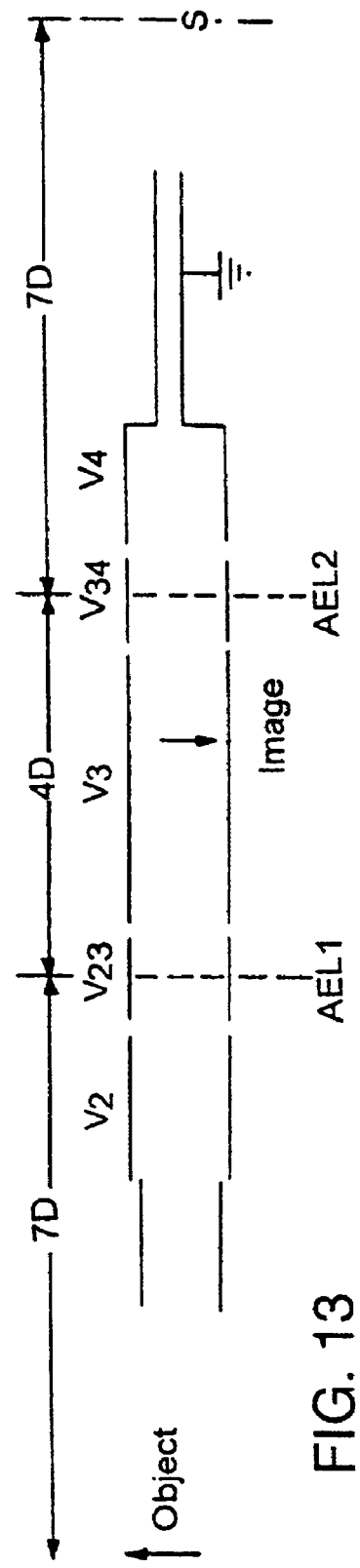
FIG. 13 is a diagrammatic view of a 5-element zoom lens.

In electron optics, a zoom lens accomplishes the function of changing the energy of the electron beam while maintaining the same object and image locations. A typical zoom lens is a three-element lens consisting of concentric hollow metal tubes in series held at voltages v1, v12, and v2, respectively. Typically, the center element is shorter in length than the first and third elements (e.g., see lens 84 in FIG. 18). In this case, v1 establishes the entrance energy, and v2 the exit energy. The ratio (v2/v1 for acceleration, and v1/v2 for deceleration) is called the "zoom ratio". For a given value of v1 and v2, the value of the center element voltage, v12, is selected to maintain the focal lengths (and hence the object and image locations, P and Q, respectively) of the lens. Zoom lenses of this type are useable over a limited energy range (the "zoom range"). The five-element zoom lens 85 preferably employed in accordance with the present invention and illustrated in FIG. 13 is an extension of this concept. By adding additional lens elements, this compound lens offers the following expanded capabilities versus a three-element lens:

1) It can be operated over an extended zoom range, e.g., 20:1 versus 5:1 for a three-element lens.
2) It can vary angular magnification and be operated in an "afocal mode", that is, by tuning the voltages so that the electron trajectories entering the lens are parallel upon exit, i.e., there is no real focus at the lens exit.
3) It can be operated as a "telescopic" lens, which produces a real image with a well-defined value of P and Q, but with variable linear magnification. For example, when AEL1 is a stronger focusing lens (shorter focal length) than AEL2, M>1; and when AEL2 is the stronger focusing lens, M<1.
4) The five-element lens can provide variable linear and angular magnification while also allowing zoom control, i.e., varying both energy and magnification.

Figure 13A:
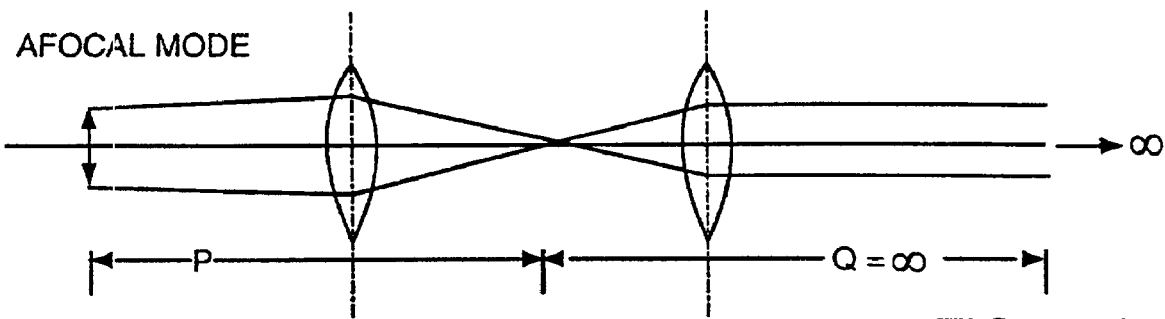
FIGS. 13A through 13D illustrate various operating modes of the lens system of FIG. 13.
Figure 13B:
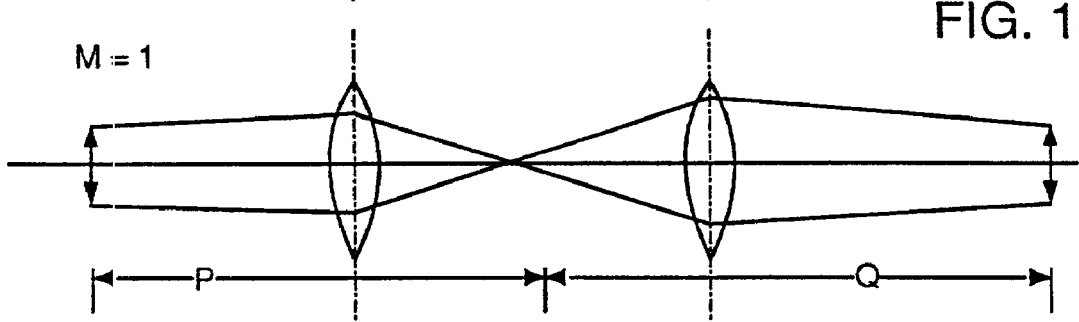
Figure 13C:
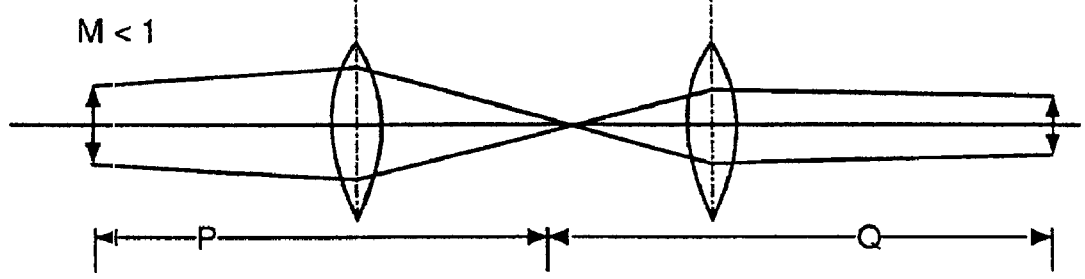
Figure 13D:
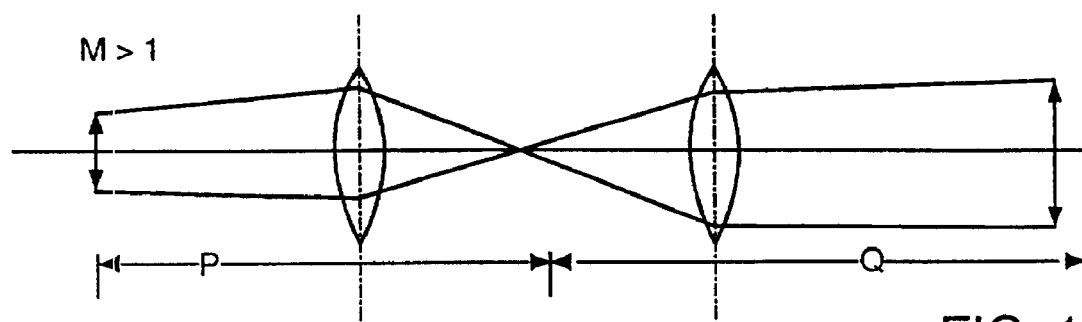

For example, we refer to FIGS. 13A through 13D, which show the five-element zoom lens as two three-element lenses, AEL1 and AEL2, in tandem. In general, the electron beam will be at different energies entering and exiting the zoom lens, as previously discussed. In addition, several modes of operation are illustrated by the figures. FIG. 13A shows the afocal mode, where the electron beam is well-collimated exiting the lens, corresponding to an image at infinity. This mode is advantageous for collimating the beam prior to its entrance into a turning stage, such as the 90 degree mirror 87 described with reference to FIGS. 9, 9B and 10. It is also advantageous for injecting a well-collimated beam of the desired energy into the ionization chamber, to maintain the beam substantially parallel with an elongated extraction aperture. FIG. 13B shows the beam being focused to an image with unity magnification. This mode is desirable when a high degree of collimation is not necessary, and preservation of the beam characteristics at the object location is desired at the image location, for example, when the object dimension is appropriate for the size of the beam profile in the ionization chamber when the zoom lens is being used primarily for modifying the energy of the electron beam. FIG. 13C shows the beam being focused to an image smaller than the object, which is appropriate for injection into a mirror or into the ionization chamber when counteraction of space charge forces in the electron beam is desired, to prevent the beam from expanding overmuch, as when the zoom action is employed to decelarate the beam. This mode is also advantageous for producing a narrow cross-section electron beam in conjunction with a narrow ion extraction aperture, e.g., in a medium or low current ion implanter. FIG. 13D shows the beam being focused to an image larger than the object. This mode is advantageous to expand the electron beam prior to injection into the ionization volume to provide a large cross-section ionization region, as in the case of a wide ion extraction aperture in a high-current ion implanter.

In conjunction with the input collimating lens 84, the lens system can exercise control of linear and angular magnification, energy, and image location over a wide range, more than sufficient for the needs of the present invention.

Figure 14:
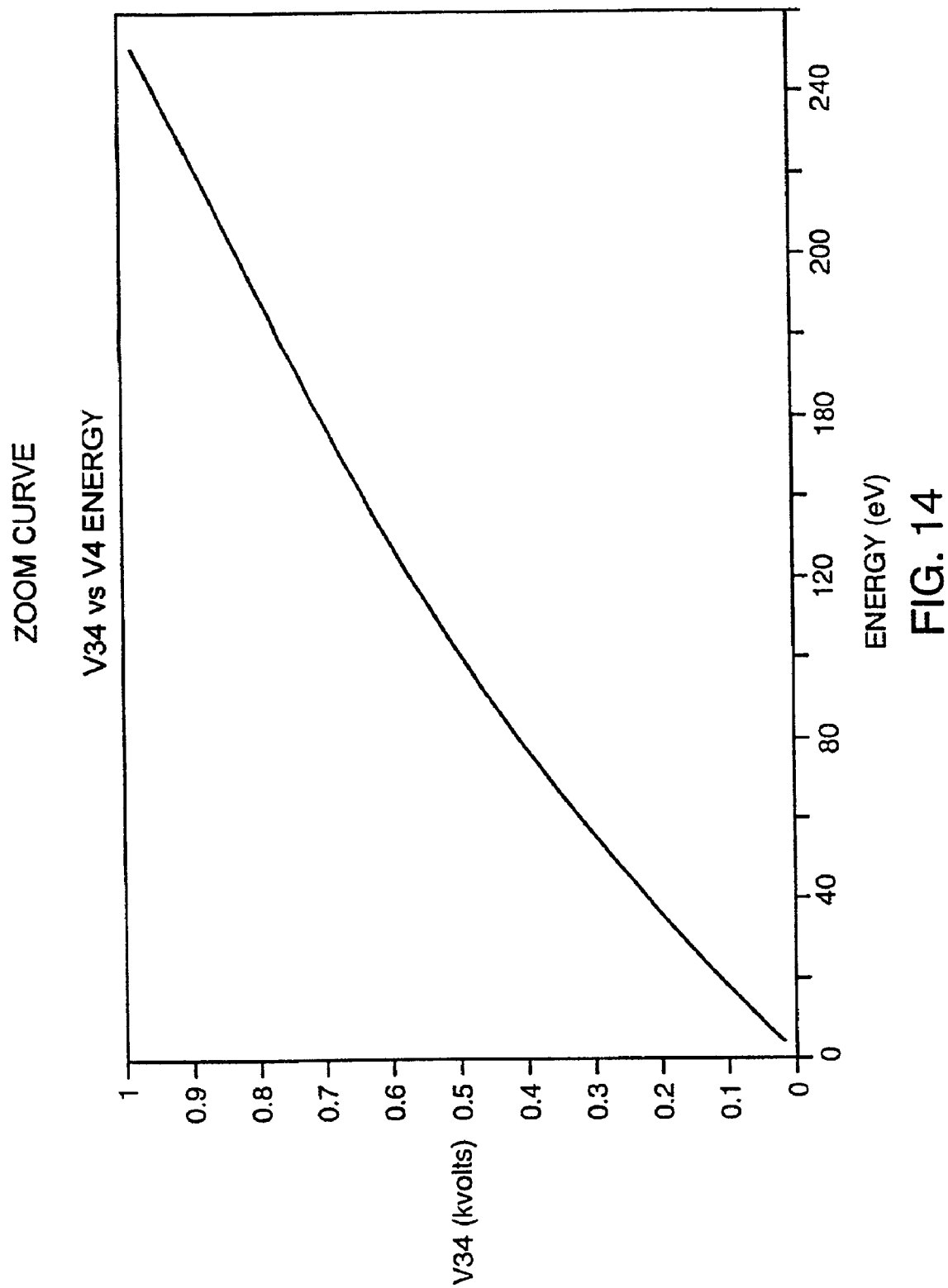
FIG. 14 is a plot of the zoom voltage line.

The zoom lens 85 is comprised of two asymmetric einzel lenses in tandem, einzel lenses 104 and 106 in FIG. 10, and AEL1 and AEL2 in FIG. 13. The zoom lens 85 is a five-element lens, with its center (third) element, 3D length, serving as an element of each of the tandem einzel lenses. FIG. 13 shows an Object and Image for AEL1 (the Image is an Object for AEL2) which results in a final image at infinity, producing collimated electron trajectories. Zoom lens 85 is capable of being operated as an afocal lens by setting its element voltages such that the second focal point of AEL1 and the first focal point of AEL2 overlap. In this mode, the zoom lens 85 is telescopic; parallel electron trajectories entering the lens are also parallel upon exiting. In the case, however, that V2>V3>V4, the zoom lens advantageously decelerates the electrons over a wide energy range, and can still retain its telescopic properties if the voltage differences, i.e. V23 and V34, are adjusted appropriately. A positron lens structure of the type shown in FIG. 11, is shown in T. N. Horsky, Ph.D. thesis, Brandeis University Dept. of Physics, *Semiconductor Surface Structure Determination via Low Energy Positron Diffraction: Cleavage Faces of CdSe*, UMI Pub #9010666, Chapter 3, 1988. FIG. 14, taken from that thesis, shows an example of a decelerating operating mode, in which lens element potentials $V_i$ are expressed in kinetic energy units, i.e., kinetic energy=$e|(V_i-V_c)|$. The positron beam entered the zoom lens at 1 keV, and decelerated to a beam energy of 75 eV upon exiting AEL1 (i.e., within lens element V3). The plot shows how V34 was varied as a function of positron final beam energy to maintain a collimated output, for a final beam energy range between 5 eV and 250 eV. The plot is indicative of plots obtainable with the similar electron beam lens structure presented here.

In the present novel embodiment, the collimating electron lens 84 is tuned in conjunction with the zoom lens 85 to vary linear magnification as well as final electron beam energy. Thus, a variable-energy, variable-diameter electron beam can be generated with the lens system depicted in FIG. 10, with the advantage of copious electron production enhanced by the acceleration geometry, while achieving lower final electron energy appropriate for interaction with dopant feed material, e.g., with decaborane, by use of the deceleration stage.

Prior to entering the ionization volume 16 of ionization chamber block 5, the electron beam produced by the gun of FIG. 10 is turned through 90°. The turning stage 87 can be of various known forms, e.g., two related and coaxial partial cylinders (i.e., a radial cylindrical analyzer), formed into respectively inside and outside sides of an elbow that bends the electron optical axis, the partial cylinder that lies on the inside of the curved axis being maintained at a more positive potential than the partial cylinder lying on the outside of the curved axis. These cooperate to turn the beam 90 degrees according to known electron path bending techniques.

A mirror defined by two flat or cylindrically curved plates (i.e., either a parallel plate or cylindrical mirror analyzer) whose axis is oriented 45° from the zoom axis to result in a 90° deflection at the exit of the mirror, can also be employed to occupy a smaller space within the retrofit volume. It is presently preferred, however, that the described radial cylindrical analyzer be employed with the advantage of achieving two dimensional transformation of the beam to the new path through the ionization space 16 of the ionization chamber 5, thus preserving the pre-established beam profile with high transmission.

After turning, the beam passes through a limiting aperture 10' which is advantageously rectangular, and enters the ionization chamber 5 via the electron entrance port 35. Limiting aperture 10' is constructed to be replaceable in coordination with replacing the ion extraction aperture, typically the wider the ion extraction aperture, the larger is the corresponding dimension of the selected electron limiting aperture 10'.

In operation with the turning mirror, at low electron energies, space charge forces can affect control of the electron beam. According further to the invention, two different modes of using the long E-Beam gun with a 90 degree turning mirror are provided, that successfully deal with this.

E-Beam Mode 1: The deceleration capabilities of the zoom system are employed in conjunction with the acceleration capabilities of the preceding collimating lens, to provide an acceleration-deceleration mode of operation. For instance, the lens voltages are coordinated to cause the system to zoom down from, e.g., one keV at the entrance to the zoom system to 100 eV at its exit. Because the beam expands due to the deceleration, some electrons of the beam may be lost within the mirror, but this is readily acceptable where low current, low energy injection into the ionization volume 16 is desired. For example, the system is operable at currents less than 5 mA at 100 eV, or at higher energies. As the final energy of the electrons goes up, the electron current increases. The electron beam in this case can be well collimated and be aligned with a relatively small area beam dump.

E-Beam mode 2: In this case, the electrons are transported at high energy throughout the E-Beam gun and mirror, and a deceleration stage 88 is interposed between the exit aperture of the mirror and the entrance of the ionization volume 16. Because the beam is collimated at high energy, the electron optics perform without detrimental space charge effect, delivering a well-collimated beam sized for the mirror.

Following the mirror, the beam is caused to decelerate abruptly as it enters the ionization chamber, to expand with the electron trajectories confined to a conical, gradually expanding volume. In this case, electron currents of 20 mA or more, for example, may be obtained. As the beam expands, since the electron trajectories remain generally straight, the beam can be intercepted by a beam dump 11 of larger area than in mode 1. Along the ionization path in this case, those electron trajectories which diverge to pass more closely to the aperture are somewhat offset by those which diverge further from the aperture so that total ions extracted along the aperture need not vary in density to an unacceptable degree along the length of the aperture. For this mode of operation, having the beam dump area large (with the beam dump in close proximity to the wall of the ionization chamber to limit gas conductance), the beam dump is sized still to align with the somewhat diverging electron paths so that substantially all electrons of the E-Beam from the mirror are intercepted by the cooled beam dump.

In the case an elongated electron gun is mounted with its axis aligned with the ionization path through the chamber (no mirror employed), mirror loss of the beam can be avoided, and a collimated electron beam, produced as in mode 1, can be maintained through the ionization chamber, at a larger electron current.

The operation of such systems have numerous advantages under conditions of operation appropriate to producing the ion beams illustrated in different circumstances such as shown in FIGS. 4D and 5. The system can produce different size profiles of the broad area beams aligned with the beam dump, and different electron densities suitable for respectively different situations over a wide range of preferred operation, e.g. over a zoom ratio of 15 to 1. Cost efficiency, space efficiency and thermal advantages especially result by use of a relatively small cathode, while achieving a relatively broad and controlled-energy beam. The system is useful, first with respect to decaborane at electron beam energies of between about 20 to 150 eV, and with many important or novel other species. The different energy regimes up to, e.g. 300 or 500 eV can enable the system to operate, in broad, aligned electron beam mode with respect to all species (including the fluorides for small, but highly pure beams). In a specially constructed multi-mode ionization system, the system can be switched to a reflex ionizing mode for some species (e.g. hydrides and fluorides) using a confining magnetic field. It can also be operated to produce doubly charged phosphorus or arsenic, and triply charged species.

Electron Injection for High Current Applications

For some ion implant applications, it is desired to obtain an ion current approaching the highest ion currents of which the technology is capable. This depends critically on the value of electron beam current traversing the ionization chamber, since the ion current produced is roughly proportional to the value of this electron current. The electron current injected into the ionization chamber is limited by the effects of space charge forces that act on the electron trajectories within the electron gun optics and the ionization chamber. In the space charge limit, these forces can add an increased width to a tightly focused beam waist produced by a lens, and can introduce an increased angular divergence to a beam as it diverges downstream of the waist.

I note the relevance here of the principle that the maximum electron current which can be transported through a tube of diameter D and length L can be produced by focusing the beam on a point at the center of the tube with an angle $\alpha = D/L$ expressed in radians. In such case, the maximum current is given by:

$$I_{max} = 0.0385 \, V^{3/2} \alpha^2, \quad (1)$$

where $I_{max}$ is the electron current measured in mA, and V is the voltage in volts corresponding to electrons of energy E=eV, where e is the electronic charge. Also, in this example the minimum waist diameter w is given by w=0.43 D. Inserting $\alpha = 15°$ and V=100V into equation (1) yields $I_{max}$=10 mA, whereas inserting $\alpha = 5°$ and V=1000V yields $I_{max}$=106 mA.

Figure 18:
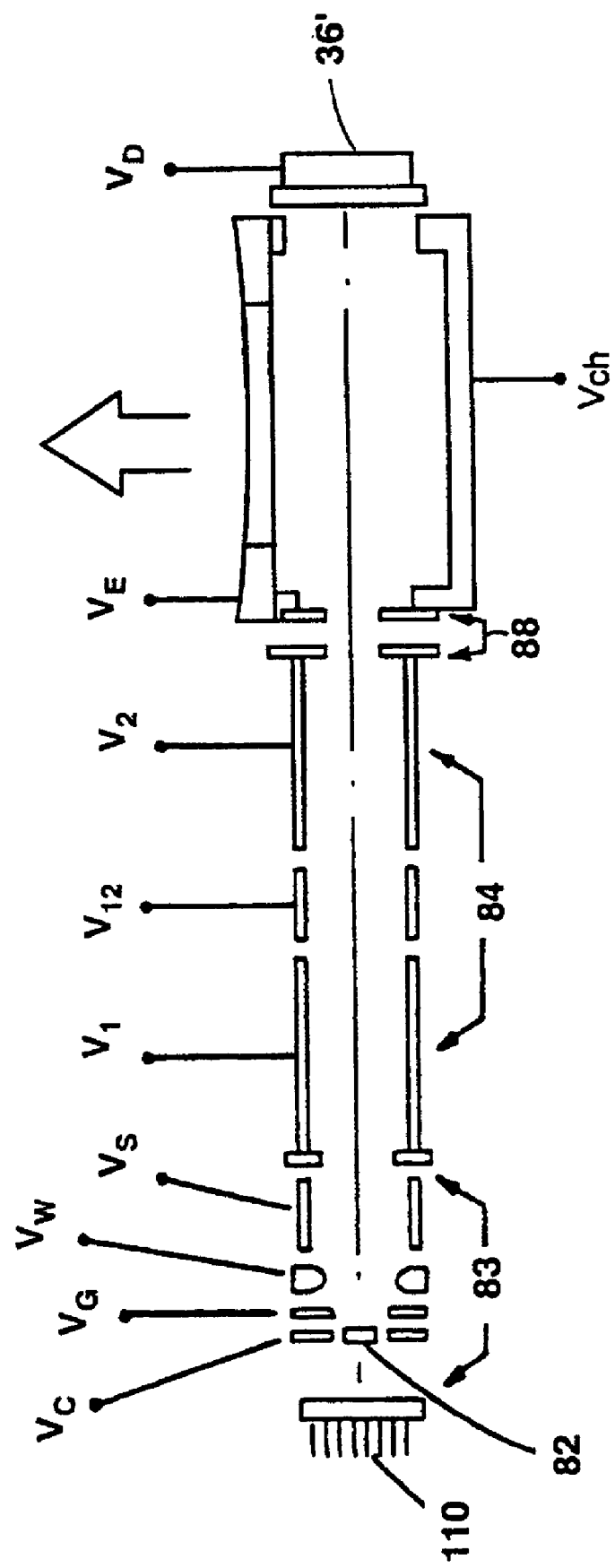
FIG. 18 is a diagram of a high-current electron gun incorporated into a preferred embodiment of the ion source, where the optical axis of the electron gun is parallel to the long axis of the ionization chamber, showing the approximate scale and operating voltages of the different elements.

By interpreting $\alpha$ as the angular divergence induced by space charge forces, these examples demonstrate the advantage achieved by the novel embodiment of FIG. 18 which transports the space charge-limited beam at high energy and achieves a large injected electron current at desired lower energy.

The gun of FIG. 18 is similar to that of FIG. 10, but has important differences: 1) instead of the zoom lens 85, a double-aperture lens 88 is employed, which terminates at the entrance port of the ionization chamber and 2) no mirror 87 is used, the gun being mounted coaxial with the long axis of the ionization chamber. In a preferred embodiment having these features, large-diameter tubes (approximately 2.5 cm diameter) are used to limit lens filling, and hence beam loss due to aberrations. The gun is kept short by using the collimating lens to present the desired beam characteristics to the final double-aperture lens (DAL) for injection into the ionization chamber. Provisions are made so that the electron gun voltages ($V_g$, $V_w$, $V_s$, V1, V12, all referenced to the cathode voltage $V_c$) are tunable to give the best performance in terms of beam current, angular divergence, and beam diameter appropriate to a given application, and will operate at fixed values, with a beam energy $E_i$ at the exit of collimating lens 84 (i.e., $E_i = e[V2 - V_c]$) between 750 eV and 1250 eV. Thus, the wide-range zoom capability provided by the gun of FIG. 10 is not required; the tetrode extraction gun 83 in combination with the three-element collimating lens 84 provides sufficient flexibility to control and to properly determine the electron beam characteristics. The DAL then functions as a strongly focusing decelerating lens, with the desired electron energy within the ionization chamber being given by $E_f = e[V_{ch} - V_c]$, where $V_{ch}$ is the ionization chamber potential (when $V_{ch}$ is referenced to earth ground, it is the ion beam accelerating potential $V_a$). For example, with $E_i$=1000 eV and $E_f$=100 eV, the DAL is a 10:1 decelerator.

In the presently preferred design of the DAL, it is comprised of two flat plates with equal diameter circular apertures of diameter D'. The plates (of thickness 0.1 D') are separated by a uniform distance D'/2, and are constructed of vitrified graphite, silicon carbide, or aluminum to eliminate transition metal contamination due to beam strike on the apertures which could result if tantalum, molybdenum, or stainless steel electrodes were used. For example, values of D'=1.2 cm±0.6 cm will accommodate much of the useful range of this lens. Importantly, since one plate of the DAL is tied to V2 and the second plate is tied to $V_{ch}$, the addition of this lens does not require a further power supply. The DAL serves two useful purposes: 1) it accomplishes deceleration of the electron beam, in a controlled and well-defined manner, to the selected value of $E_f$ necessary to maximize ionization efficiency of the particular dopant feed gas of interest, and 2) it provides strong focusing of the electron beam to counteract space charge effects which would otherwise dominate the spreading of the electron trajectories within the ionization volume.

Figure 18A:
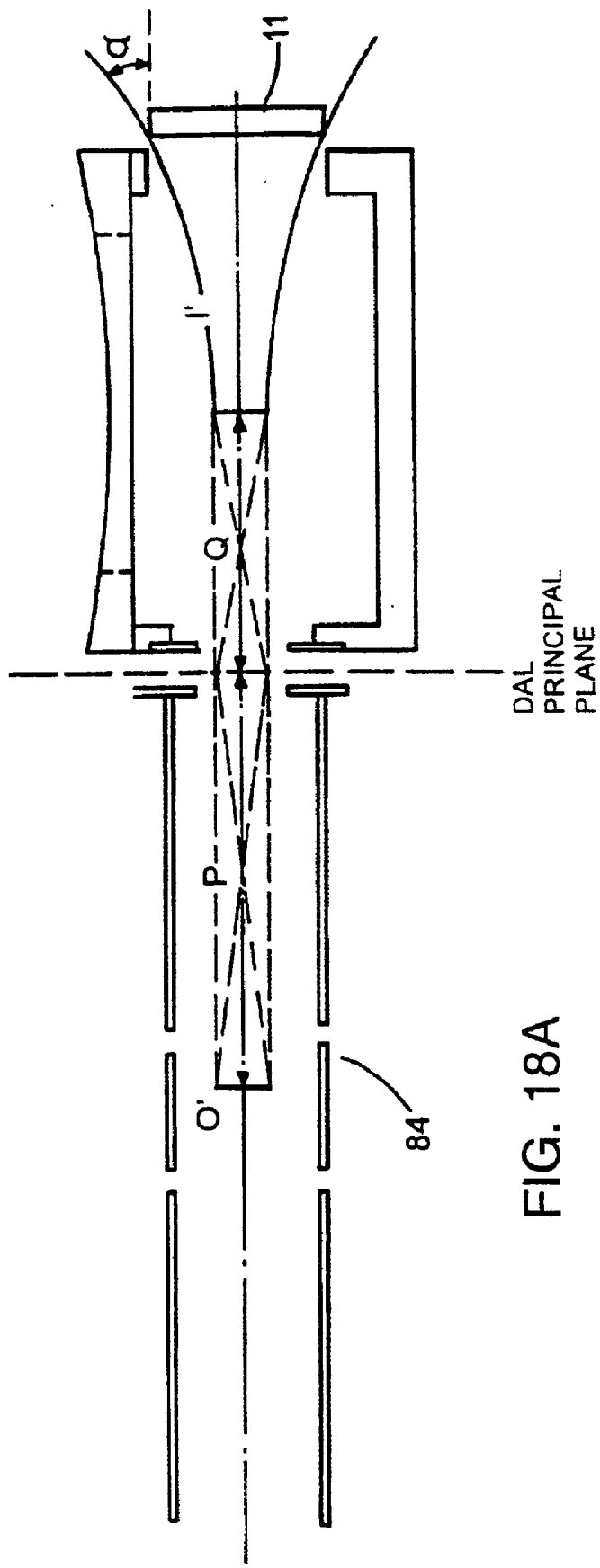
FIG. 18A shows the electron optics of the ion source of FIG. 18, where the focusing properties of a double-aperture lens are illustrated by object and image points, and also the detailed mechanical structure of the ionization chamber and beam dump are illustrated.

I further recognize the advantage here of the principle that, in order to maximize the electron current through a tube, the beam should be focused at the center of the tube length. According to the present invention, when injecting the space charge-limited electron beam into the field-free volume of the ionization chamber, the spreading of the beam is minimized by focusing the beam at the center of the volume's length. In the case of an ion source according to FIG. 18, the nominal focus is located a distance of about 4 cm from the principal plane of the DAL. The optics for this are shown in more detail in FIG. 18A. An object O' is presented to the DAL by the upstream lens, and a corresponding image I' of this object is produced by the DAL. The values used for this model are: $V2/V_{ch}$=10, D'=1.27 cm, object distance P=4.8 D', image distance Q=3D', linear magnification M=1.0 (taken from E. Harting and F. H. Read, *Electrostatic Lenses*, Elsevier, New York, 1976). Thus, in this embodiment the electron beam is focused to an image point 3.8 cm from the principal plane of the DAL, approximately in the center of the length of the ionization chamber. By varying the lens ratio $V2/V_{ch}$ and/or changing the position of the object, the location of this image point can be moved to optimize the performance of the ion source in relation to other operating parameters (for example, the image can be moved further downstream, so that the minimum waist diameter of the beam, i.e. the circle of least confusion, falls near the center of the chamber). The maximum extent of the space charge spreading of the beam may be estimated through use of equation (1), rearranging it as below:

$$D = 5.1 \, L \, I_{max}^{1/2} \, V^{-3/4} \quad (2)$$

where D is the diameter intercepted by the electron flux, and L is the length of the ionization chamber (approximately 7.6 cm). Substitution of $I_{max}$=20 mA and V=100 V yields D=5.5 cm, as does substitution of $I_{max}$=40 mA and V=168V. Indeed, in practice, the space charge spreading in the ionization chamber will be less than approximated by equation (2) due to the space-charge compensation provided by the positively-charged ions which are abundantly present in the ionization volume. FIG. 18 and FIG. 18A employ an enlarged electron exit port and beam dump 36 to intercept the vast majority of the electrons in the beam. By keeping the separation between the beam dump 11 and the ionization chamber small, the gas flow out of the ionization volume through the exit port 36 can be small.

Several advantageous features of the ionization chamber and ion extraction aperture are also shown in FIG. 18A: 1) a counterbore is provided in the chamber wall to receive the thin aperture plate in such a way as to maintain a uniformly flat profile, to establish a uniform electric field between the aperture plates; 2) the ion extraction aperture 37' is moved closer to the center of the chamber (by up to about 8 mm, or 25% of the width of the chamber) for more efficient removal of ions by the extraction field of the extraction optics, and a shorter ion path through the ionization volume which reduces the probability of ion-neutral gas collisions, resulting in an asymmetric location in the chamber of the electron entrance-exit axis; 3) the ion extraction aperture plate is biased to a negative voltage $V_E$ (where $-25V<V_E<0V$) with respect to the ionization chamber to further increase the drift velocity of the ions, and hence the maximum obtainable current in the resulting ion beam.

Figure 19:
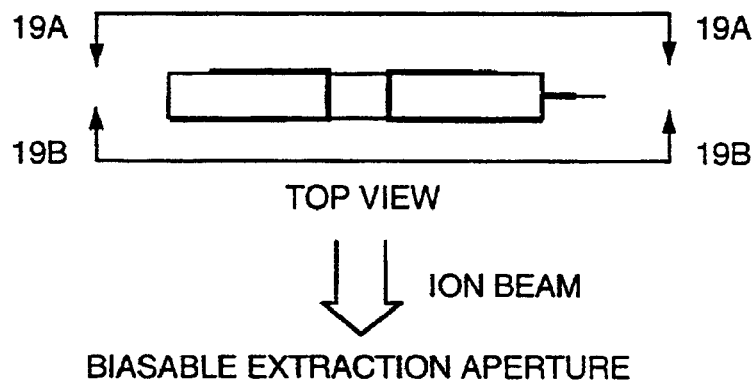
FIG. 19 is a top view of an aperture plate that has provisions for receiving a bias voltage relative to the voltage of the remaining walls of an ionization chamber, while FIGS. 19A and 19B, taken on respective lines in FIG. 19, are side views respectively of the inside face of the aperture plate, facing the interior of the ionization chamber and the outside face, directed toward the extraction optics.
Figures 19A, 19B:
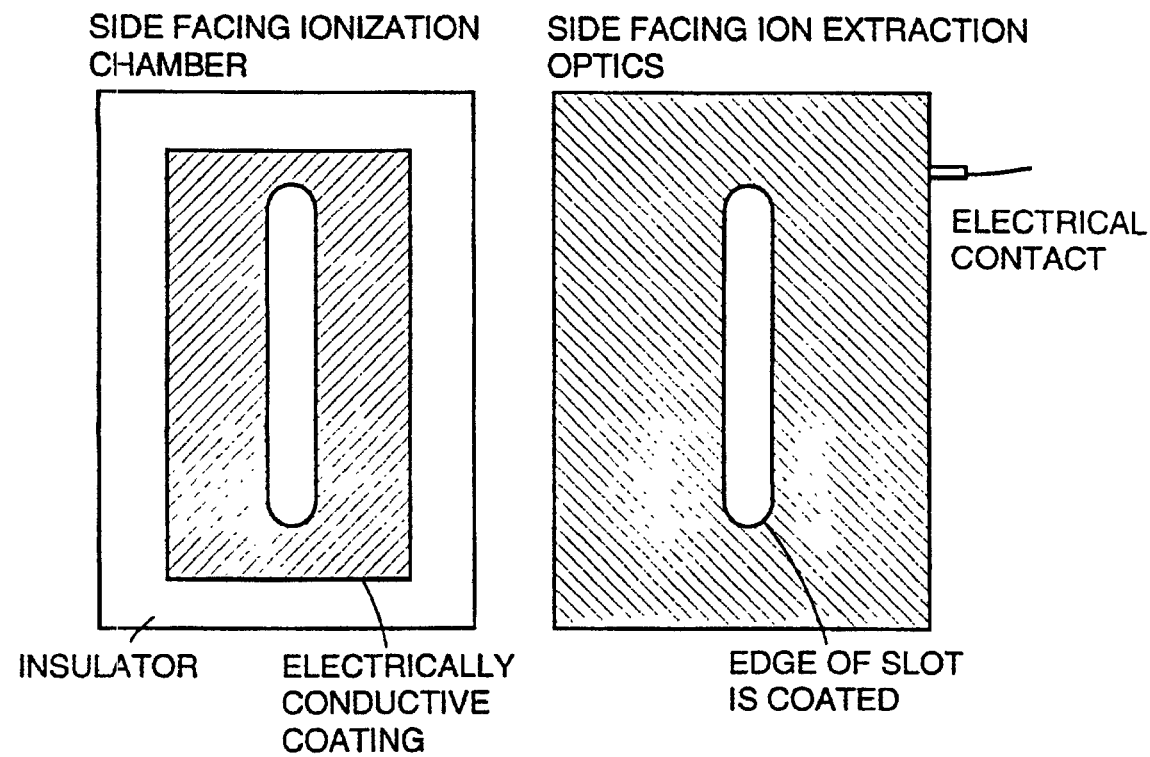
FIG. 19C is an edge view of an aperture plate illustrating it's mounting to the main body of the ionization chamber by insulating stand offs.

Referring to the embodiment of FIGS. 19–19B, biasing of the aperture plate is accomplished by forming it of an insulating material such as boron nitride, coating the exterior and interior surfaces which are exposed to the ions with an electrically conductive material such as graphite, and electrically biasing the conductor.

Figure 19C:
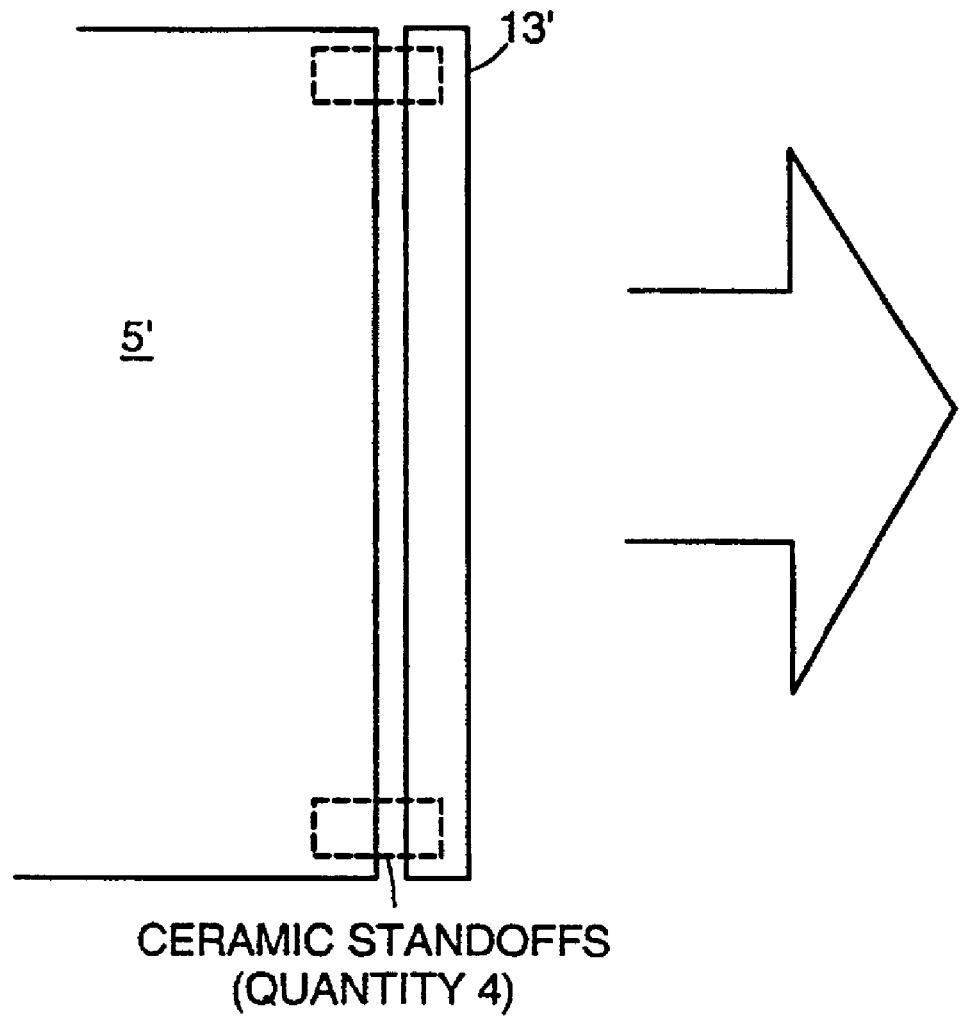

In other embodiments insulator standoffs are employed, see FIG. 19C, to join the electrically conductive extraction aperture plate to the chamber while maintaining its electrical independence. In embodiments of this feature, gas loss from the ionization chamber at the edges of the aperture plate can be minimized by interfitting conformation of the edges of the electrically isolated aperture plate and the body of the ionization chamber (involuted design) to effect labyrinth seal effects such as described in relation to FIG. 4B.

Figure 20A:
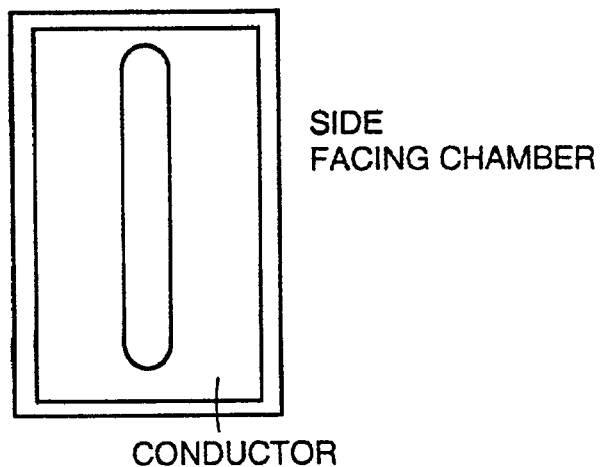
Figure 20B:
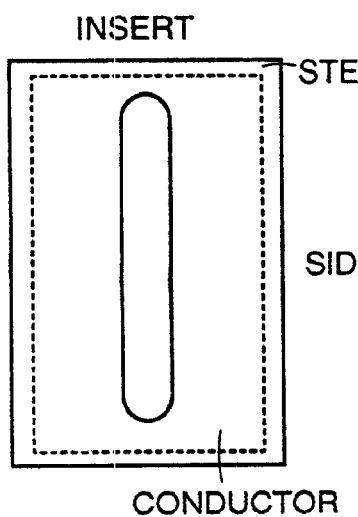
Figure 20C:
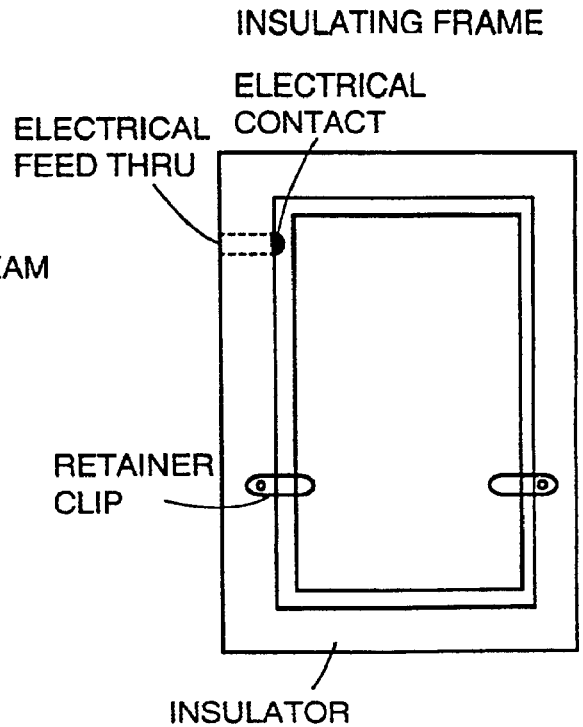
FIG. 20C is a side view of an insulator frame into which the insert plate of FIGS. 20A and 20B may be mounted.

In accordance with the embodiment of FIGS. 20A, B and C, an electrically conductive aperture plate insert is mounted in an electrically insulating frame which holds the aperture plate in place, and provides an electrical contact to the insert.

The embodiment facilitates change of aperture plates in accordance with changes of the type of implant run. In some embodiments thermoelectric coolers may be associated with the aperture plates to keep them from over-heating. In other embodiments, an extension of cooled frame 10 or a separate cooled mounting frame is employed to support the aperture plate.

Retrofit Embodiment of High Current Source

Figure 18B:
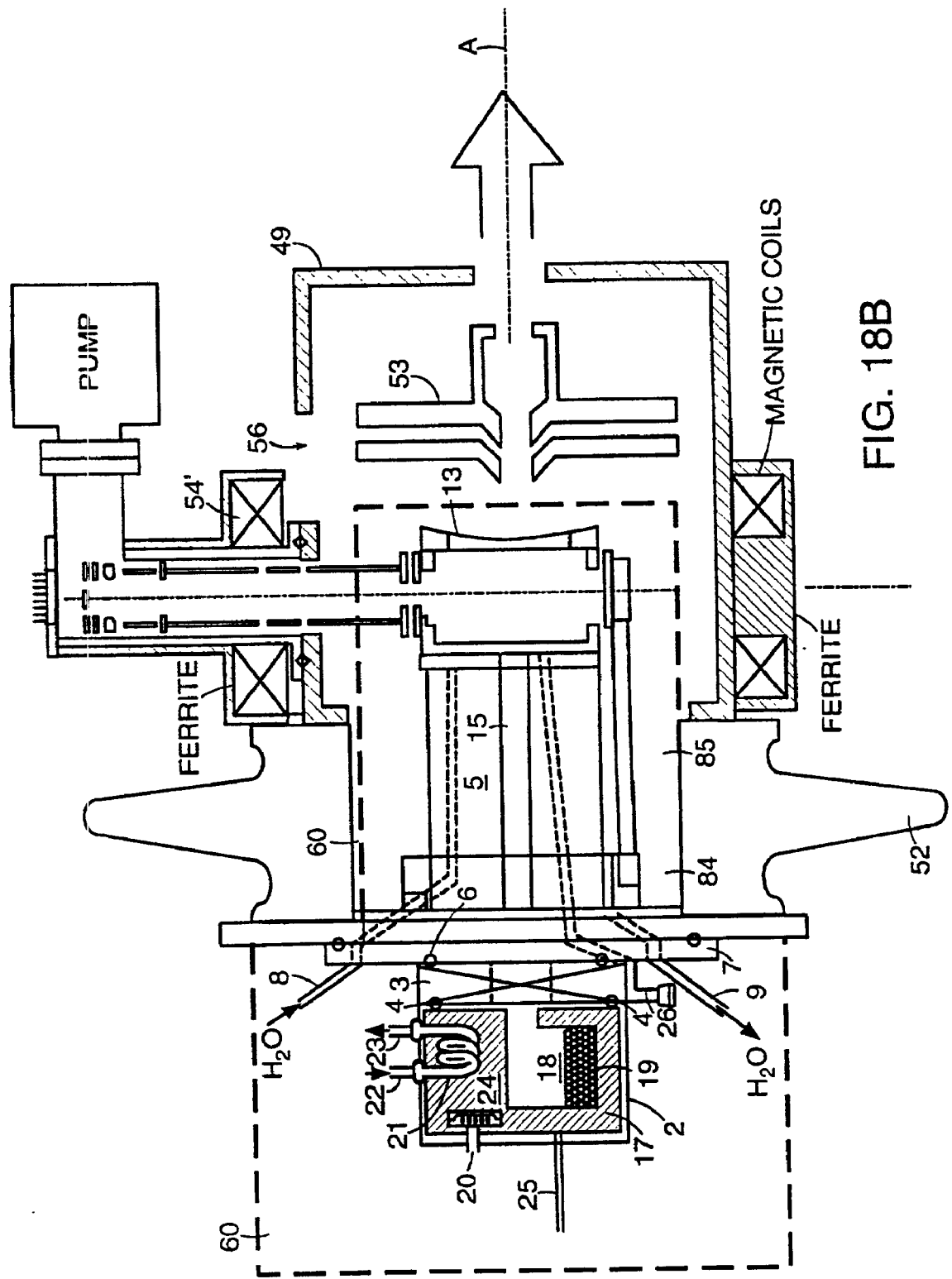
FIG. 18B illustrates mounting the ion source of FIGS. 18 and 18A into an existing ion implanter, and a special arrangement of the electron gun and magnet coils.

FIG. 18B shows the introduction of the embodiment of FIG. 18 and FIG. 18A into the ion source housing of a retrofitted implanter. Preferably the electron gun is mounted at the top, as shown. To implement this geometry into an existing implanter, a new ion source housing is provided, constructed in accordance with typical Bernas ion source considerations, (it can receive a Bernas ion source if ever desired), but the housing is modified at the top to receive the electron gun. In another case the existing ion source housing is modified, e.g. by the removal of the magnet coils 54 and the insertion of a vacuum port at the top of the housing to receive the flange-mounted, vertical electron gun assembly.

Since the implementation of an external, axial magnetic field can in certain cases be useful, a small pair of magnet coils is provided, as also shown in FIG. 18B. The electron gun as shown here, is mounted coaxially within one of those coils in a space efficient and uniquely cooperative arrangement.

When these magnet coils are energized, the resultant axial magnetic field can confine the primary electron beam (both within the electron gun and in the ionization chamber) to a narrowed cross-section, to reduce the spreading of the electron beam profile due to space charge, and increasing the maximum amount of useful electron current which can be injected into the ionization volume. For example, a magnetic flux density of 70 Gauss will act to confine 100 eV electrons within the ionization volume to a column diameter of about 1 cm. Since the electron emitter of this long electron gun is remote from the ionization chamber, it will not initiate an arc discharge, while, depending on the strength of the external magnetic field, it will provide a low-density plasma within the ionization region. By controlling this plasma to a low value, multiple ionizations induced by secondary electron collisions with the ions can be controlled to acceptable levels in certain instances. Furthermore, it is realized that the presence of the low-density plasma, in some instances, can enhance the space charge neutrality of the ionization region, and enable higher ion beam currents to be realized.

In a multi-mode embodiment, larger magnets are employed in the relationship shown in FIG. 18B to enable larger magnetic fields to be employed when operating in reflex mode, or when a Bernas arc discharge source is desired to be used.

Universal Ion Source Controller

Figure 15:
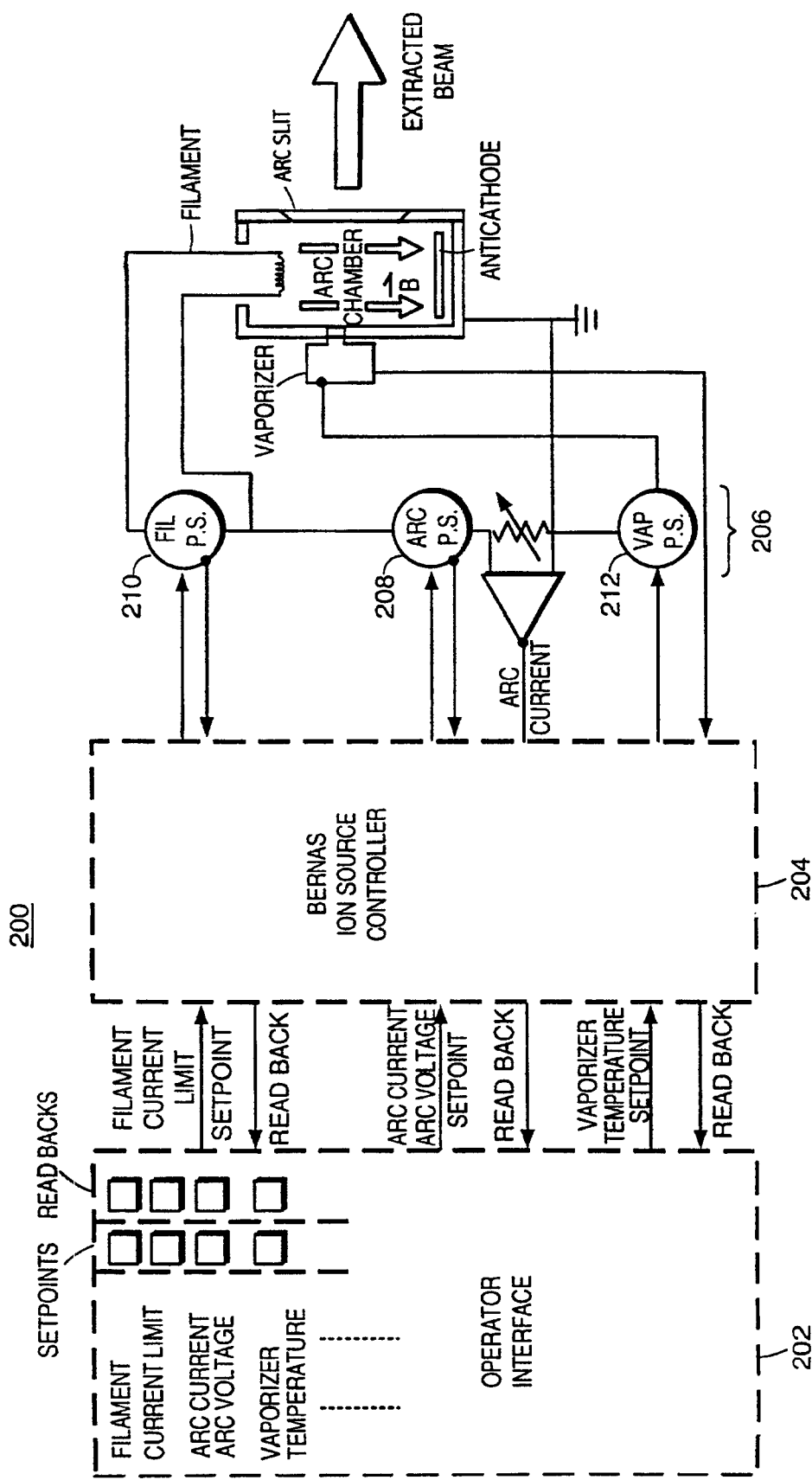

A universal controller for the ion source of the invention uniquely employs the user interface that is used with arc discharge ion sources such as the Bernas and Freeman types. FIG. 15 shows, in diagrammatic form, a typical control system 200 for operating a Bernas type ion source. The operator for such existing machines programs the implanter through an Operator Interface 202 (OI), which is a set of selectable graphical user interfaces (GUI's) that are selectively viewed on a computer screen. Certain parameters of the implanter are controlled directly from the OI, by either manually inputting data or by loading a predefined implant recipe file which contains the desired parameters that will run a specific implant recipe. The available set of GUI's includes controls and monitoring screens for the vacuum system, wafer handling, generation and loading of implant recipes, and ion beam control.

In many implanter systems, a predetermined set of ion source parameters is programmable through the Beam Control Screen of the OI represented in FIG. 15, including user-accessible setpoint values for Arc Current, Arc Voltage, Filament Current Limit, and Vaporizer Temperature. In addition to these setpoints, the actual values of the same parameters (for example, as indicated by the power supply readings) are read back and displayed to the operator on the OI by the control system.

Many other parameters that relate to the initial set up of the beam for a given implant are programmed and/or displayed through the Beam Screen GUI, but are not considered part of the operator's ion source control. These include beam energy, beam current, desired amount of the ion, extraction electrode voltages, vacuum level in the ion source housing, etc.

As indicated in FIG. 15, a dedicated Ion Source Controller 204 reads and processes the input (setpoint) values from the OI, provides the appropriate programming signals to the stack of power supplies 206, and also provides read backs from the power supplies to the OI. A typical power supply stack 206 shown in FIG. 15, includes power supplies for the Arc, Filament, and Vaporizer Heater, power supplies 208, 210 and 212, respectively. The programming and power generation for the Source Magnet Current may be provided in the screen, but is typically provided separate from the Ion Source Controller in many machines of the presently installed fleet.

Figure 15A:
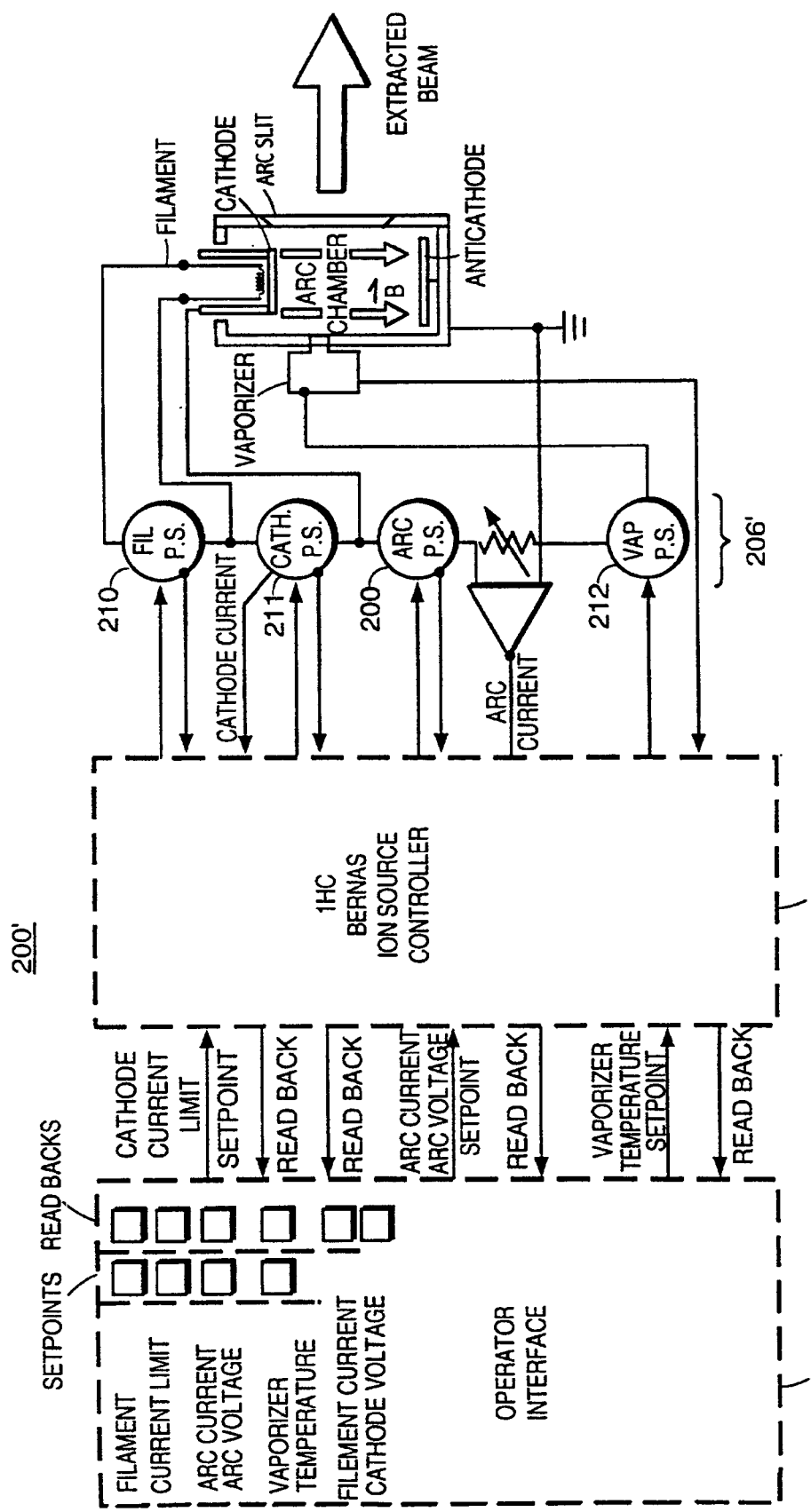
FIG. 15A is a similar view of a Bernas source with indirectly heated cathode.

FIG. 15a shows the same elements as FIG. 15, but for a Bernas-style ion source of the kind which uses an indirectly-heated cathode (IHC). FIG. 15a is identical to FIG. 15, except for the addition of a Cathode power supply 211, and its read back voltage and current. The additional power supply is necessary because the IHC (indirectly heated cathode element) is held at a positive high voltage with respect to the filament, which heats the IHC by electron bombardment to a temperature sufficient that the IHC emits an electron current equal to the Arc Current setpoint value provided through the OI. The arc control is accomplished through a closed-loop control circuit contained within the Ion Source Controller.

Figure 16:
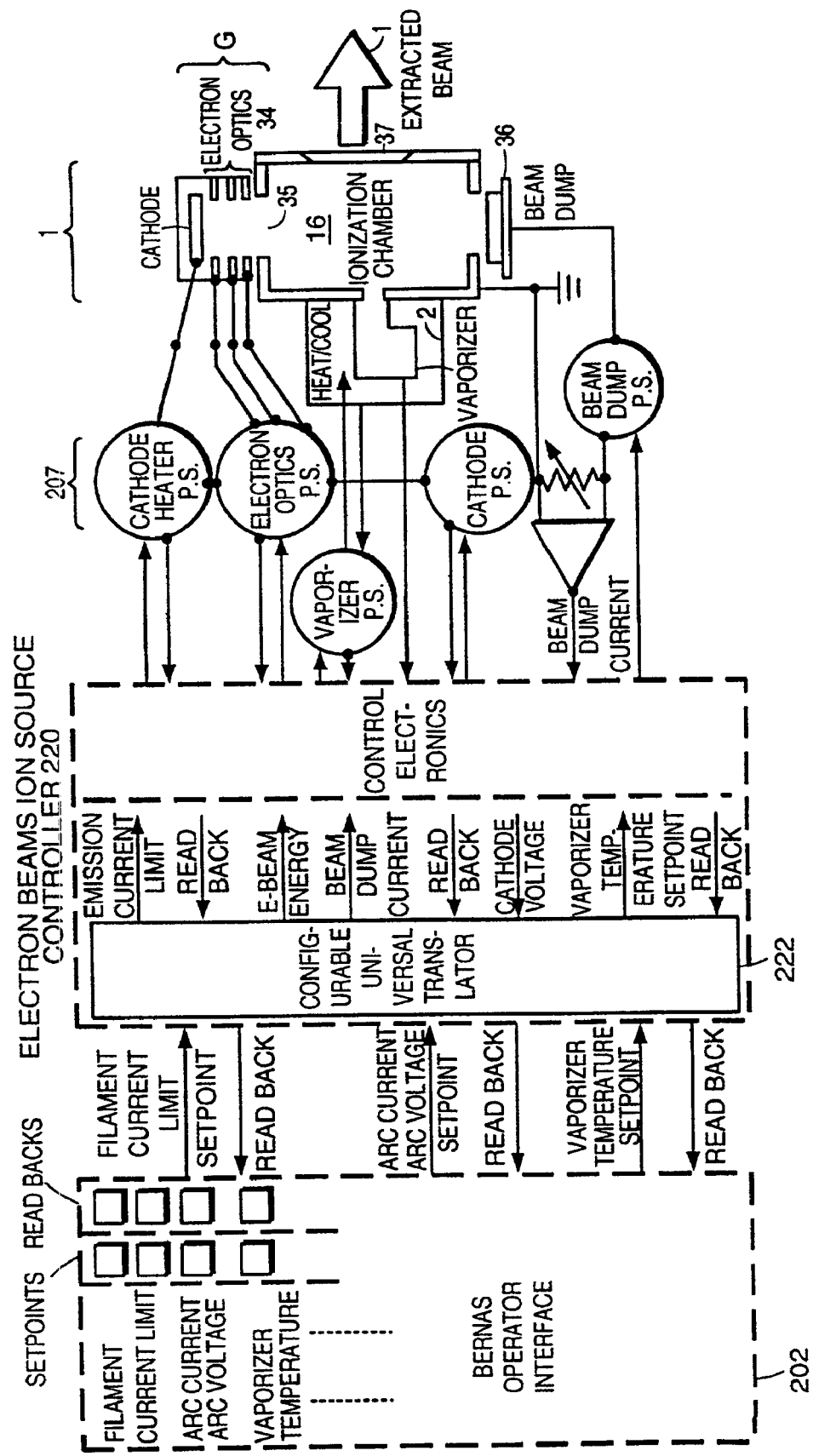
FIG. 16 is a view of a Bernas operator interface combined with a novel configurable universal controller that controls a broad E-Beam ion source according to the invention.
Figures 1, 16A:
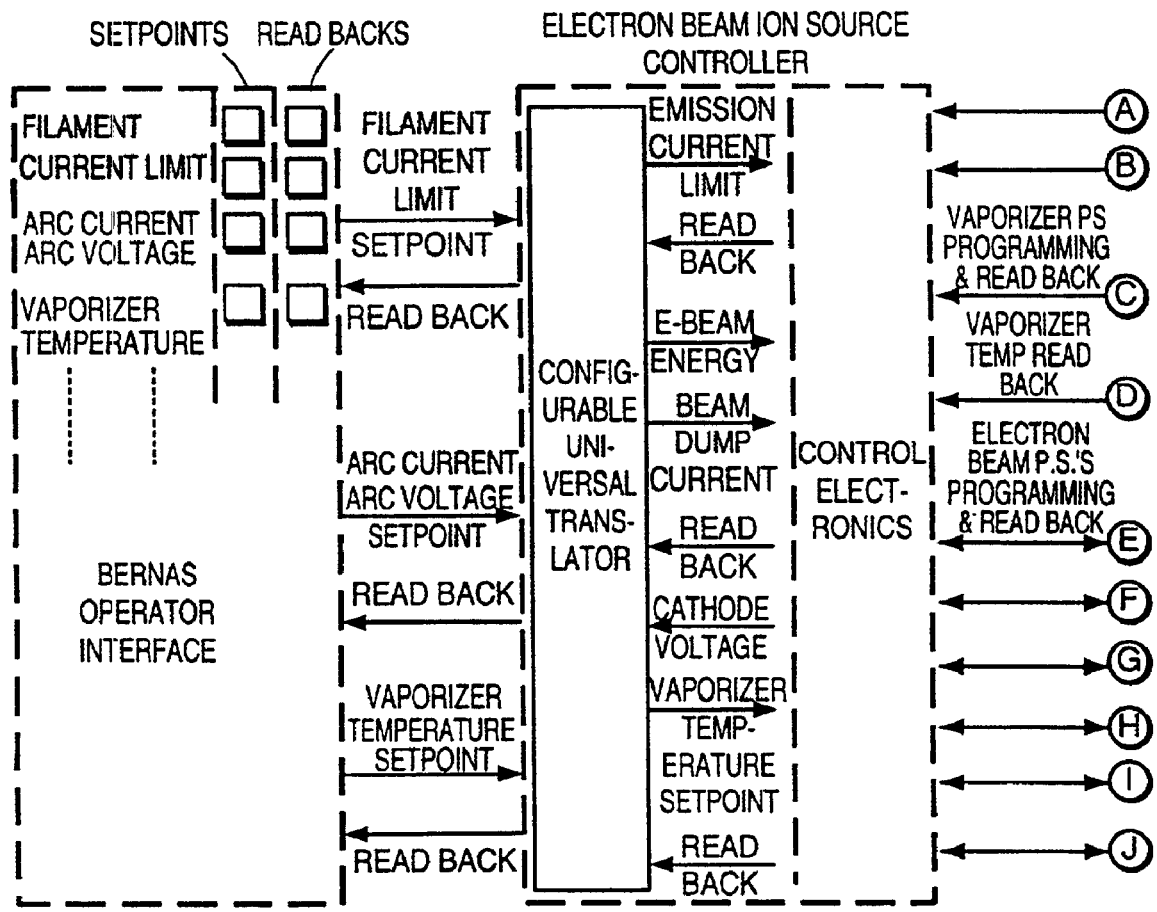
FIG. 16A illustrates the arrangement of FIGS. 16A-1 and 16A-2.
Figures 2, 16A:
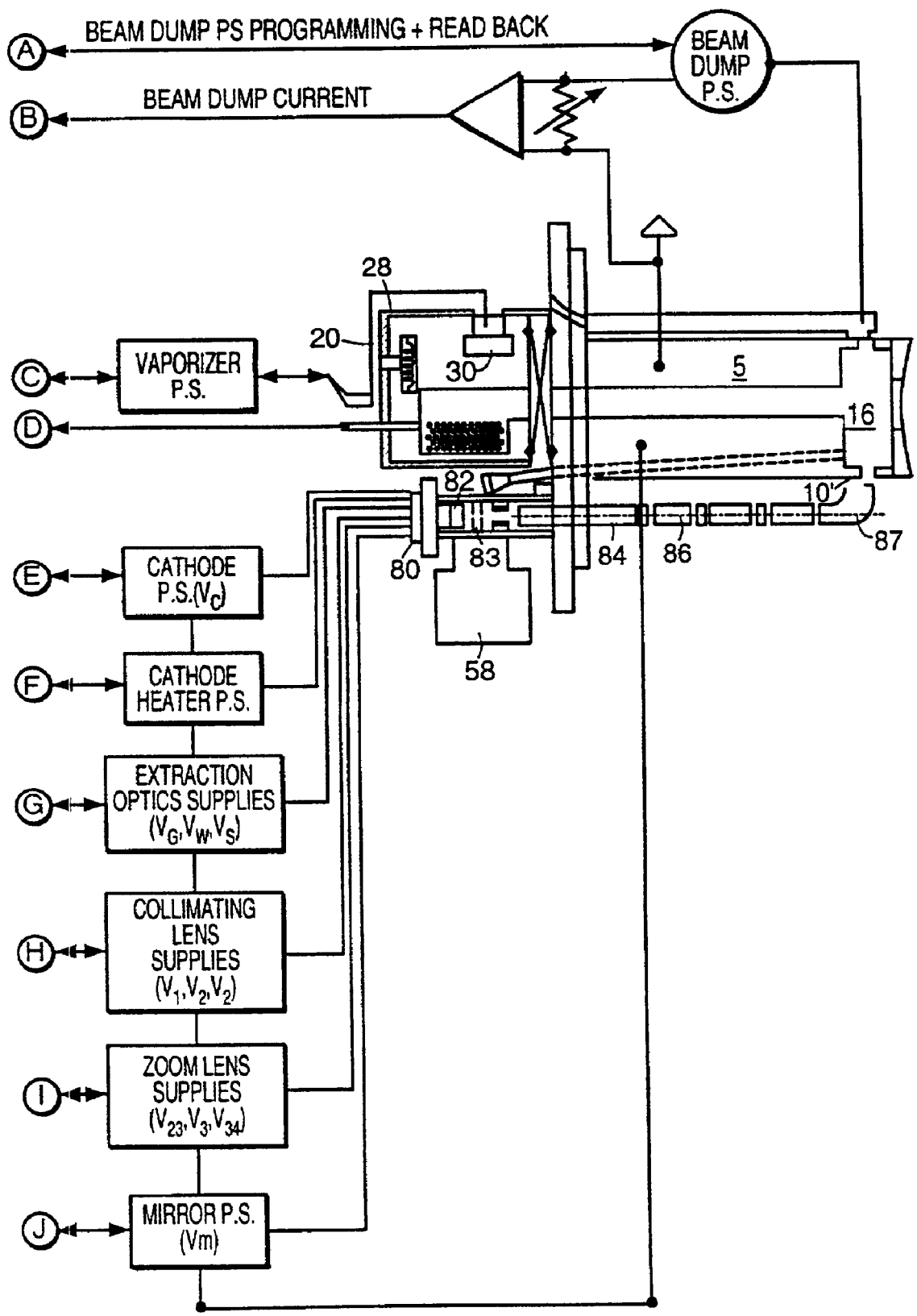

FIG. 16 shows diagrammatically the functional design of the Electron Beam Ion Source Controller 220 of the present invention. Control of electron current from the electron gun directed to the beam dump 36 is accomplished by a closed-loop servo circuit within the controller 220 which adjusts the electron emitter temperature and the electron gun grid potential to maintain the desired electron current setpoint. The Controller 220 is designed to be retrofittable into a typical existing implanter, both functionally and mechanically, and to do so with essentially no change to the controls software of the implanter. In order to achieve mechanical retrofittability, the Controller electronics 220 and Ion Source Power Supplies 207 occupy a similar physical volume in the gas box as did the existing Bernas Ion Source Controller 204 and Power Supplies 206. In order to preserve the integrity of the implanter's existing controls software, the Controller 220 is constructed to accept the existing inputs from the OI 202 and to provide the read backs expected by the OI. Thus, the operator can program the Ion Source 1 of the present invention from the OI in the manner to which the operator has long been accustomed, without change. This functionality is accomplished by a configurable Universal Translator circuit board 222 contained within the Controller 220, which accepts analog or digital inputs from the OI 202, and converts these inputs to the appropriate programming signals for the control of the Electron Beam of the ion source 1 of the present invention. This signal processing includes, as appropriate, digital-to-analog conversion, 16 bit digital-to-20 bit-digital conversion, analog-to-digital conversion, signal inversion, and multiplication of the signal by a scale factor, for example, depending upon the type and manufacturer of the installed ion implanter into which the broad, aligned electron beam ion source is to be retrofit. In like manner, the configurable Universal Translator 222 then processes the read back signals provided by the Electron Beam Power Supplies 207, and reports back to the OI 220 in the digital or analog format expected by the OI. The configurable Universal Translator 222 is also configurable to the specific number and kinds of outputs required by the installed implanter control system, for example to differentiate between a Bernas source and an IHC Bernas source, which requires extra read back channels for cathode voltage and current and a different scale factor for the cathode current limit setpoint vis-à-vis the Bernas and Freeman ion sources. The configurable Universal Translator 222 accomplishes this by substituting the control variables as indicated in FIG. 16, and as also shown in Table II below, for the case of a directly heated cathode electron gun in the E-Beam ion source of the invention. In the case of the system being retrofit to replace an IHC Bernas source, the two variables in the screen related to cathode voltage and filament current are assigned the optional values of anode voltage and cathode heating current. In the case of an indirectly heated electron source being used in a retrofit E-Beam ion source according to the invention, the values of its cathode voltage and heating filament current can be substituted for the optional values listed.

TABLE II

| | | Controls Variables | | | |
|---|---|---|---|---|---|
| OI Setpoint (Bernas) | OI Setpoint (IHC Bernas) | E-Beam Setpoint | E-Beam Read Back | OI Read Back (Bernas) | OI Read Back (IHC Bernas) |
| Filament Current Limit | Cathode Current Limit | Emission Current Limit | Emission Current | Filament Current | Cathode Current |
| Arc Current | Arc Current | Beam Dump Current | Beam Dump Current | Arc Current | Arc Current |
| Arc Voltage | Arc Voltage | E-Beam Energy | Cathode Voltage | Arc Voltage | Arc Voltage |
| Vaporizer Temperature | Vaporizer Temperature | Vaporizer Temperatuue | Vaporizer Temperature | Vaporizer Temperature | Vaporizer Temperature |
| — | — | — | Anode* Voltage | — | Cathode Voltage |
| — | — | — | Cathode* Heating Current | — | Filament Current |

*optional

Additional electron beam control settings, for example many of the lens voltages shown in FIG. 11, are not accessible to the user through the OI, but must be preset at the Controller. Some of these voltage settings are accessible manually through potentiometers on the front panel (which provides visual read backs through panel-mounted meters while others (for example, $V_g$ and $V_w$ of the long extraction gun and V3 and V34 of the zoom lens) are automatically set through firmware-based lookup tables resident in the Controller electronics.

In general, the arc control of Bernas, Freeman, and IHC Bernas sources are accomplished through similar means, namely by on-board closed-loop control circuits contained within the Ion Source Controller. In order to physically retrofit the ion source of an existing ion implanter with an ion source of the present invention, the original ion source is removed from the source housing of the implanter, the power cables are removed, and the Ion Source Controller 204 and the power supplies 206 or 206[1], i.e. the Filament Power Supply, Vaporizer Power Supply, Arc Power Supply, and Cathode Power Supply (if present) are removed from the gas box of the implanter. The Electron Beam Ion Source 1 of the present invention is inserted into the retrofit volume of the implanter, and the Electron Beam Ion Source Controller 220 and associated Power Supplies 207 are inserted into the vacated volume of the gas box. A new set of cables is connected. The desired mechanical configuration of the ion source is prepared prior to installation into the source housing of the implanter. For example, for decaborane production, a large width ion extraction aperture and a large dimension limiting aperture at the exit of the electron gun can be installed, to provide a large ionization volume. Additionally, if the implanter has installed a variable-width mass resolving aperture 44, the width of that aperture may be increased in order to pass a larger mass range of decaborane ions. Otherwise, the set-up proceeds in a conventional manner, modified according to the various features that are explained in the present text.

In addition to the electron beam controls that have just been explained, a temperature control mechanism is provided for the vaporizer 2. The vaporizer is held at a well-defined temperature by a closed-loop temperature control system within the Controller 220. As has been explained above, the closed-loop temperature control system incorporates PID (Proportional Integral Differential) control methodology, as is known in the art. The PID controller accepts a temperature setpoint and activates a resistive heater (which is mounted to a heater plate in contact with the water bath (see FIG. 3), or in heat transfer relationship with the mass of the vaporizer body 29 (FIG. 3A) to reach and maintain its setpoint temperature through a thermocouple read back circuit. The circuit compares the setpoint and read back values to determine the proper value of current to pass through the resistive heater. To ensure good temperature stability, a water-cooled heat exchanger coil 21 is immersed in the water bath (in the case of the water-cooled vaporizer of FIG. 3), or a thermoelectric (TE) cooler 30 (in the embodiment of a solid metal vaporizer of FIG. 3A), or a heat-exchanger coil surrounded by heat-conducting gas (in the embodiment of a vaporizer utilizing pressurized gas to accomplish thermal conduction between the various elements as in FIG. 3F) to continually remove heat from the system, which reduces the settling time of the temperature control system. Such a temperature control system is stable from 20 C to 200 C. In this embodiment, the flow of gas from the vaporizer to the ionization chamber is determined by the vaporizer temperature, such that at higher temperatures, higher flow rates are achieved. A similar temperature control system can be employed to control the temperature of conductive block 5a of FIGS. 3E or 9B.

As has also previously been explained, in another embodiment a different vaporizer PID temperature controller is employed. In order to establish a repeatable and stable flow, the vaporizer PID temperature controller receives the output of an ionization-type pressure gauge which is typically located in the source housing of commercial ion implanters to monitor the sub-atmospheric pressure in the source housing. Since the pressure gauge output is proportional to the gas flow into the ion source, it output can be employed as the controlling input to the PID temperature controller. The PID temperature controller can subsequently raise or diminish the vaporizer temperature, to increase or decrease gas flow into the source, until the desired gauge pressure is attained. Thus, two useful operating modes of a PID controller are defined: temperature-based, and pressure-based.

Figure 16B:
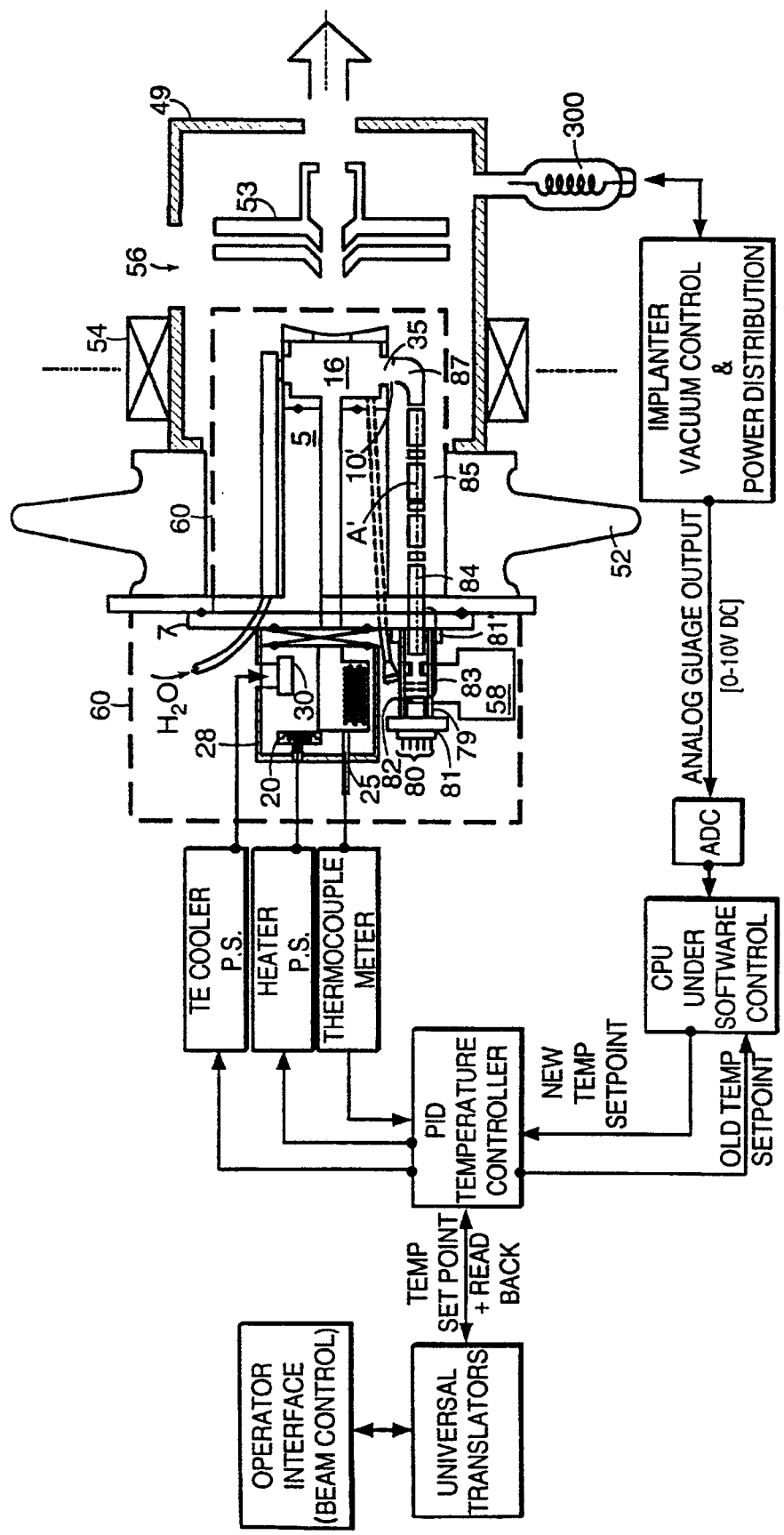
FIG. 16B is a diagram of a preferred embodiment of a temperature control system for the vaporizer of FIG. 3 and 3A.

Referring to FIG. 16B, in another embodiment, these two approaches are uniquely combined such that short-term stability of the flow rate from the vaporizer is accomplished by temperature programming alone, while long-term stability of the flow rate is accomplished by adjusting the vaporizer temperature through software to meet a pressure setpoint which is periodically sampled. The advantage of such a combined approach is that, as the solid feed material is consumed by vaporization, the temperature is slowly raised by software control to compensate for the smaller flow rates realized by the reduced surface area of the material presented to the vaporizer, in accordance with pressure sensed by the pressure gauge in the source housing. In FIG. 16B the ionization gauge 300 which monitors pressure within the ion source housing is the source of an analog pressure signal applied to an analog to digital converter, ADC. The digital output is directed to the CPU which, under software control, evaluates the drift of pressure over time, and introduces a gradual change in temperature setting to stabilize the pressure in its optimal range.

In the embodiments of. FIGS. 3 and 3A, temperature of the ionization chamber is controlled by the temperature of the vaporizer. Temperature control for the embodiments of FIG. 3E, 9B and 18B is achieved by a separate temperature sensing and control unit to control the temperature of the metal heat sink by use of a heat transfer medium or thermoelectric coolers or both.

Calculations of Expected Ion Current

The levels of ion current production that can be achieved with this new ion source technology are of great interest. Since the ion source uses electron-impact ionization by energetic primary electrons in a well-defined sizeable ionization region defined by the volume occupied by the broad electron beam in traversing the ionization chamber, its ion production efficiency can be calculated within the formalism of atomic physics:

$$I = I_0 [1 - \exp\{-n\, l\, s\}], \qquad (3)$$

where $I_0$ is the incident electron current, I is the electron current affected by a reaction having cross section s, n is the number density of neutral gas molecules within the ionization volume, and l is the path length. This equation can be expressed as follows:

$$f = 1 - \exp\{-L\, s\, pl\}, \qquad (4)$$

where f is the fraction of the electron beam effecting ionization of the gas, L is the number density per Torr of the gas molecules at OC ($=3.538 \times 10^{16}$ Torr$^{-1}$cm$^{-3}$), s is the ionization cross section of the specific gas species in cm$^2$, and pl is the pressure-path length product in Torr-cm.

The peak non-dissociative ionization cross section of decaborane has not been published, so far as the inventor is aware. However, it should be similar to that of hexane ($C_6H_{14}$), for example, which is known to be about $1.3 \times 10^{-15}$ cm$^2$. For an ion source extraction aperture 5 cm long and an ionization chamber pressure of $2\times10^{-3}$ Torr, equation (2) yields f=0.37. This means that under the assumptions of these calculations described below, 37% of the electrons in the electron current produce decaborane ions by single electron collisions with decaborane molecules. The ion current (ions/sec) produced within the ionization volume can be calculated as:

$$I_{ion} = fI_{el}, \qquad (5)$$

where $I_{ion}$ is the ion current, and $I_{el}$ is the electron current traversing the ionization volume. In order to maximize the fraction of ion current extracted from the ion source to form the ion beam, it is important that the profile of the electron beam approximately matches in width the profile of the ion extraction aperture, and that the ions are produced in a region close to the aperture. In addition, the electron current density within the electron beam should be kept low enough so that the probability of multiple ionizations, not taken into account by equations (3) and (4), is not significant.

The electron beam current required to generate a beam of decaborane ions can be calculated as:

$$I_{el} = I_{ion}/f, \qquad (6)$$

Given the following assumptions: a) the decaborane ions are produced through single collisions with primary electrons, b) both the gas density and the ion density are low enough so that ion—ion and ion-neutral charge-exchange interactions do not occur to a significant degree, e.g., gas density $<10^{14}$ cm$^{-3}$ and ion density $<10^{11}$ cm$^{-3}$, respectively, and c) all the ions produced are collected into the beam. For a 1 mA beam of decaborane ions, equation (6) yields $I_{el}$=2.7 mA. Since electron beam guns can be constructed to produce electron current densities on the order of 20 mA/cm$^2$, a 2.7 mA electron beam current appears readily achievable with the electron beam gun designs described in this application.

The density of primary electrons $n_e$ within the ionization volume is given by:

$$n_e = J_e/e\, v_e, \qquad (7)$$

where e is the electronic charge ($=1.6\times10^{-19}$ C), and $v_e$ is the primary electron velocity. Thus, for a 100 eV, 20 mA electron beam of 1 cm$^2$ cross-sectional area, corresponding to a relatively wide ion extraction aperture as illustrated in FIG. 4F, equation (7) yields $n_e \approx 2\times10^{10}$ cm$^{-3}$. For a narrow extraction aperture, as illustrated in FIG. 5, a 100 eV, 20 mA of 0.4 cm$^2$ cross-sectional area would provide an electron density $n_e \approx 5\times10^{10}$ cm$^{-3}$. Since the ion density, $n_i$, within the ionization volume will likely be of the same order of magnitude as $n_e$, it is reasonable to expect $n_i<10^{11}$ cm$^{-3}$. It is worth noting that since $n_e$ and $n_i$ are expected to be of similar magnitude, some degree of charge neutrality is accomplished within the ionization volume due to the ionizing electron beam and ions being of opposite charge. This measure of charge neutrality helps compensate the coulomb forces within the ionization volume, enabling higher values of $n_e$ and $n_i$, and reducing charge-exchange interactions between the ions.

An important further consideration in determining expected extraction current levels from the broad, collimated electron beam mode is the Child-Langmuir limit, that is, the maximum space charge-limited ion current density which can be utilized by the extraction optics of the ion implanter. Although this limit depends somewhat on the design of the implanter optics, it can usefully be approximated as follows:

$$J_{max} = 1.72\, (Q/A)^{1/2}\, U^{3/2}\, d^{-2}, \qquad (8)$$

where $J_{max}$ is in mA/cm$^2$, Q is the ion charge state, A is the ion mass in amu, U is the extraction voltage in kV, and d is the gap width in cm. For $B_{10}H_x^+$ ions at 117 amu extracted at 5 kV from an extraction gap of 6 mm, equation (6) yields $J_{max}$=5 mA/cm$^2$. If we further assume that the area of the ion extraction aperture is 1 cm$^2$, we deduce a Child-Langmuir limit of 5 mA of $B_{10}H_x^+$ ions at 5 keV, which comfortably exceeds the extraction requirements detailed in the above discussion.

Ion Extraction Aperture Considerations for the Broad, Aliened Beam Electron Gun Ion Source It is realized, that for the broad electron beam ion source of the present invention, it is possible to employ a larger width ion extraction aperture than typically employed with high current Bernas arc discharge sources. Ion implanter beam lines are designed to image the extraction aperture onto the mass resolving aperture, which is sized to both achieve good transmission efficiency downstream of the mass resolving aperture, and also to maintain a specified mass resolution R ($\equiv M/\Delta M$, see discussion above). The optics of many high-current beam lines employ unity magnification, so that, in the absence of aberrations, the extent of the ion extraction aperture as imaged onto the resolving aperture is approximately one-to-one, i.e., a mass resolving aperture of the same width as the ion extraction aperture will pass nearly all the beam current of a given mass-to-charge ratio ion transported to it. At low energies, however, space charge forces and stray electromagnetic fields of a Bernas ion source cause both an expansion of the beam as imaged onto the mass resolving aperture, and also a degradation of the mass resolution achieved, by causing significant overlap of adjacent beams of different mass-to-charge ratio ions dispersed by the analyzer magnet.

In contrast, in the ion source of the present invention, the absence of a magnetic field in the extraction region, and the lower total ion current level desired, e.g. for decaborane relative say to boron, uniquely cooperate to produce a much improved beam emittance with lower aberrations. For a given mass resolving aperture dimension, this results in higher transmission of the decaborane beam through the mass resolving aperture than one might expect, as well as preserving a higher R. Therefore, the incorporation of a wider ion extraction aperture may not noticeably degrade the performance of the beam optics, or the mass resolution of the implanter. Indeed, with a wider aperture operation of the novel ion source can be enhanced, 1) because of the greater openness of the wider aperture, the extraction field of the extraction electrode will penetrate farther into the ionization volume of the ionization chamber, improving ion extraction efficiency, and 2) it will enable use of a relatively large volume ionization region. These cooperate to improve ion production and reduce the required density of ions within the ionization volume to make the ion source of the invention production worthy in many instances.

Care can be taken, however, not to negatively impact the performance of the extraction optics of the implanter. For example, the validity of equation (8) can suffer if the extraction aperture width w is too large relative to the extraction gap d. By adding the preferred constraint that w is generally equal to or less than d, then for the example given above in which d=6 mm, one can use a 6 mm aperture as a means to increase total extracted ion current.

For retrofit installations, advantage can also be taken of the fact that many installed ion implanters feature a variable-width mass resolving aperture, which can be employed to open wider the mass resolving aperture to further increase the current of decaborane ions transported to the wafer. Since it has been demonstrated that in many cases it is not necessary to discriminate between the various hydrides of the $B_{10}H_x^+$ ion to accomplish a well-defined shallow p-n junction (since the variation in junction depth created by the range of hydride masses is small compared to the spread in junction location created by boron diffusion during the post-implant anneal), a range of masses may be passed by the resolving aperture to increase ion yield. For example, passing $B_{10}H_5^+$ through $B_{10}H_{12}^+$ (approximately 113 amu through 120 amu) in many instances will not have a significant process impact relative to passing a single hydride such as $B_{10}H_8^+$, and yet enables higher dose rates. Hence, a mass resolution R of 16 can be employed to accomplish the above example without introducing deleterious effects. Decreasing R through an adjustable resolving aperture can be arranged not to introduce unwanted cross-contamination of the other species (e.g., As and P) which may be present in the ion source, since the mass range while running decaborane is much higher than these species. In the event of operating an ion source whose ionization chamber has been exposed to In (113 and 115 amu), the analyzer magnet can be adjusted to pass higher mass $B_{10}H_x^+$ or even lower mass $B_9H_x^+$ molecular ions, in conjunction with a properly sized resolving aperture, to ensure that In is not passed to the wafer.

Furthermore, because of the relatively high concentration of the desired ion species of interest in the broad electron beam ion source, and the relatively low concentration of other species that contribute to the total extracted current (reducing beam blow-up), then, though the extracted current may be low in comparison to a Bernas source, a relatively higher percentage of the extracted current can reach the wafer and be implanted as desired.

Benefits of Using Hydride Feed Gases, etc.

It is recognized that the beam currents obtainable with the broad electron beam ion source described can be maximized by using feed gas species which have large ionization cross sections. Decaborane falls into this category, as do many other hydride gases. While arc plasma-based ion sources, such as the enhanced Bernas source, efficiently dissociate tightly-bound molecular species such as $BF_3$, they tend to decompose hydrides such as decaborane, diborane, germane, and silane as well as trimethyl indium, for example, and generally are not production-worthy with respect to these materials. It is recognized, according to the invention, however that these materials and other hydrides such as phosphene and arsine are materials well-suited to the ion source described here (and do not present the fluorine contamination problems encountered with conventional fluorides). The use of these materials to produce the ion beams for the CMOS applications discussed below, using the ion source principles described, is therefore another important aspect of the present invention.

For example, phosphene can be considered. Phosphene has a peak ionization cross section of approximately $5 \times 10^{-16}$ cm$^2$. From the calculations above, equation (6) indicates that a broad, collimated electron beam current of 6.2 mA should yield an ion current of 1 mA of $AsH_x^+$ ions. The other hydrides and other materials mentioned have ionization cross sections similar to that of phosphene, hence under the above assumptions, the ion source should produce 1 mA for all the species listed above with an electron beam current of less than 7 mA. On the further assumption that the transmission of the implanter is only 50%, the maximum electron beam current required would be 14 mA, which is clearly within the scope of electron beam current available from current technology applied to the specific embodiments presented above.

It follows from the preceding discussion that ion currents as high as 2.6 mA can be transported through the implanter using conventional ion implanter technology. According to the invention, for instance, the following implants can be realized using the indicated feed materials in an ion source of the present invention:

| | |
|---|---|
| Low energy boron: | vaporized decaborane ($B_{10}H_{14}$) |
| Medium energy boron: | gaseous diborane ($B_2H_6$) |
| Arsenic: | gaseous arsine ($AsH_3$) |
| Phosphorus: | gaseous phosphene ($PH_3$) |
| Indium: | vaporized trimethyl indium $In(CH_3)_3$ |
| Germanium: | gaseous germane ($GeH_4$) |
| Silicon: | gaseous silane ($SiH_4$). |

The following additional solid crystalline forms of In, most of which require lower vaporizer temperatures than can be stably and reliably produced in a conventional ion source vaporizer such as is in common use in ion implantation, can also be used in the vaporizer of the present invention to produce indium-bearing vapor: indium fluoride ($InF_3$), indium bromide (InBr), indium chloride (InCl and $InCl_3$), and indium hydroxide $\{In(OH)_3\}$. Also, antimony beams may be produced using the temperature-sensitive solids $Sb_2O_5$, $SbBr_3$ and $SbCl_3$ in the vaporizer of the present invention.

In addition to the use of these materials, the present ion source employing the broad, aligned electron beam in a non-reflex mode of operation can ionize fluorinated gases including $BF_3$, $AsF_5$, $PF_3$, $GeF_4$, and $SbF_5$, at low but sometimes useful atomic ion currents through single ionizing collisions. The ions obtainable may have greater ion purity (due to minimization of multiple collisions), with lessened space charge problems, than that achieved in the higher currents produced by Bernas sources through multiple ionizations. Furthermore, in embodiments of the present invention constructed for multimode operation, all of the foregoing can be achieved in the broad, aligned electron beam mode, without reflex geometry or the presence of a large magnetic confining field, while, by switching to a reflex geometry and employing a suitable magnetic field, a level of arc plasma can be developed to enhance the operation in respect of some of the feed materials that are more difficult to ionize or to obtain higher, albeit less pure, ion currents.

To switch between non-reflex and reflex mode, the user can operate controls which switch the beam dump structure from a positive voltage (for broad, aligned electron beam mode) to a negative voltage approaching that of the electron gun, to serve as a repeller (anticathode) while also activating the magnet coils 54. The coils, conventionally, are already present in the implanters originally designed for a Bernas ion source, into which the present ion source can be retrofit. Thus a multi-mode version of the present ion source can be converted to operate with an arc plasma discharge (in the case of a short electron gun in which the emitter is close to the ionization volume as in FIGS. 4A–4D), in a manner similar to a Bernas source of the reflex type, or with a plasma without an active arc discharge if the emitter is remote from the ionization volume. In the embodiment described previously (and also described in FIGS. 18, 18a and 18b) the existing magnet coils can be removed and modified magnet coils provided which are compatible with the geometry of a retrofitted, long, direct-injection electron gun. When these magnet coils are energized, the resultant axial magnetic field can confine the primary electron beam (both within the electron gun and in the ionization chamber) to a narrower cross-section, reducing the spreading of the electron beam profile due to space charge, and increasing the maximum amount of useful electron current which can be injected into the ionization volume. Since the electron emitter of this embodiment is remote from the ionization chamber, it will not initiate an arc discharge, but depending on the strength of the external magnetic field, will provide a low-density plasma within the ionization region. If the plasma density is low enough, multiple ionizations induced by secondary electron collisions with the ions should not be significant; however, the presence of a low-density plasma may enhance the space charge neutrality of the ionization region, enabling higher ion beam currents to be realized.

Benefits of Using Dimer-Containing Feed Materials

The low-temperature vaporizer of the present invention can advantageously use, in addition to the materials already mentioned, other temperature-sensitive solid source materials which cannot reliably be used in currently available commercial ion sources due to their low melting point, and consequently high vapor pressure at temperatures below 200 C. I have realized that solids which contain dimers of the dopant elements As, In, P, and Sb are useful in the ion source and methods presented here. In some cases, vapors of the temperature-sensitive dimer-containing compounds are utilized in the ionization chamber to produce monomer ions. In other cases, the cracking pattern enables production of dimer ions. Even in the case of dimer-containing oxides, in certain cases, the oxygen can be successfully removed while preserving the dimer structure. Use of dimer implantation from these materials can reap significant improvements to the dose rate of dopants implanted into the target substrates.

By extension of equation (8) which quantifies the space charge effects which limit ion extraction from the ion source, the following figure of merit which describes the easing of the limitations introduced by space charge in the case of molecular implantation, relative to monatomic implantation, can be expressed:

$$\Delta = n(V_1/V_2)^{3/2}(m_1/m_2)^{-1/2} \qquad (9)$$

where $\Delta$ is the relative improvement in dose rate achieved by implanting a molecular compound of mass $m_1$ and containing n atoms of the dopant of interest at an accelerating potential $V_1$, relative to a monatomic implant of an atom of mass $m_2$ at an accelerating potential $V_2$. In the case where $V_1$ is adjusted to give the same implantation depth into the substrate as the monomer implant, equation (9) reduces to $\Delta = n^2$. For dimer implantation (e.g., $As_2$ versus As), $\Delta = 4$. Thus, up to a fourfold increase in dose rate can be achieved through dimer implantation. Table Ia below lists materials suitable for dimer implantation as applied to the present invention.

TABLE Ia

| Compound | Melting Pt (deg C.) | Dopant | Phase |
|---|---|---|---|
| $As_2O_3$ | 315 | $As_2$ | Solid |
| $P_2O_5$ | 340 | $P_2$ | Solid |
| $B_2H_6$ | — | $B_2$ | Gas |
| $In_2(SO_4)_3 \cdot XH_2O$ | 250 | $In_2$ | Solid |
| $Sb_2O_5$ | 380 | $Sb_2$ | Solid |

Where monomer implantation is desired, the same dimer-containing feed material can advantageously be used, by adjusting the mode of operation of the ion source, or the parameters of its operation to sufficiently break down the molecules to produce useful concentrations of monomer ions. Since the materials listed in Table Ia contain a high percentage of the species of interest for doping, a useful beam current of monomer dopant ions can be obtained.

Use of the Ion Source in CMOS Ion Implant Applications

Figure 17:
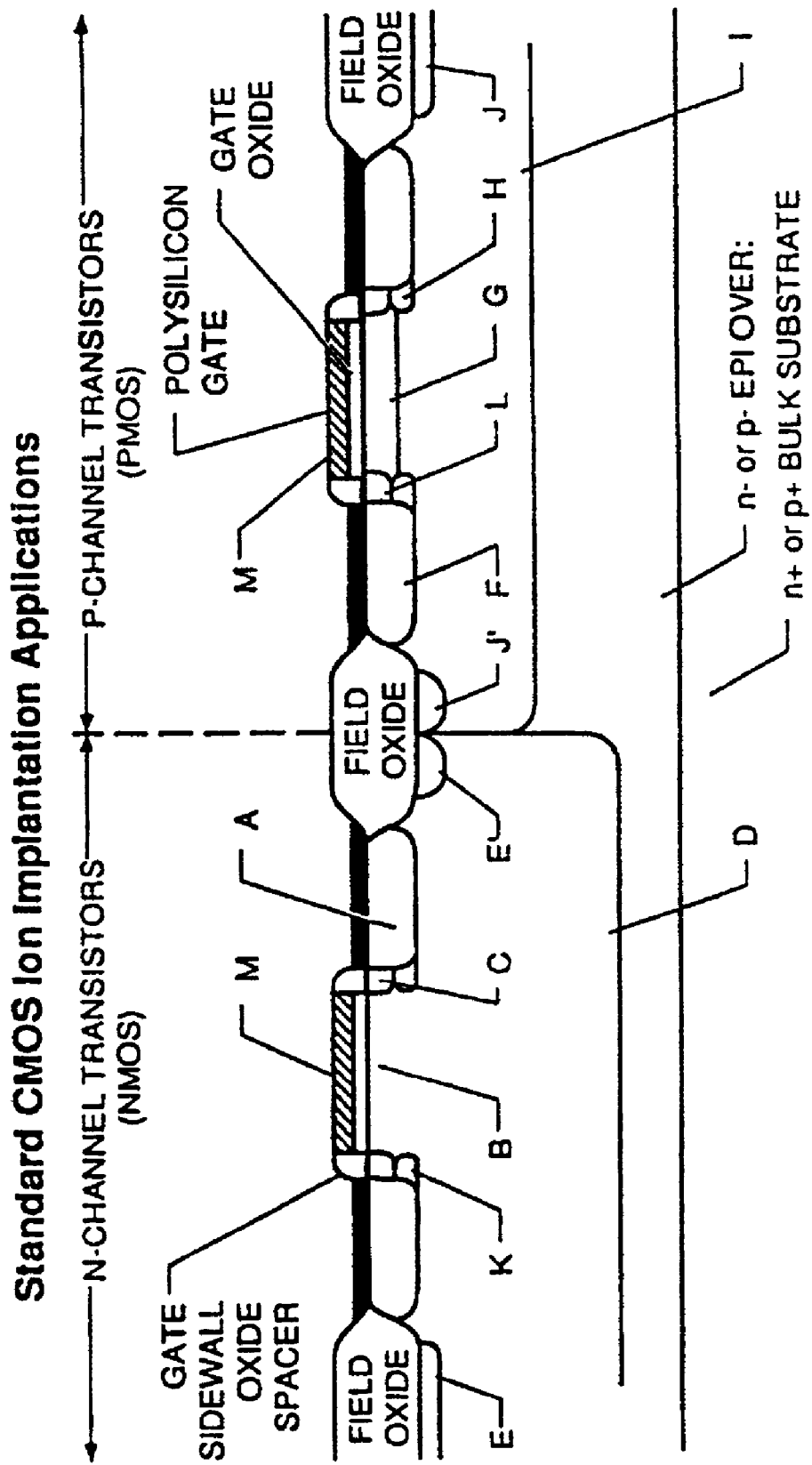
FIG. 17 is a diagrammatic illustration of a semiconductor device, illustrating standard CMOS ion implantation applications.

In present practice, ion implantation is utilized in many of the process steps to manufacture CMOS devices, both in leading edge and traditional CMOS device architectures. FIG. 17 illustrates a generic CMOS architecture and labels traditional implant applications used in fabricating features of the transistor structures (from R. Simonton and F. Sinclair, *Applications in CMOS Process Technology*, in Handbook of Ion Implantation Technology, J. F. Ziegler, Editor, North-Holland, New York, 1992). The implants corresponding to these labeled structures are listed in Table I below, showing the typical dopant species, ion energy, and dose requirements which the industry expects to be in production in 2001.

TABLE I

| Label | Implant | Specie | Energy (keV) | Dose (cm$^{-2}$) |
|---|---|---|---|---|
| A | NMOS source/drain | As | 30–50 | 1e15–5e15 |
| B | NMOS threshold adjust ($V_t$) | P | 20–80 | 2e12–1e13 |
| C | NMOS LDD or drain extension | P | 20–50 | 1e14–8e14 |
| D | p-well (tub) structure | B | 100–300 | 1e13–1e14 |
| E | p-type channel stop | B | 2.0–6 | 2e13–6e13 |
| F | PMOS source/drain | B | 2.0–8 | 1e15–6e15 |
| G | PMOS buried-channel $V_t$ | B | 10–30 | 2e12–1e13 |
| H | PMOS punchthrough suppression | P | 50–100 | 2e12–1e13 |
| I | n-well (tub) structure | P | 300–500 | 1e13–5e13 |
| J | n-type channel stop | As | 40–80 | 2e13–6e13 |
| K | NMOS punchthrough suppression | B | 20–50 | 5e12–2e13 |
| L | PMOS LDD or drain extension | B | 0.5–5 | 1e14–8e14 |
| M | Polysilicon gate doping | As, B | 2.0–20 | 2e15–8e15 |

In addition to the implants listed in Table I, recent process developments include use of C implants for gettering, use of Ge or Si for damage implants to reduce channeling, and use of medium-current In and Sb. It is clear from Table I that, apart from creating the source/drains and extensions, and doping the polysilicon gate, all other implants require only low or medium-dose implants, i.e. doses between $2 \times 10^{12}$ and $1 \times 10^{14}$ cm$^{-2}$. Since the ion current required to meet a specific wafer throughput scales with the desired implanted dose, it seems clear that these low and medium-dose implants can be performed with the broad, aligned electron beam ion source of the present invention at high wafer throughput with ion beam currents below 1 mA of P, As, and B. Further, of course, the decaborane ion currents achievable according to the present invention should enable producing the p-type source/drains and extensions, as well as p-type doping of the polysilicon gates.

It is therefore believed that the broad, aligned electron beam ion source described above enables high wafer throughputs in the vast majority of traditional ion implantation applications by providing a beam current of 1 mA of $B_{10}H_{14}$, As, P, and B or $B_2$. The addition of Ge, Si, Sb, and In beams in this current range, also achievable with the present invention, will enable more recent implant applications not listed in Table I.

What is claimed is:

1. An ion source for use with an ion implant device, the ion source comprising:
   an ionization chamber defined by a plurality of side walls defining an ionization volume, one of said sidewalls including an ion extraction aperture for enabling an ion beam to be extracted from said ionization chamber along a predetermined axis defining an ion bean axis;
   an electron beam source and an aligned beam receptor configured relative to said ionization chamber to cause an electron beam to be directed across the ionization volume of said ionization chamber in a direction generally perpendicular to said ion beam axis for ionizing gas in the ionization chamber by direct electron impact ionization by energetic electrons; and
   a gas source in fluid communication with said ionization chamber.

2. The ion source as recited in claim 1, wherein said electron beam source and said beam receptor are thermally isolated from said ionization chamber.

3. The ion source as recited in claim 2, wherein said ionization chamber is provided with electron entrance and electron exit ports, aligned to enable said electron beam to pass through the ionization volume of said ionization chamber in a direction generally perpendicular to said ion beam axis.

4. The ion source as recited in claim 3, wherein at least one of said electron beam source and said beam receptor are mounted to a mounting frame.

5. The ion source as recited in claim 4, wherein said mounting frame is water cooled.

6. The ion source as recited in claim 3, wherein said beam receptor is spaced away from said electron exit aperture.

7. The ion source as recited in claim 3, wherein said beam receptor is configured to be at least partially disposed within said electron exit aperture 36 but thermally and electrically isolated from said ionization chamber.

8. The ion source as recited in claim 7, wherein said thermal and electrical isolation is provided by a mechanical gap.

9. The ion source as recited in claim 7, wherein said thermal and electrical isolation is provided by electrical insulation (Z).

10. The ion source as recited in claim 1, wherein said gas source is a removable vaporizer.

11. The ion source as recited in claim 10, wherein said ion source is configure to enable ionization of decaborane $B_{10}H_{14}$ and includes a vaporizer.

12. The ion source as recited in claim 11, wherein said ionization chamber is in thermal conduction contact with said vaporizer.

13. The ion source as recited in claim 12, further including one or more thermally conductive gaskets, disposed between said vaporizer and said ionization chamber.

14. The ion source as recited in claim 10, wherein said vaporizer is connected to said ionization chamber by way of one or more isolation valves.

15. The ion source as recited in claim 14, wherein said beam receptor is maintained at a positive potential relative to said cathode.

16. The ion source as recited in claim 1, wherein said electron beam source includes an electron gun having a cathode.

17. The ion source recited in claim 1, further including an outer housing (Hc) formed with one or more cooling chambers relative to said ionization chamber, said outer housing (Hc) provided with one or more fluid inlets (Gi) for receiving a predetermined cooling fluid.

18. The ion source as recited in claim 17, wherein said cooling fluid is a conductive gas.

19. The ion source as recited in claim 18, wherein said conductive gas is selected from the group $N_2$, Ar and He.

20. The ion source as recited in claim 1, wherein said ionization chamber is water cooled.

21. The ion source as recited in claim 1, wherein one of said sidewalls of said ionization chamber defines an ion exit aperture plate formed with an ion beam exit aperture, the size of the ion beam exit aperture selected as a function of the size of the electron beam within the ionization chamber.

22. The ion source as recited in claim 1, wherein said electron source includes a cathode having a generally planar emitting surface which generates electrons in a direction generally perpendicular to the planar emitting surface in response to heat.

23. The ion source as recited in claim 22, wherein said cathode is heated directly by passing an electric current through it.

24. The ion source as recited in claim 22, wherein said cathode is heated indirectly by passing an electric current through a filament disposed adjacent to said cathode causing the filament to emit thermionic electrons which heat the cathode by energetic electron bombardment.

25. The ion source as recited in claim 1, wherein the ion source is formed with a retrofit volume and configured to enable said ion source to be installed in existing ion implanter devices (FIG. 8A) in which the ion source has been removed.

26. The ion source as recited in claim 1, wherein said electron beam source comprises:
   an extended housing;
   one or more mounting flanges for mounting said electron beam source to said ion source;
   a cathode for emitting electrons;
   one or more feedthroughs extending through said extended housing for connection to one or more electrical conductors and to said cathode;
   an optics system for directing the electron beam into said ionization chamber; and
   an extraction stage.

27. The ion source as recited in claim 26, wherein said optics system is configured to cause said electron beam to be directed along an axis generally perpendicular to a longitudinal axis of said extended housing.

28. The ion source as recited in claim 26, wherein said optics system includes a collimation lens.

29. The ion source as recited in claim 28, wherein said collimation lens is an asymmetric einzel lens.

30. The ion source as recited in claim 26, wherein said optics system includes a mirror.

31. The ion source as recited in claim 30, wherein said mirror is configured to displace the beam axis by about 90°.

32. The ion source as recited in claim 31, wherein said mirror is formed by two plates, oriented about 45° from the axis of the zoom lens.

33. The ion source as recited in claim 26, wherein said optics system includes a zoom lens.

34. The ion source as recited in claim 33, wherein said zoon lens is formed as a compound element lens.

35. The ion source as recited in claim 34, wherein said zoom lens is formed as a five element lens.

36. The ion source as recited in claim 34, wherein said zoom lens is formed from two three-element leases (AEL1, ALE2) in tandem.

37. The ion source as recited in claim 34, wherein said zoom lens is formed from two asymmetric einzel lenses in tandem.

38. The ion source as recited in claim 26, wherein said feedthroughs include a water inlet and a water outlet for cooling said housing.

39. The ion source as recited in claim 26, wherein said cathode is formed as a planar cathode emitter plate.

40. The ion source as recited in claim 39, wherein said cathode is adapted to be resistance heated.

41. The ion source as recited in claim 39, wherein said cathode is adapted to be indirectly heated.

42. The ion source as recited in claim 26, wherein said extraction stage is formed in a cylindrical shape.

43. The ion source as recited in claim 26, wherein said extraction stage includes a field shaping grid electrode, a Wehneldt electrode, a lens and an anode.

44. The ion source as recited in claim 26, wherein said ion source is configured to provide an electron beam with an acceleration-deceleration mode of operation.

45. The ion source as recited in claim 44, wherein said ion source includes a zoom lens.

46. The ion source as recited in claim 26, wherein said optical system includes a mirror and said ion source includes a deceleration stage, disposed between said mirror and said ionization chamber.

47. The ion source as recited in claim 1, wherein said ionization chamber is configured to be removably mounted as an end module from a mounting block which forms part of the ion source.

48. The ion source as recited in claim 47, further including a conductive seal (6"), disposed between said end module and said mounting block.

49. The ion source as recited in claim 47, wherein the material for said end module is selected from the group of aluminum and molybdenum.

50. The ion source as recited in claim 47, wherein the material for said end module is selected from the group of graphite and SiC.

51. The ion source as recited in claim 47, wherein the interface between block and end module is filled with gas to provide thermal conduction between the two.

52. The ion source as recited in claim 47, wherein said mounting block includes a plurality of water passages.

53. The ion source as recited in claim 1, wherein said electron beam source comprises:
   a cathode for emitting electrons defining an electron beam axis, said cathode configured such that said electron beam axis is aligned with said electron entrance and exit ports on said ionization chamber,
   an extraction stage for extracting electrons from said cathode; and
   a double aperture lens.

54. The ion source as recited in claim 53, wherein said electron beam source is configured to replace existing ion sources in existing ion implant devices.

55. The ion source as recited in claim 1, further including a control system for controlling said ion source.

56. The ion source as recited in claim 1, wherein said electron beam source is followed by a deceleration stage which reduces the energy of the electron beam prior to penetrating the ionization volume of said ionization chamber.

57. The ion source as recited in claim 1, wherein said electron beam source has an emitter external to the ionization volume said ionization chamber.

58. The ion source as recited in claim 1, wherein one wall of said ionization chamber is formed by an ion extraction aperture plate in thermal contact with said ionization chamber by way of conductive gasket.

59. The ion source as recited in claim 43, wherein said grid electrode is maintained at a grid potential $V_g$ at $-2V<V_g<+4V$ and the potential of said anode is in the range of 200V–1000V.

60. The ion source as recited in claim 1, wherein the conduit between the vaporizer and the ionization chamber has a high gas conductance of the order of between about $3\times10^{-2}$ to $3\times10^{-1}$ liters per second.

61. The ion source as recited in claim 1, wherein said gas source is a plurality of vaporizers (VAP1, VAP2).

62. The ion source as recited in claim 1, wherein the gas source crucible in which the solid source material resides is at a temperature achieved by temperature control of vaporizer housing.

63. The ion source (1) as recited in claim 62, wherein a space is defined between the crucible (18, 18') and the temperature-controlled vaporizer housing (17, 29') is filled with gas to provide thermal conduction therebetween.

64. The ion source as recited in claim 1, wherein said gas source includes a vaporizer and a conduit between said vaporizer and said ionization chamber.

65. The ion source as recited in claim 1, wherein the system is configured so that the electrons enter the ionization chamber as a generally collimated beam.

66. A dual mode ion source comprising:
   an ionization chamber defined by a plurality of side walls defining an ionization volume, one of said sidewalls including an ion extraction aperture for enabling an ion beam to be extracted from said ionization chamber along an ion beam axis, said ionization chamber having a predetermined voltage bias;
   an electron source and an aligned electron receptor configured relative to said ionization chamber to cause an electron beam to be directed across said ionization volume for ionizing gas in said ionization chamber by direct impact ionization;
   a gas source in fluid communication with said ionization chamber; wherein said ion source is operable in a reflex mode and a non-reflex mode and includes a magnetic source for selectively generating a magnetic field that is configured to confine said electrons within said ionization volume during a reflex mode; and
   a power supply for selectively biasing said electron receptor positively or negatively relative to said ionization chamber.

67. The ion source as recited in claim 66, wherein said electron source is remote from said ionization chamber.

68. The ion source as recited in claim 66, wherein said electron receptor is remote from said ionization chamber.

69. The ion source as recited in claim 66, wherein said selectable magnetic field is an axial magnetic field generally parallel to the direction of an electron beam defined between said electron source and said electron receptor.

70. The ion source is recited in claim 66, wherein said magnetic source includes magnet coil and said ion source includes an electron gun, said electron gun being coaxially disposed in said magnet coil.

* * * * *